(12) United States Patent
Ohkawara et al.

(10) Patent No.: US 8,184,739 B2
(45) Date of Patent: May 22, 2012

(54) POWER SERIES DIGITAL PREDISTORTER AND CONTROL METHOD THEREFOR

(75) Inventors: Junya Ohkawara, Yokohama (JP); Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 122 days.

(21) Appl. No.: 12/782,168

(22) Filed: May 18, 2010

(65) Prior Publication Data

US 2010/0295612 A1 Nov. 25, 2010

(30) Foreign Application Priority Data

May 21, 2009 (JP) .................................. 2009-123549
Apr. 7, 2010 (JP) .................................. 2010-088493

(51) Int. Cl.
*H04K 1/02* (2006.01)

(52) U.S. Cl. ........ 375/297; 375/260; 375/262; 375/267; 375/295; 375/296

(58) Field of Classification Search .................. 375/297, 375/260, 262, 267, 295, 296; 330/149
See application file for complete search history.

(56) References Cited

U.S. PATENT DOCUMENTS

| 6,973,138 B1* | 12/2005 | Wright | 375/297 |
| 2005/0163251 A1* | 7/2005 | McCallister | 375/296 |
| 2005/0189990 A1* | 9/2005 | Mizuta et al. | 330/52 |

FOREIGN PATENT DOCUMENTS
JP 2008-294518 12/2008

OTHER PUBLICATIONS

Shinji Mizuta, et al., "A New Adjustment Method for the Frequency-Dependent IMD Compensator of the Digital Predistortion Linearizer", IEEE Radio and Wireless Symposium, Jan. 2006, pp. 255-258.
Naoki Hongo, et al., "A Predistorter for a Power Amplifier affected by the Even-order Distortion", IEEE 58th Vehicular Technology Conference, vol. 1, Oct. 2003, pp. 266-270.

* cited by examiner

*Primary Examiner* — Dhaval Patel
(74) *Attorney, Agent, or Firm* — Oblon, Spivak, McClelland, Maier & Neustadt, L.L.P.

(57) ABSTRACT

A power series digital predistorter includes a combiner which combines an output from a linear transmission path with an output from an odd-order distortion generating path, an analog-to-digital converter which converts a feedback signal from an output of a power amplifier to a digital feedback signal, an odd-order distortion vector control part which controls vector adjustment performed by an odd-order distortion vector adjusting part in the odd-order distortion generating path, a cancellation signal generating part which generates a cancellation signal from an input transmission signal, a combiner which is inserted in a feedback signal path and which combines the cancellation signal with a signal from the feedback signal path, and a cancellation signal control part which controls the cancellation signal generating part so that the cancellation signal suppresses a main signal component in the feedback signal at the combiner.

15 Claims, 37 Drawing Sheets

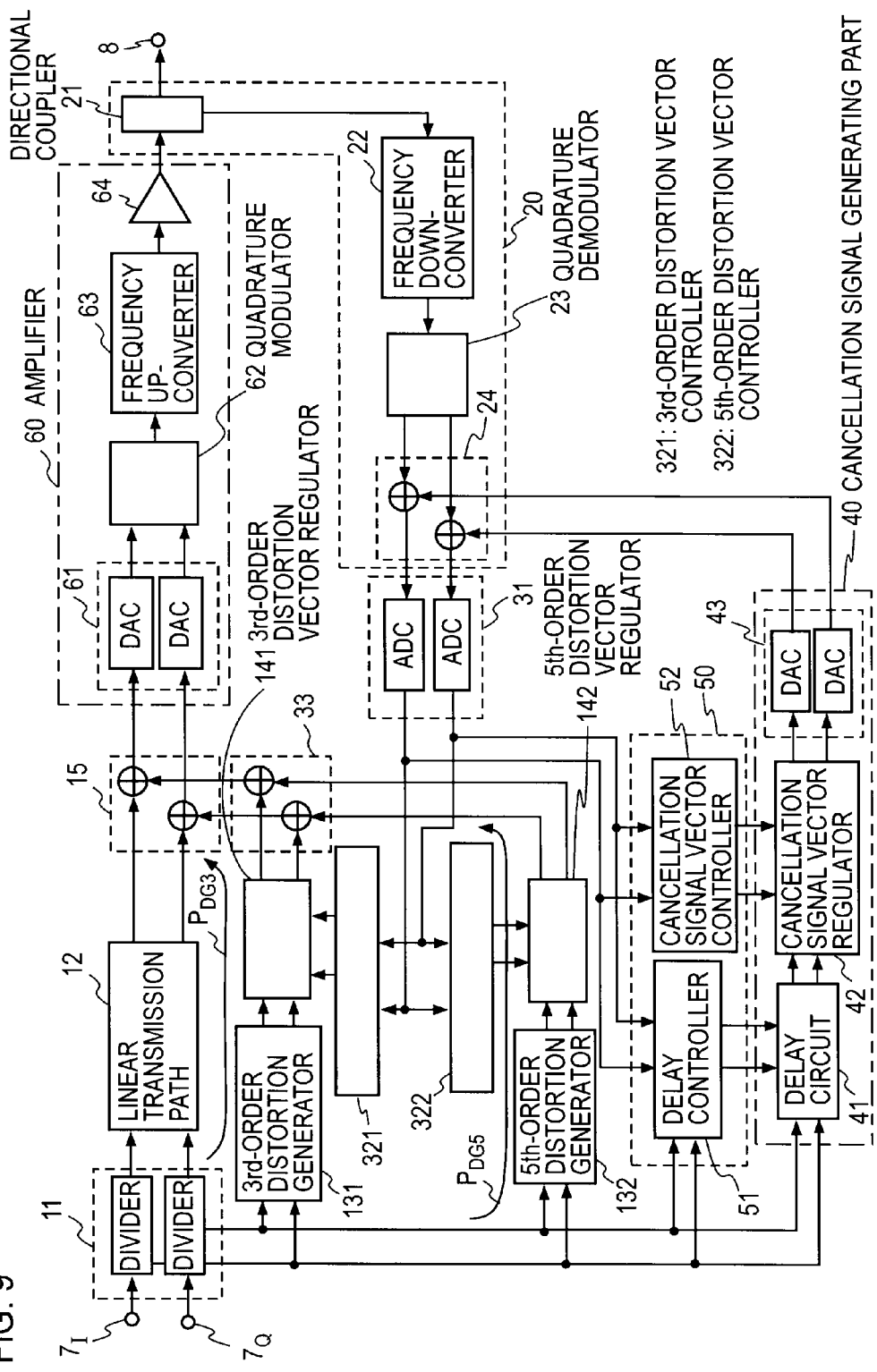

POWER SERIES DIGITAL PREDISTORTER AND CONTROL METHOD THEREFOR

TECHNICAL FIELD

The present invention relates to a power series digital predistorter and a method for controlling the power series digital predistorter.

BACKGROUND ART

Power series predistortion is a method for compensating for non-linear distortion of microwave transmission power amplifiers (S. Mizuta, Y. Suzuki, S. Narahashi, and Y. Yamao, "A New Adjustment Method for the Frequency-Dependent IMD Compensator of the Digital Predistortion Linearizer," IEEE Radio and Wireless Symposium 2006, pp. 255-258, January 2006).

A predistorter adds a distraction compensation signal to an input transmission signal to compensate for distortion components generated in a power amplifier due to non-linearity of the power amplifier. FIG. 1 illustrates an exemplary configuration of a conventional power series digital predistorter (hereinafter simply referred to as digital predistorter) 100P. In the example, a digital input transmission signal includes an I-phase signal and a Q-phase signal (also called I/Q signals). Accordingly, the same components are provided in pairs as required, one in the path for the I signal provided to an input terminal $7_I$ and the other in the path for the Q signal provided to an input terminal $7_Q$. Since the I/Q signal paths are well known in the art, individual description of the I/Q signal paths will be omitted and input I/Q signals are also simply referred to as an input transmission signal in the following description.

The digital predistorter 100P includes a divider 11, a linear transmission path 12 including a delay circuit, a third-order distortion generating path $P_{DG3}$ including a third-order distortion generator 131 and a third-order distortion vector regulator 141, a combiner 15 which combines an output from the linear transmission path 12 with an output from the third-order distortion generating path $P_{DG3}$, an amplifier 60, a directional coupler 21 which extracts a portion of an output from the amplifier 60 as a feedback signal, a frequency down-converter 22 which converts the frequency of the feedback signal, a quadrature demodulator 23 which quadrature-demodulates the downconverted feedback signal, an analog-to-digital converter 31 which converts the demodulated I/Q feedback signals to digital signals, and a third-order distortion vector controller 321 which detects a distortion comportment from the digital feedback signals converted from the analog feedback signals and adjusts vector coefficients (amplitude and phase) to be set in the third-order distortion vector regulator 141. The directional coupler 21, the frequency down-converter 22, and the quadrature demodulator 23 make up a feedback signal generating part 20P.

The amplifier 60 includes a digital-to-analog converter 61 which converts input digital I/Q signals to which a compensation signal is added to analog I/Q signals, a quadrature modulator 62 which quadrature-modulates the analog I/Q signals, a frequency up-converter 63 which converts the frequency of the modulated outputs to a carrier frequency, and a power amplifier 64 which amplifies the power of up-converted signal. The power-amplified up-converted signal is provided through an output terminal 8 to, for example, an antenna through a duplexer, not shown.

A digital transmission signal input into the digital predistorter 100P is divided and distributed by the divider 11 to the linear transmission path 12 and the third-order distortion generating path $P_{DG3}$. In the third-order distortion generating path $P_{DG3}$, the distributed input transmission signal is raised to the third power by the third-order distortion generator 131 to generate a third-order distortion component. The phase and amplitude of the third-order distortion component are adjusted by using vector coefficients (phase and amplitude) set in the third-order distortion vector adjustor 141 to obtain a compensation signal (the adjustment of the phase and amplitude of a distortion component to obtain a compensation signal is hereinafter referred to as vector adjustment). The time delay of the input transmission signal traveling from the divider 11 to the combiner 15 through the linear transmission path 12 is adjusted by a delay circuit, not shown, included in the linear transmission path 12 so that the time delay becomes equal to the time delay of the input transmission signal traveling from the divider 11 to the combiner 15 through the third-order distortion generating path $P_{DG3}$, that is, the timings of the arrivals of signals from both paths become the same. The input transmission signal from the linear transmission path 12 and the compensation signal from the third-order distortion generating path $P_{DG3}$ are added together by the combiner 15 and provided to'the amplifier 60 as an output of the predistorter 100P.

A portion of the output signal from the power amplifier 64 is extracted by the directional coupler 21 as a feedback signal, which is then converted to a frequency in an intermediate frequency band by a frequency down-converter 22 and demodulated by the quadrature demodulator 23 to I/Q signals. The demodulated I/Q signals are converted to digital feedback signals by the analog-to-digital converter (ADC) 31 and provided to the third-order distortion vector controller 321. The third-order distortion vector controller 321 observes third-order distortion components in adjacent bands to a main signal component band in the digital feedback signals and controls the vector coefficients to be set in the third-order distortion vector regulator 141 to minimize the power of the third-order distortion component, thereby compensating for the third-order distortion component which have been generated in the power amplifier 64.

In FIG. 1, feedback signals input into the ADC 31 contain a main signal component (where the main signal component corresponds to the input transmission signal input into the digital predistorter) as well as distortion components generated in the power amplifier 64. If analog-to-digital conversion at the ADC 31 is performed by setting the full scale of the ADC 31 to a value determined in view of an expected maximum value of the input transmission signal level, a sufficient accuracy of quantization of a distortion component to be detected cannot be achieved since the power of the distortion component is lower than that of the main signal component. Consequently, a change in the third-order distortion component of the output from the power amplifier 64 cannot adequately be observed in terms of magnitude at the third-order distortion vector controller 321 even though the vector coefficients to be set in the third-order distortion vector regulator 141 is controlled by the third-order distortion vector controller 321. The third-order distortion vector controller 321 has to control the third-order distortion vector regulator 141 until it is determined that the power of the third-order distortion component observed is minimized by the control of the third-order distortion vector regulator 141.

Therefore, there is a need to digitize distortion components at the ADC 31 with a high accuracy, that is, to improve the accuracy of quantization of distortion components, in order to optimize (improve the accuracy of) distortion compensation by the digital predistorter.

SUMMARY OF THE INVENTION

An object of the present invention is to provide a power series digital predistorter and a control method thereof that are capable of suppressing a main signal component of a signal input into the ADC 31 at a stage preceding the ADC 31 or at stages preceding and succeeding the ADC 31 to enable a controller to measure a distortion component with a high accuracy and therefore are capable of generating a highly accurate compensation signal.

To achieve the object, a power series digital predistorter according to the present invention includes: a linear transmission path transmitting an input transmission signal; an odd-order distortion generating path which includes, in series, an odd-order distortion generating part for generating an odd-order distortion component of the input transmission signal and an odd-order distortion vector adjusting part for adjusting a vector of the odd-order distortion component and outputting a vector-adjusted odd-order distortion component as a compensation signal; a first combiner for combining an output from the linear transmission path with an output from the odd-order distortion generating path to generate an output of the power series digital predistorter; a feedback signal path for generating a feedback signal from a portion of an output of the power amplifier; an analog-to-digital converter for converting the feedback signal from the feedback signal path to a digital feedback signal; an odd-order distortion vector control part for controlling vector adjustment by the odd-order distortion vector adjusting part to suppress an odd-order distortion component of the digital feedback signal; a cancellation signal generating part for processing the input transmission signal to generate an analog cancellation signal; a second combiner inserted in the feedback signal path for combining the analog cancellation signal with a signal from the feedback signal path; and a cancellation signal control part for controlling the cancellation signal generating part on the basis of the digital feedback signal to enable the cancellation signal to suppress a main signal component of the feedback signal at the second combiner.

With the configuration, since the main signal component in the feedback signal to be provided to the analog-to-digital converter is suppressed, the voltage of a feedback signal with the suppressed main signal component and hence with a voltage closer to that of a distortion component can be matched to the maximum input range of the analog-to-digital converter. Accordingly, the distortion component of the feedback signal can be detected with a higher accuracy and therefore a compensation signal with a higher accuracy can be generated.

The power series digital predistorter may further include an automatic gain control circuit inserted at the input side of the analog-to-digital converter for adjusting the gain of an output from the second combiner and providing the output to the analog-to-digital converter, and a gain controller for monitoring an output from the analog-to-digital converter and controlling the gain of the automatic gain control circuit to make the output voltage of the automatic gain control circuit closer to the maximum input range of the analog-to-digital converter.

With this configuration, a feedback signal with a suppressed main signal component can be automatically adjusted according to the maximum input range of the analog-to-digital converter and therefore a compensation signal with a higher accuracy can be generated.

Alternatively, the power series digital predistorter may further include a sub-cancellation signal generating part for processing an input transmission signal to generate a sub-cancellation signal, a third combiner inserted at the output side of the analog-to-digital converter for combining the sub-cancellation signal with an output from the analog-to-digital converter, and a sub-cancellation signal control part for controlling the sub-cancellation signal generating part to cause the sub-cancellation signal to suppress a residual main signal component in a digital feedback signal at the third combiner.

With this configuration, since a residual main signal component can be suppressed, a compensation signal with a higher accuracy can be generated.

Alternatively, the power series digital predistorter may further include a digital notch filter inserted at the output side of the analog-to-digital converter for suppressing a main signal component of the output from the analog-to-digital converter.

With this configuration, since a residual main signal component can be suppressed, a compensation signal with a higher accuracy can be generated.

Alternatively, the power series digital predistorter may further include an odd-order distortion frequency characteristic compensator inserted in the odd-order distortion generating path for adjusting a frequency characteristic of an odd-order distortion component by using compensation coefficients and an odd-order distortion frequency characteristic compensation coefficient controller for generating compensation coefficients based on the frequency characteristic of the odd-order distortion component of the feedback signal and providing the compensation coefficients to the odd-order distortion frequency characteristic compensator.

With this configuration, an odd-order distortion component generated by the amplifier can be compensated for with a higher accuracy.

A method for controlling a power series digital predistorter according to the present invention includes: a cancellation signal delay control process of setting a delay time of a delay circuit so that a main signal component of a digital feedback signal is reduced to a minimum value or a value less than or equal to a predetermined target value, a cancellation signal vector control process of setting a vector coefficient so that a main signal component of a digital feedback signal is reduced to a minimum value or a value equal to or less than the target value, and an odd-order distortion vector control process of setting a vector coefficient for an odd-order distortion vector adjusting part so that a distortion component of a digital feedback signal is reduced to a minimum value or a value less than or equal to the target value.

Since a distortion component of the feedback signal can be detected with a high accuracy according to the method, a compensation signal with a high accuracy can be generated.

The control method may further include a sub-cancellation signal delay control process of setting a second delay time so that a main signal component of an output from a third combiner provided at the output side of the analog-to-digital converter is reduced to the minimum value or a value equal to or less than a second predetermined target value, and a sub-cancellation signal vector control process of setting a vector coefficient for a sub-cancellation signal vector regulator so that a main signal component of an output from the third combiner is reduced to a minimum value or a value less than or equal to the second target value.

Since a residual main signal component can be suppressed according to the control method, a distortion can be detected with a higher accuracy and therefore a compensation signal with a higher accuracy can be generated.

EFFECTS OF THE INVENTION

The present invention suppresses a main signal component of a signal to be input into the ADC 31 in the feedback signal path in a digital predistorter at a stage preceding the ADC 31 or at stages preceding and succeeding the ADC 31 to enable a distortion vector controller to measure a distortion component with a high accuracy and therefore enables a highly accurate compensation signal to be generated.

BRIEF DESCRIPTION OF THE DRAWINGS

FIG. 9 is a block diagram illustrating a variation of the exemplary embodiment in FIG. 3 which includes a fifth-order distortion generator added;

DETAILED DESCRIPTION OF THE EMBODIMENTS

[Principle Configuration]

Figure 1:
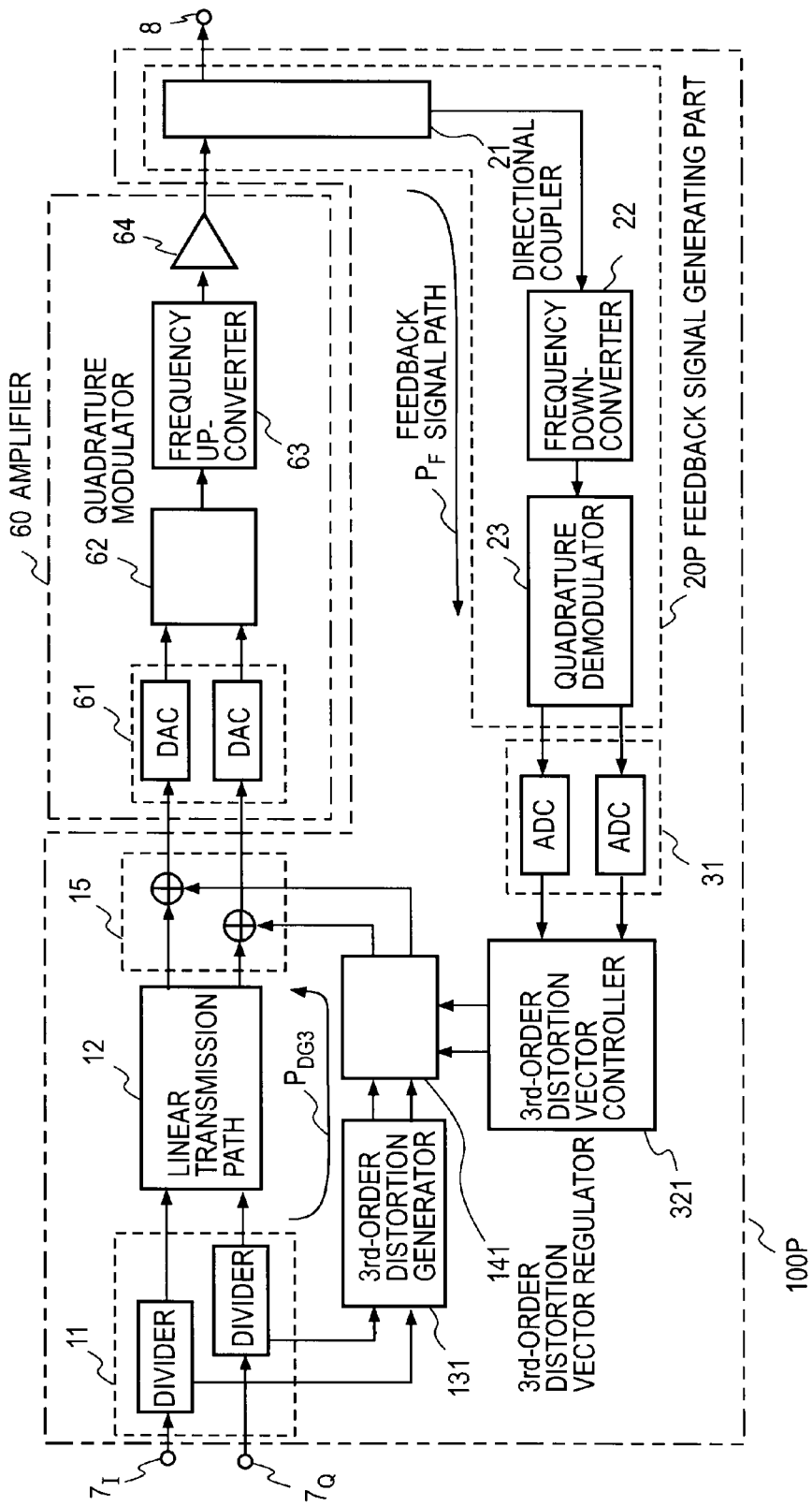
FIG. 1 is a block diagram illustrating an exemplary configuration of a conventional power series digital predistorter.
Figure 2:
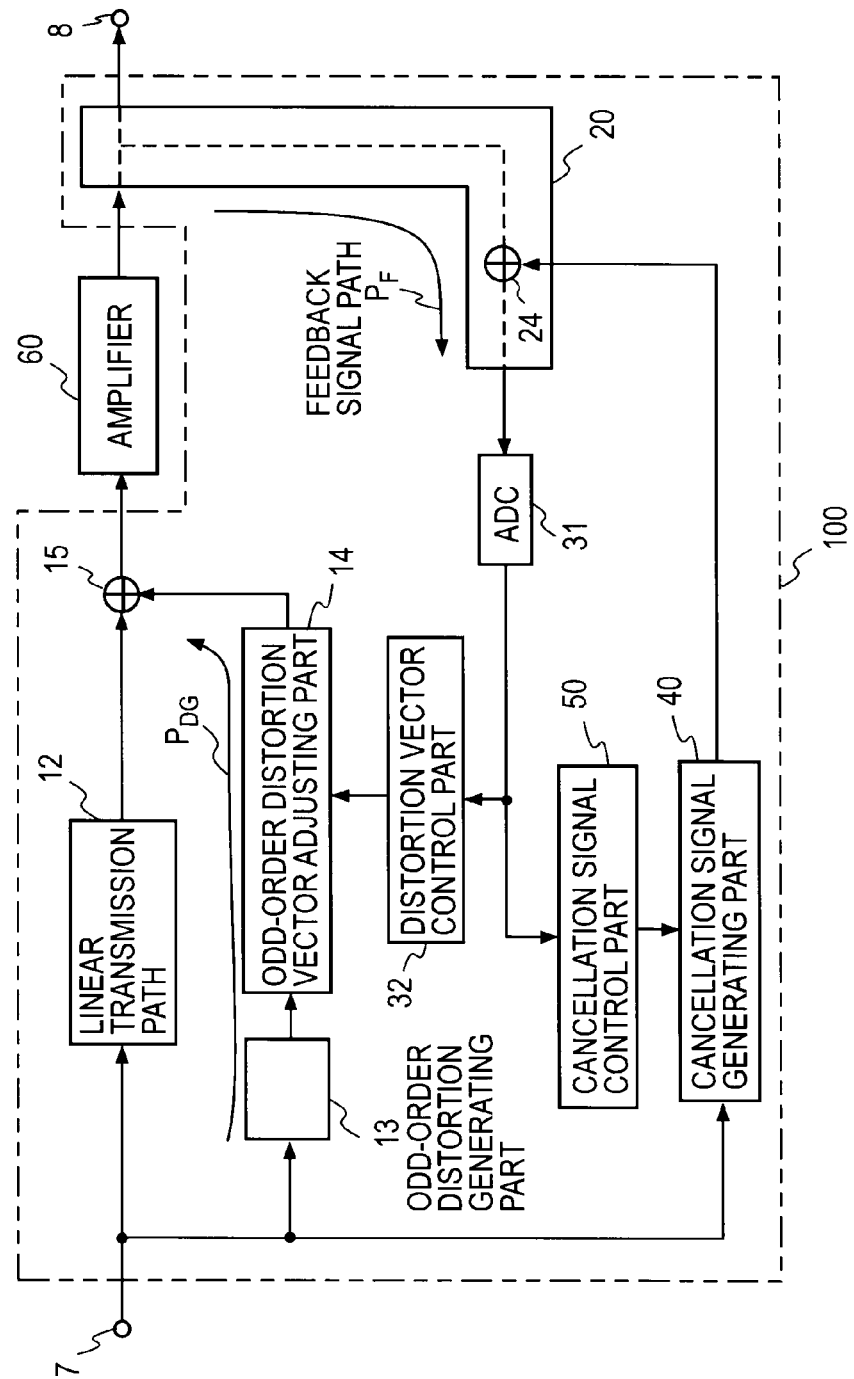
FIG. 2 is a block diagram illustrating a principle configuration of a digital predistorter according to the present invention.

FIG. 2 illustrates a principle configuration of a power series digital predistorter according to the present invention. In FIG. 2, components equivalent to those in FIG. 1 are labeled with the same reference numerals.

The power series digital predistorter (hereinafter simply referred to as predistorter) 100 according to the present invention includes a linear transmission path 12, an odd-order distortion generating part 13, an odd-order distortion vector adjusting part 14, a combiner 15, a feedback signal generating part 20, an analog-to-digital converter 31, a distortion vector control part 32, a cancellation signal generating part 40, and a cancellation signal control part 50. The odd-order distortion generating part 13 and the odd-order distortion vector adjusting part 14 make up an odd-order distortion generating path $P_{DG}$. The greatest difference of the predistorter 100 from the one according to the conventional art in FIG. 1 is that a combiner 24 is provided in the feedback signal generating part 20 in series with the a feedback signal path $P_F$ and a cancellation signal generated by the cancellation signal generating part 40 is combined with a feedback signal by the combiner 24 to suppress a main signal component in the feedback signal to be input into the ADC 31.

A digital input transmission signal (hereinafter simply referred to as input transmission signal) provided to an input terminal 7 is provided to the combiner 15 through the linear transmission path 12. The input transmission signal is also provided to the odd-order distortion generating part 13, where the input transmission signal is raised to an odd power (3rd or greater power) to generate an odd-order distortion component of the input transmission signal. The odd-order distortion component is subjected to vector adjustment at the odd-order distortion vector adjusting part 14 and then provided to the combiner 15 as a compensation signal. The combiner 15 combines an output from the linear transmission path 12 with an output from the odd-order distortion generating path $P_{DG}$ and provides the resulting signal as an output of the predistorter to an amplifier 60 which includes a power amplifier similar to that in FIG. 1. The principles of operations of the linear transmission path 12, the odd-order distortion generating part 13, the odd-order distortion vector adjusting part 14, the combiner 15, and the odd-order distortion vector adjusting part 32 are the same as the principles of operations of the linear transmission path 12, the third-order distortion generator 131, the third-order distortion vector regulator 141, the combiner 15, and the third-order distortion vector controller 321 in FIG. 1.

The input transmission signal from the input terminal 7 is also provided to the cancellation signal generating part 40. The cancellation signal generating part 40 processes the input transmission signal to generate an analog cancellation signal. The cancellation signal is combined with the feedback signal by the combiner 24 in the feedback signal path $P_F$ at the input side of the ADC 31. The feedback signal combined with the cancellation signal is converted to a digital feedback signal by the ADC 31 and is then provided to the cancellation signal control part 50. The cancellation signal control part 50 controls the cancellation signal generating part 40 so that the power of a main signal component (the same component as that of the input transmission signal) of the digital feedback signal from the ADC 31 is reduced to the minimum value (or less than or equal to a preset target value). As a result, the main signal component of the feedback signal to be input into the ADC 31 is suppressed. Accordingly, the maximum input range of the ADC 31 can be determined beforehand by taking into consideration the amplitude of the feedback signal with a suppressed main signal component. Therefore, analog-to-digital conversion of the feedback signal containing a distortion component can be performed with an accordingly high accuracy. The digital feedback signal thus converted from the analog feedback signal with a high accuracy is provided to the distortion vector control part 32, where a distortion component in adjacent bands to the main signal component in the feedback signal can be detected and vector coefficients can be set for the odd-order distortion vector adjusting part 14 such that the power of the distortion component is reduced to a minimum value (or a value less than or equal to the target value). Consequently, the predistorter 100 according to the present invention can combine the input transmissions signal with a compensation signal that can cancel intermodulation distortion with a high accuracy.

In the principle configuration of the present invention illustrated in FIG. 2, the odd-order distortion generating part 13 may be implemented by a third-order distortion generator as in exemplary embodiments which will be described below, or by a fifth or higher order distortion generator or multiple different odd-order distortion generators. If the odd-order distortion generating part 13 is implemented by multiple odd-order distortion generators, odd-order distortion vector regulators are provided in the odd-order distortion vector adjusting part 14, one for each odd-order distortion generator, and odd-order distortion vector controllers are provided in the distortion vector control part 32, one for each odd-order distortion vector regulator.

[First Exemplary Embodiment]

Figure 3:
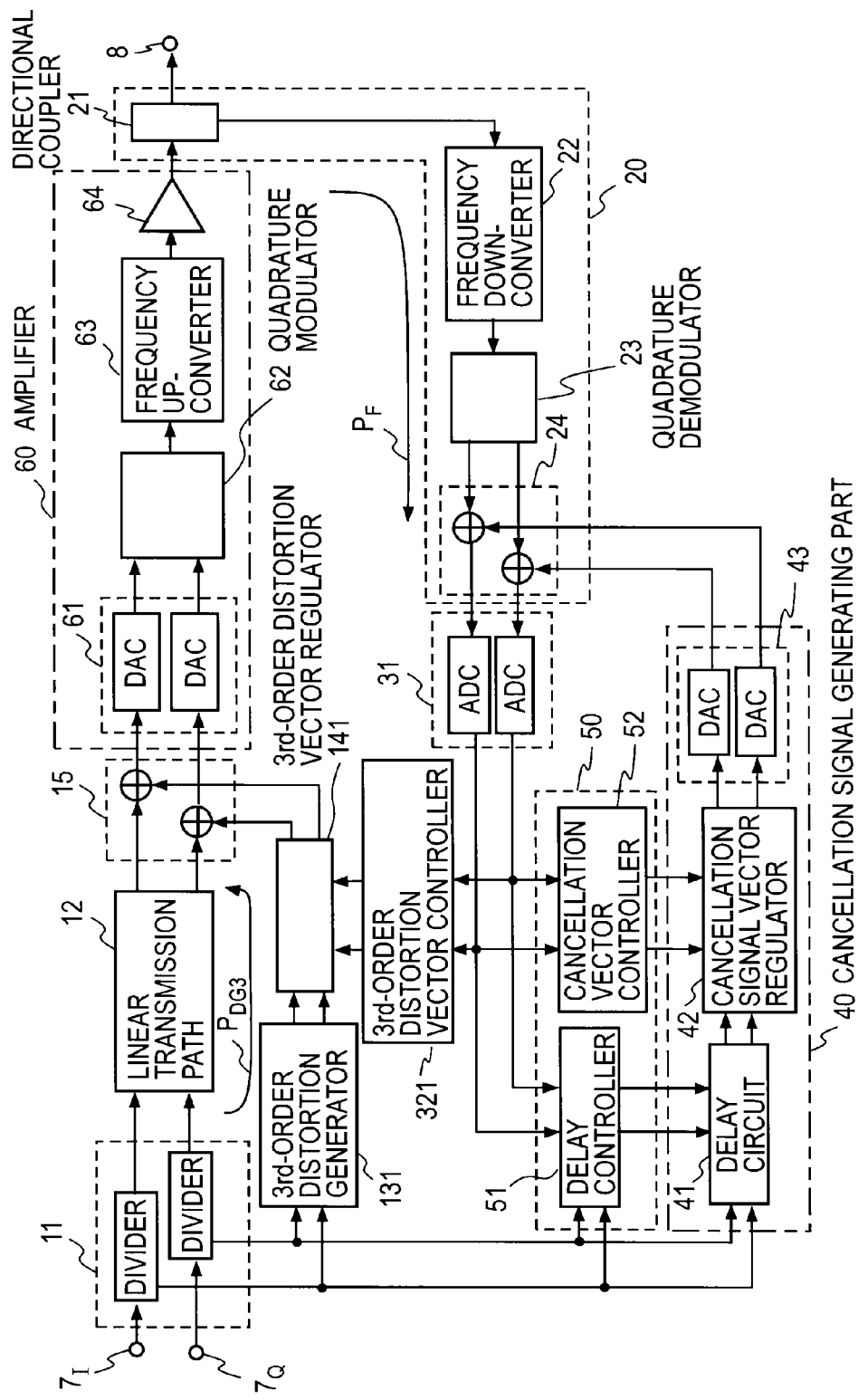
FIG. 3 is a block diagram illustrating a first exemplary embodiment of a digital predistorter according to the present invention.

FIG. 3 illustrates a first exemplary embodiment of a power series digital predistorter according to the present invention. The exemplary embodiment of the predistorter is implemented by applying the principle of the present invention illustrated in FIG. 2 to the predistorter according to the conventional art in FIG. 1 and the same components as those in FIG. 1 are labeled the same reference numerals. As in FIG. 1, input digital transmission signals here are I/Q signals. The odd-order distortion generating part 13, the odd-order distortion vector adjusting part 14, and the distortion vector control part 32 illustrated in FIG. 2 are implemented as a third-order distortion generator 131, a third-order distortion vector regulator 141, and a third-order distortion vector controller 321, respectively. In the exemplary embodiment in FIG. 3, the cancellation signal generating part 40 includes a delay circuit 41, a cancellation signal vector regulator 42, and a digital-to-analog converter (DAC) 43. The cancellation signal control part 50 includes a delay controller 51 and a cancellation signal vector controller 52. The feedback signal generating part 20 includes, a combiner 24 at the output side of a quadrature demodulator 23 in addition to a directional coupler 21, a frequency down-converter 22, and the quadrature demodulator 23 that are equivalent to those in the feedback signal generating part 20 in FIG. 1.

Each of input transmission signals provided to input terminals $7_I$ and $7_Q$ is divided and distributed by a divider 11 to the linear transmission path 12, the third-order distortion generator 131 and the delay circuit 41. While only one divider is depicted, any number of dividers may be provided according to the number of paths into which the signal is distributed. The delay circuit 41 delays an input transmission signal by an amount of time τ set by the delay controller 51. The amplitude and phase of the delayed input transmission signal is adjusted by the cancellation signal vector regulator 42 to an amplitude and a phase set by the cancellation signal vector controller 52 to produce a digital cancellation signal. The digital cancellation signal is converted by the DAC 43 to an analog cancellation signal and is combined with a feedback signal by the combiner 24. The feedback signal combined with the cancellation signal is converted by the ADC 31 to a digital feedback signal.

The delay controller 51 observes a main signal component in the output from the ADC 31 and sets a delay time τ of the delay circuit 41 so that the time delay of the main signal component (input transmission signal) that is provided from the divider 11 to the amplifier 60 through the combiner 15 and reaches the combiner 24 through the feedback signal path $P_F$ becomes equal to the time delay of the input transmission signal that travels from the divider 11 to the combiner 24 through the cancellation signal generating part 40 and reaches the combiner 24 as a cancellation signal, that is, the timings of the arrivals of signals from both paths become the same. Similarly, the cancellation signal vector controller 52 observes an output from the ADC 31 and controls the cancellation signal vector regulator 42 so that the phase and amplitude of a main signal component (input transmission signal) traveling through the amplifier 60 and the feedback signal path $P_F$ to the combiner 24 become equal to those of the input transmission signal provided to the combiner 24 through the cancellation signal generating part 40 as a cancellation signal.

Control of the predistorter of the first exemplary embodiment will be described below with reference to FIGS. 3 and 4. It is assumed here that I/Q signals input into the predistorter conform to a radio frame format of such as W-CDMA and contains a synchronization pilot signal inserted at periodic intervals. The synchronization pilot signal is used to adjust the delay time of the delay circuit 41. It is also assumed that the amplitude setting coefficient of the cancellation signal vector regulator 42 has been initialized to a non-zero value.

[Cancellation Signal Delay Control Process S10]

The delay controller 51 sets the delay time τ of the delay circuit 41 to a given initial value (S11). In practice, in order to facilitate measurement, it is convenient to set the initial value of the delay time τ to 0 so that a large difference appears between time delay of a signal passing through the amplifier 60 and the feedback signal path $P_F$ and the time delay of a signal passing through the cancellation signal generating part 40. The delay controller 51 measures the input time $t_1$ of a synchronization pilot signal contained in the input transmission signal distributed from the divider 11, the output time (feedback signal output time) $t_2$ and power $P_2$ of a synchronization pilot signal contained in the main signal component traveling through the amplifier 60 and the feedback signal path $P_F$ to the ADC 31, and the output time (cancellation signal output time) $t_3$ and power $P_3$ of a synchronization pilot signal contained in the input transmission signal traveling through the cancellation signal generating part 40 and the combiner 24 to the ADC 31 as a cancellation signal (S12). The measured times $t_2$ and $t_3$ are compared with each other (S13). If they do not match, the process proceeds to step S14, where determination is made as to whether both of the powers $P_2$ and $P_3$ are greater than a predetermined threshold value $P_{th}$. If so, the process proceeds to step S15. At step S15, the difference Δt between the measured times $t_2$ and $t_1$ is calculated and is set in the delay circuit 41 as the delay time τ of the delay circuit 41. If $t_2$ is equal to $t_3$ at step S13, the control process S10 will end without changing the setting in the delay circuit 41. If $P_2$ and $P_3$ are smaller than or equal to the threshold value $P_{th}$ at step S14, the control process S10 will end without changing the currently set delay time τ regardless of whether or not $t_2$ and $t_3$ are equal, because the cancellation signal has suppressed the main signal component to a desired degree.

Instead of performing step S15, as indicated by a dashed line, the delay time τ set in the delay circuit 41 may be increased by a predetermined small amount of delay time Δd at step S16, then the process may return to step S12, and steps S12, S13, S14 and S16 may be repeated until $t_2$ becomes equal to $t_3$ or $P_2$ and $P_3$ are reduced to a value less than or equal to $P_{th}$. In that case, the time $t_1$ does not need to be measured at step S12. Steps S11 through S15 (or S16) constitute the cancellation signal delay control process S10.

The delay controller 51 notifies the third-order distortion vector controller 321 and the cancellation signal vector controller 52 that the delay time τ of the delay circuit 41 has been determined. The following cancellation signal vector control process S20 by the cancellation signal vector controller 52 and the third-order distortion vector control process S30 by the third-order distortion vector controller 52 are performed independently of and in parallel with each other.

[Cancellation Signal Vector Control Process S20]

The cancellation signal vector controller 52 observes the power $P_{WM}$ of a residual main signal component (synchronization pilot signal component) of an output from the ADC 31 (S21) and determines whether or not the power $P_{WM}$ of the main signal component has been reduced to a minimum value (or a value less than or equal to a predetermined target value) (S22). If not, the cancellation signal vector controller 52 adjusts vector coefficients of the cancellation signal vector regulator 42 (S23), then returns to step S21 and repeats steps S21, S22 and S23 until the power $P_{WM}$ of the main signal component decreases to the minimum value (or a value less than or equal to the target value), thereby determining the vector coefficients of the cancellation signal vector regulator 42 that reduces the power $P_{WM}$ of the main signal component to the minimum value (or a value less than or equal to the target value). Then the cancellation signal vector controller 52 notifies the delay controller 51 that the vector coefficients of the cancellation signal vector regulator 42 have been determined.

[Third-Order Distortion Vector Control Process S30]

The third-order distortion vector controller 321 observes a distortion component, that is, third-order distortion component power $P_{WD3}$ in adjacent bands to the band of the suppressed main signal component of the signal from the ADC 31 (S31) and determines whether the power $P_{WD3}$ of the third-order distortion component has been reduced to a minimum value (or a value less than or equal to a predetermined target value) (S33). If not, the third-order distortion vector controller 321 adjusts the vector coefficients of the third-order distortion vector adjustor 141 (S33), then returns to step S31 and repeats the steps S31, S32 and S33 until the power $P_{WD3}$ of the third-order distortion component decreases to the minimum value (or a value less than or equal to the target value), thereby determining the vector coefficients of the third-order distortion vector regulator 141. Then the third-order distortion vector controller 321 notifies the delay controller 51 that the vector coefficients of the distortion vector regulator 141 have been determined.

[Repetition Control Process S40]

After the delay controller 51 receives the notifications that the coefficients have been determined from the cancellation signal vector controller 52 and the third-order distortion vector controller 321, the delay controller 51 measures the power $P_{WD3}$ of the third-order distortion component of an output from the ADC 31 (S41) and determines whether the third-order distortion component power $P_{WD3}$ has been reduced to a value less than or equal to a predetermined value $P_{Dth}$ (S42). If not, the delay controller 51 returns to the delay control process S10 and repeats the cancellation signal delay control process S10, the delay cancellation signal vector control process S20, the third-order distortion vector control process S30, and the repetition control process S40.

When the third-order distortion vector controller 321 determines at step S32 that the third-order distortion component power $P_{WD3}$ has been reduced to the minimum value (or less than or equal to the predetermined target value), the third-order distortion vector controller 321 may report the value $P_{WD3}$ to the delay controller 51 and the delay controller 51 may compare the third-order distortion component power $P_{WD3}$ reported from the third-order distortion vector controller 321 with the predetermined value $P_{Dth}$ at step S42 to determine whether the entire control process is to be repeated or not, instead of measuring the distortion component power at step S41 of the control process S40.

Figure 4:
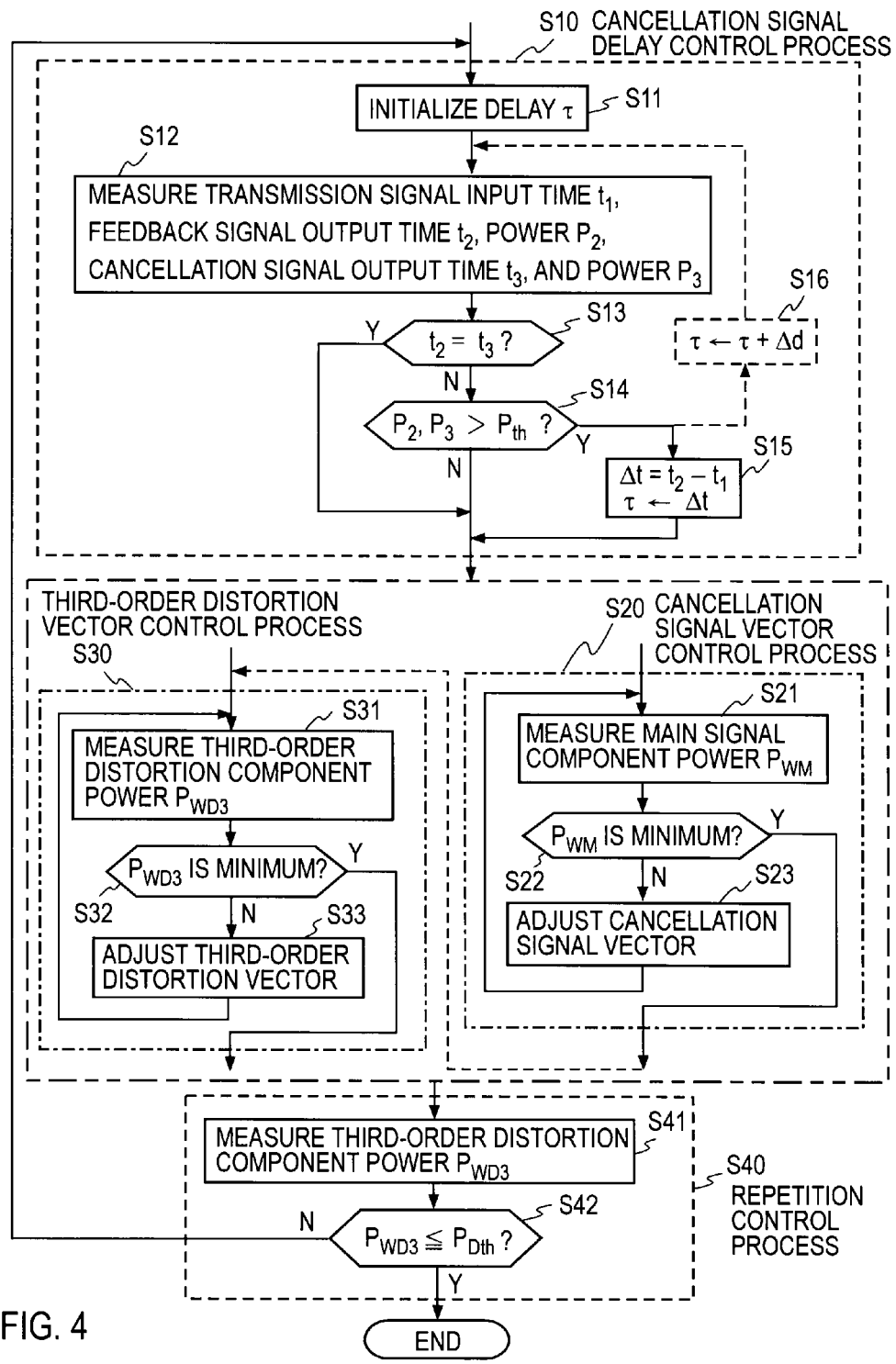
FIG. 4 is a flowchart illustrating a control process in the exemplary embodiment in FIG. 3.
Figure 5A:
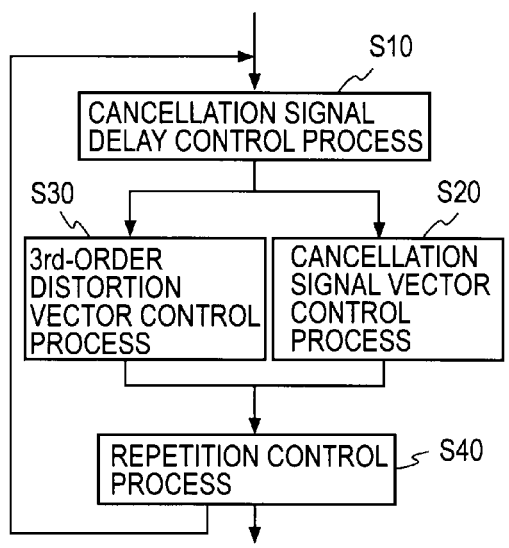
FIG. 5A is a diagram illustrating an exemplary control process flow in the exemplary embodiment in FIG. 3.
Figure 5B:
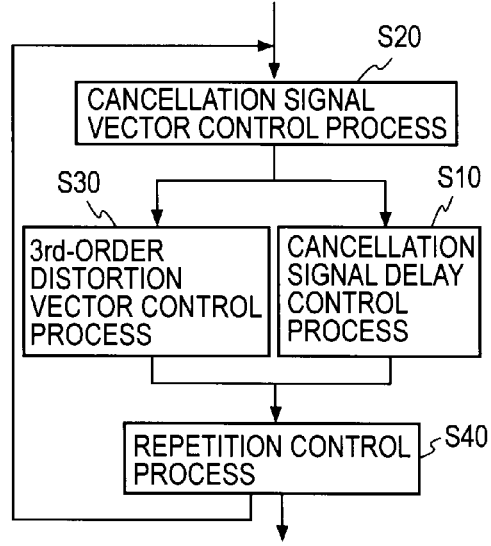
FIG. 5B is diagram illustrating another exemplary control process flow in the embodiment.

FIGS. 5A, 5B, 5C and 5D illustrate variations of the sequence of the cancellation signal delay control process S10, the cancellation signal vector control process S20, the third-order distortion vector control process S30, and the repetition control process S40 in the control process flow illustrated in FIG. 4. FIG. 5A illustrates the flow in which the cancellation signal vector control process S20 and the third-order distortion vector control process S30 are performed independently of and in parallel with each other as described above. FIG. 5B illustrate a variation in which the processes S10 and S20 in FIG. 5A are replaced with each other and the cancellation signal delay control process S10 and the third-order distortion vector control process S30 are performed independently of and in parallel with each other. The sequence of processes S20, S10, S30 and S40 is repeated until third-order distortion component power $P_{WD3}$ detected in the repetition control process S40 decreases to a value less than or equal to a predetermined value $P_{Dth}$.

Figure 5C:
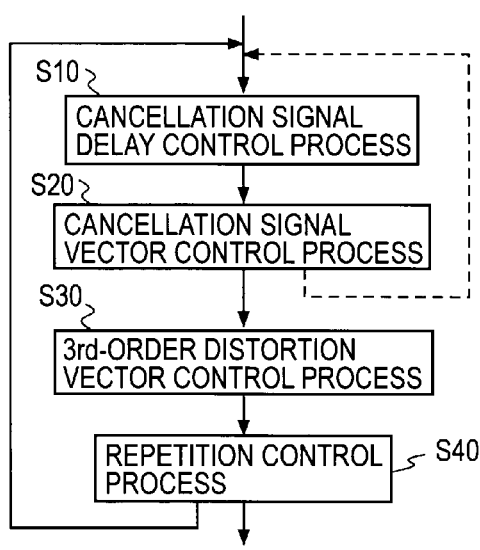
FIG. 5C is a diagram illustrating a yet another exemplary control process flow.

FIG. 5C illustrates a variation in which the processes S10, S20, S30 and S40 are performed in sequence in a coordinated manner. Specifically, the delay controller 51 performs the cancellation signal delay control process S10 in FIG. 4 to determine delay time τ, set the delay time τ in the delay circuit 41, and notify the cancellation signal vector controller 52 that the delay time τ has been set. The cancellation signal vector controller 42 receives the notification and starts the cancellation vector control process S20 in FIG. 4 and, upon completion of the setting of vector coefficients of the cancellation signal vector regulator 42, notifies the third-order distortion vector controller 321 of the completion of the setting. The third-order distortion vector controller 321 receives the notification and starts the third-order distortion vector control process S30 in FIG. 4. Upon completion of setting of vector coefficients of the third-order distortion vector regulator 141, the third-order distortion vector controller 321 notifies the delay controller 51 of the completion of the setting. The delay controller 51 causes the sequence of the processes S10, S20, S30 and S40 to be repeated until the third-order distortion component power $P_{WD3}$ detected decreases to a value less than or equal to the predetermined value $P_{Dth}$ in the repetition control process S40. As indicated by the dashed line in FIG. 5C, the processes S10 and S20 may be repeated until a predetermined condition is satisfied (for example, a predetermined number of repetitions is reached or the main signal component power is reduced to a value less than or equal to a predetermined value).

Figure 5D:
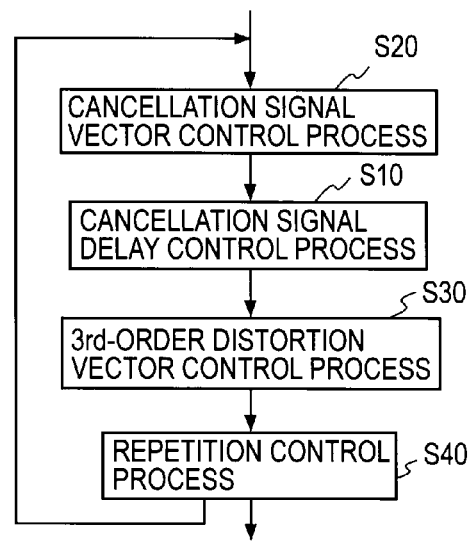
FIG. 5D is a diagram illustrating a yet another exemplary control process flow.

FIG. 5D illustrates a variation in which the sequence of the processes S10 and S20 in FIG. 5C is changed. The processes in FIG. 5D are the same as those in FIG. 5C and therefore the description of the processes will be omitted.

The cancellation signal vector regulator 42 in the configuration depicted in FIG. 3 may be implemented by an analog circuit. In that case, the DAC 43 is provided between the delay circuit 41 and the cancellation signal vector regulator 42.

[First Variation]

Figure 6:
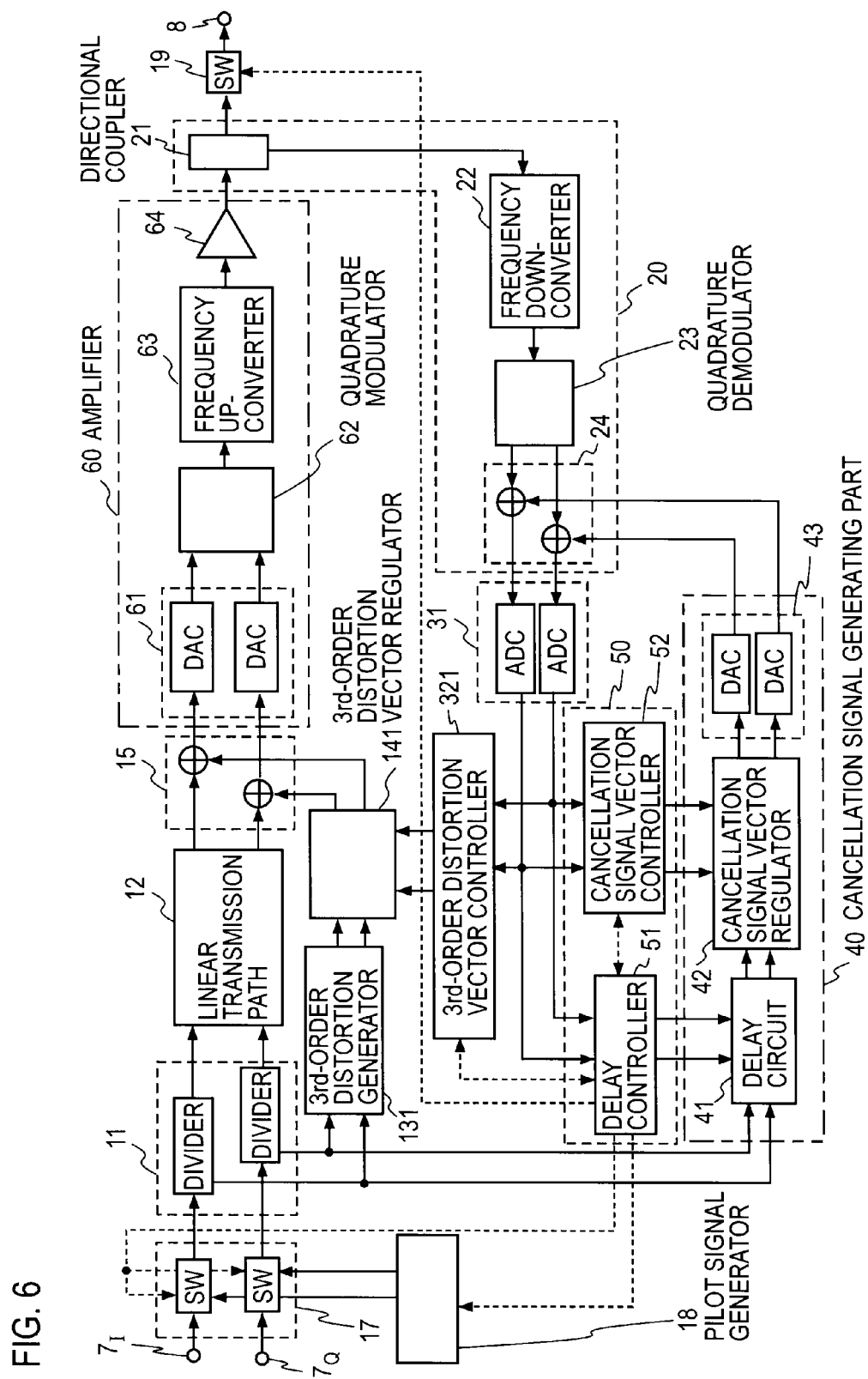
FIG. 6 is a block diagram illustrating a variation of the exemplary embodiment in FIG. 3 which includes a pilot signal generator and input and output switches added.

While the synchronization pilot signal inserted in the input transmission signal at periodic intervals is used for the control process by the controllers in the exemplary embodiment in FIG. 3, a separate pilot signal may be used. An example in which a separate pilot signal is used is illustrated in FIG. 6 as a variation of the first exemplary embodiment. The configuration of the variation includes a pilot signal generator 18, input switches 17 which selectively connect either the output of the pilot signal generator 18 or input terminals $7_I$, $7_Q$ to a divider 11, and an output switch 19 which is inserted between a directional coupler 21 and an output terminal 8 and turns on and off an output of an amplifier 60, in addition to the components of the first exemplary embodiment in FIG. 3.

Figure 7A:
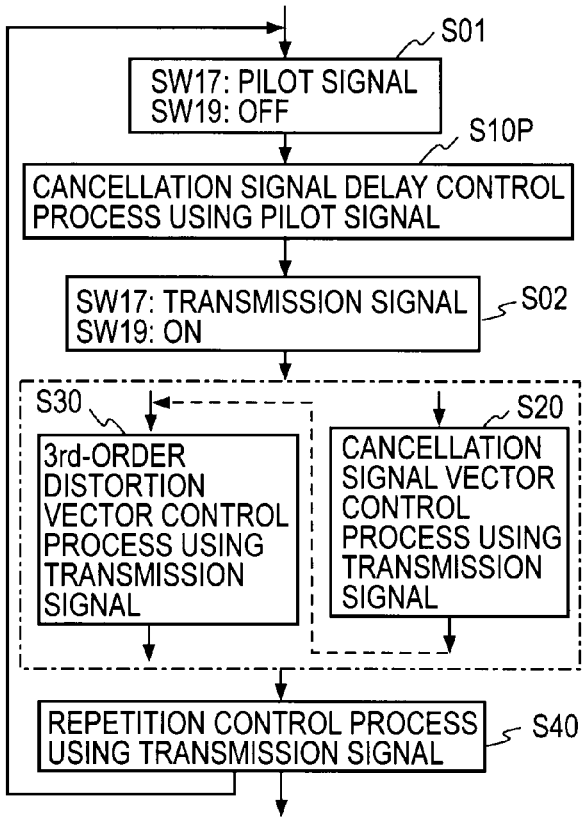
FIG. 7A is a diagram illustrating an exemplary control process flow in the exemplary embodiment in FIG. 6.
Figure 7B:
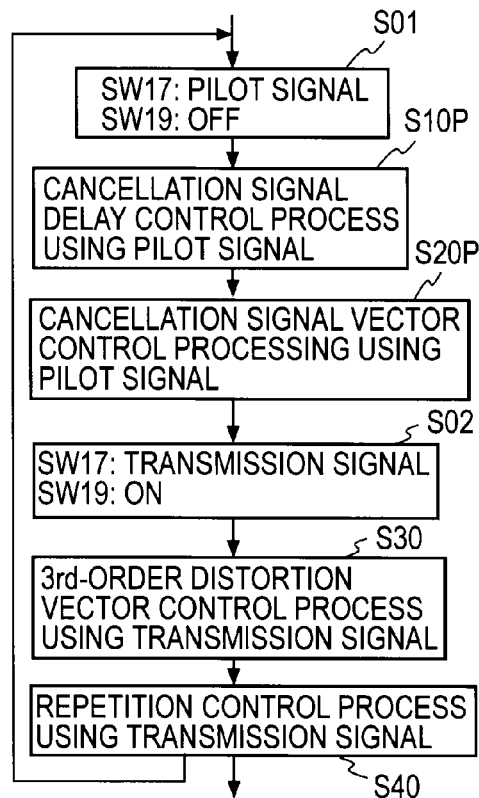
FIG. 7B is a diagram illustrating another exemplary control process flow.
Figure 7C:
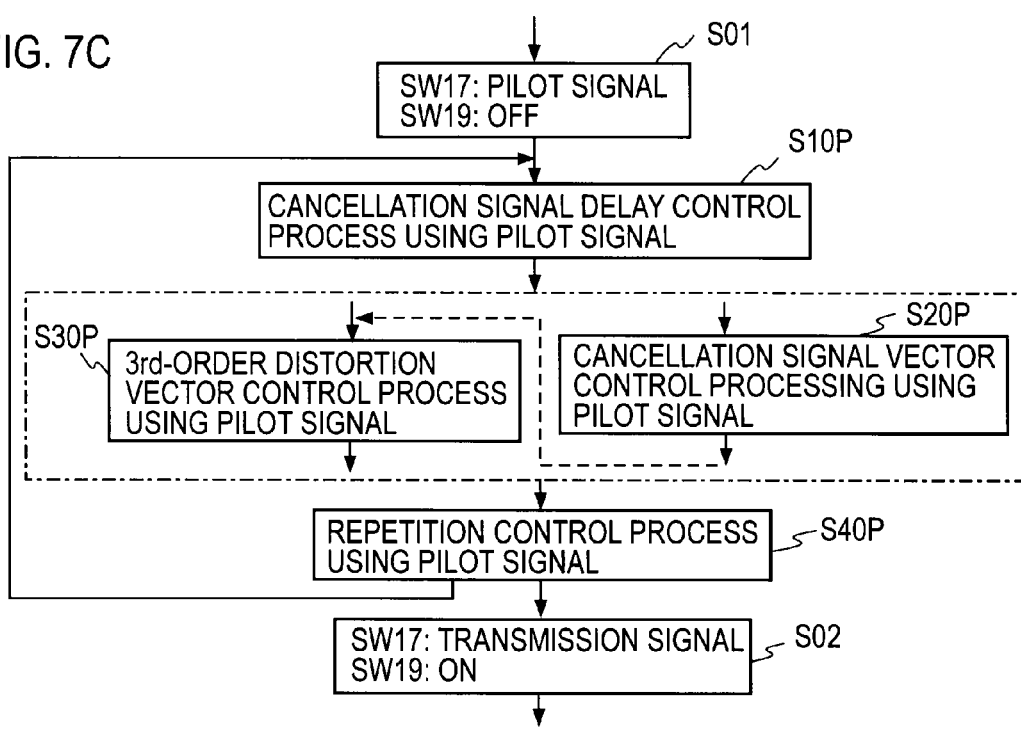
FIG. 7C is a diagram illustrating a yet another exemplary control process flow.

Three typical exemplary control process flows in the predistorter depicted in FIG. 6 are illustrated in FIGS. 7A, 7B and 7C.

[Control Process Flow A]

Switch setting (S01): Instead of a synchronization pilot signal in an input transmission signal, a pulse wave generated by the pilot signal generator 18 is used as a separate pilot signal to control delay time τ. To that end, first the input switches 17 are connected to the side of the pilot signal generator 18 and turns off the output switch 19.

Cancellation signal delay control process using separate pilot signal S10P: The process is basically the same as the cancellation signal delay control process S10 in FIG. 4 with the only difference being that a separate pilot signal is used. Specifically, the same operations as the operations at steps S11 through S15 (or S16) of FIG. 4 are performed with the separate pilot signal, that is, the separate pilot signal is used to measure transmission signal input time $t_1$, feedback signal output time $t_2$ and power $P_2$, and cancellation signal output time $t_3$ and power $P_3$, and then delay time τ is determined on the measurements and is set in the delay circuit 41. The delay controller 51 notifies the third-order distortion vector controller 321 and the cancellation signal vector controller 52 that the delay time τ of the delay circuit 41 has been determined.

Switch setting (S02): The input switches 17 are connected to the input terminals $7_I$ and $7_Q$ and the output switch 19 is turned on.

Cancellation signal vector control process S20: The input transmission signal is used to perform the same control process as the cancellation signal vector control process S20 in FIG. 4 to adjust the vector coefficients of the cancellation signal vector regulator 42.

Third-order distortion vector control process S30: The input transmission signal is used to perform the same control process as the third-order distortion vector control process S30 in FIG. 4 to adjust the vector coefficients of the third-order distortion vector regulator 141.

Repetition control process S40: The input transmission signal is used to perform the same control process as the repetition control process S40 in FIG. 4 to repeat the entire control process S01, S10P, S02, S20, S30 and S40 until the third-order distortion component power $P_{WD3}$ is reduced to a value less than or equal to a predetermined value $P_{Dth}$.

The control processes S20 and S30 may be performed independently of and in parallel with each other or the control process S30 may be performed after completion of the control process S20.

[Control Process Flow B]

Switch setting (S01): As in control process flow A, the input switches 17 are connected to the pilot signal generator 18 side and the output switch 19 is turned off.

Cancellation signal delay control process using separate pilot signal S10P: As in the control process S10P of control process flow A described above, a separate pilot signal is used to control delay time τ to be set in the delay circuit 41.

Cancellation signal vector control process using separate pilot signal S20P: The separate pilot signal from the pilot signal generator 18 is used to perform the same control process as the cancellation signal vector control process S20 of FIG. 4 to adjust the vector coefficients of the cancellation signal vector regulator 42.

Switch setting (S02): The input switches 17 are connected to the input terminals $7_I$ and $7_Q$ and the output switch 19 is turned on.

Third-order distortion vector control process S30: The input transmission signal is used to perform the same control process as the third-order distortion vector control process S30 in FIG. 4 to adjust the vector coefficients of the third-order distortion vector regulator 141.

Repetition control process S40: The input transmission signal is used to perform the same control process as the repetition control process S40 in FIG. 4 to repeat the entire control processes S01, S10P, S20, S02, S30 and S40 until the third-order distortion component power $P_{WD3}$ is reduced to a value less than or equal to a predetermined value $P_{DTh}$.

[Control Process Flow C]

Switch setting (S01): As in control process flow A, the input switches 17 are connected to the pilot signal generator 18 and the output switch 19 is turned off.

Cancellation signal delay control process using separate pilot signal S10P: As in the control process S10P of control process flow A described above, control is performed to set delay time τ in the delay circuit 41 by using a separate pilot signal. Upon completion of the setting, the completion of the setting is notified to the cancellation signal vector controller 52 and the third-order distortion vector controller 321.

Cancellation signal vector control process using separate pilot signal S20P: The separate pilot signal from the pilot signal generator 18 is used to perform the same control process as the cancellation signal vector control process S20 in FIG. 4 to adjust the vector coefficients of the cancellation signal vector regulator 42.

Third-order distortion vector control process using separate pilot signal S30P: The separate pilot signal is used to perform the same control process as the third-order distortion vector control process S30 in FIG. 4 to adjust the vector coefficients of the third-order distortion vector regulator 141.

Repetition control process using separate pilot signal S40P: The separate pilot signal is used to perform the same control process as the repetition control process S40 in FIG. 4 to repeat the entire control processes S10P, S20P, S30P and S40P until the third-order distortion component power $P_{WD3}$ is reduced to a value less than or equal to a predetermined value $P_{Dth}$.

Switch setting (S02): The input switches 17 are connected to the input terminals $7_I$ and $7_Q$ and the output switch 19 is turned on.

In control process flow C, the control processes S20P and S30P may be performed independently of and in parallel with each other, or control process S20P may be performed and then control process S30P may be performed.

The separate pilot signal periodically output from the pilot signal generator 18 in the variation described above and depicted in FIG. 6 may be a signal such as a W-CDMA signal that is actually transmitted, instead of the pulse wave.

[Second Variation]

Figure 8:
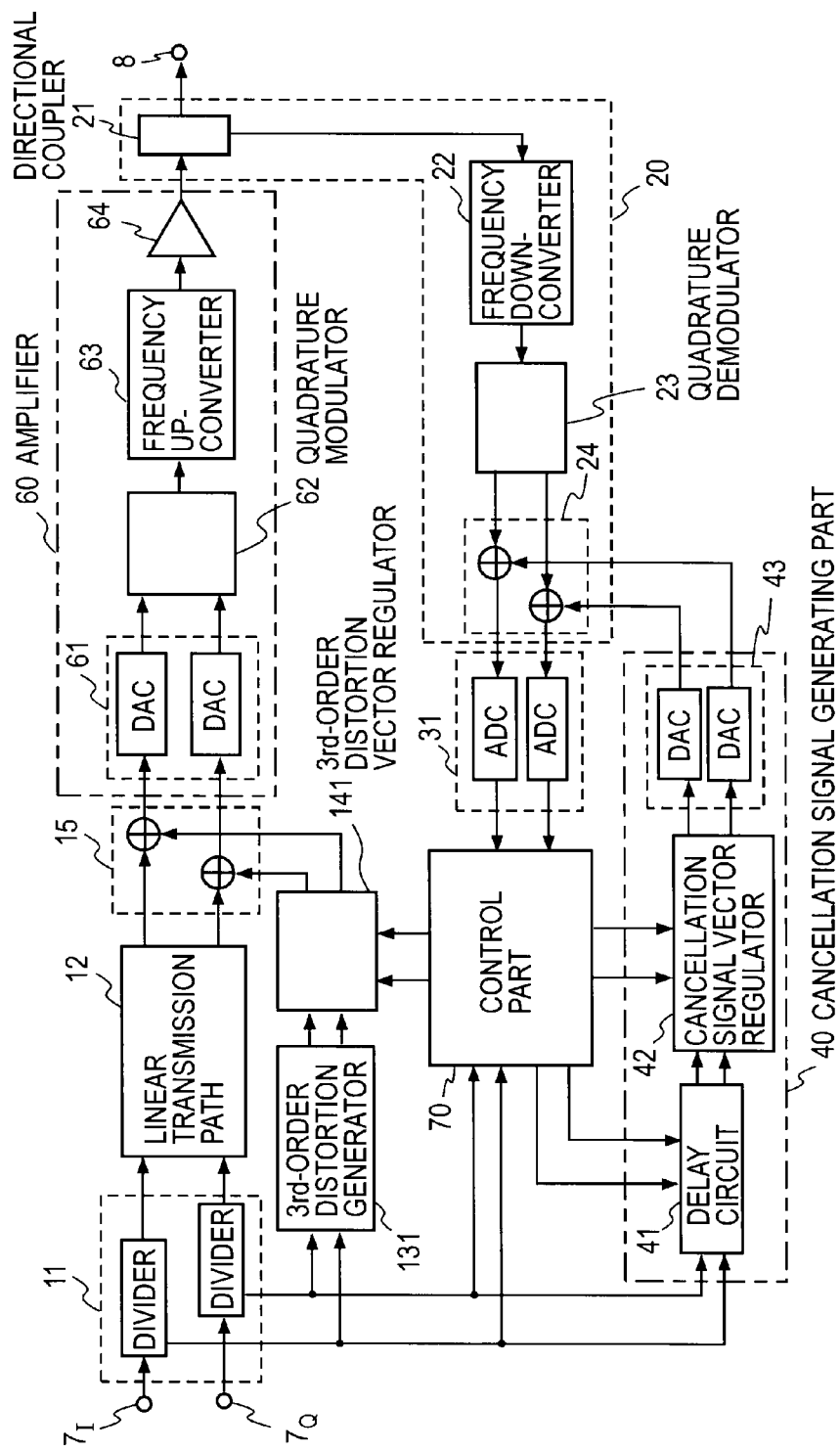
FIG. 8 is a block diagram illustrating a variation of the exemplary embodiment in FIG. 3 in which a third-order distortion vector controller 321, a cancellation signal vector controller 52 and a delay controller 51 are integrated into one controller.

The delay controller 51, the cancellation signal vector controller 52, and the third-order distortion vector controller 321 in the exemplary embodiment in FIG. 3 may be integrated into one control part 70 as depicted in FIG. 8. The control part 70 is configured to be able to individually adjust the vector coefficients of the cancellation signal vector regulator 52, the vector coefficients of the third-order distortion vector regulator 141, and the delay time τ of the delay circuit 41.

[Third Variation]

FIG. 9 illustrates a variation in which a predistorter is configured to be able to compensate for the fifth-order distortion component in addition to the third-order distortion component as intermodulation distortion generated in the power amplifier. The configuration of the predistorter includes a fifth-order distortion generating path $P_{DG5}$ including a fifth-order distortion generator 132 and a fifth-order distortion vector regulator142, a combiner 33 which combines an output signal from a third-order distortion generating path $P_{DG3}$ with an output signal from the firth-order distortion generating path $P_{DG5}$ and provides the combined signal to a combiner 15, and a fifth-order distortion vector controller 322 which controls vector coefficients of the fifth-order distortion vector regulator 142 to reduce a fifth-order distortion component of a feedback signal to a minimum value (or a value less than or equal to a predetermined target value) in addition to the components of the first exemplary embodiment illustrated in FIG. 3. The third-order distortion vector controller 321, the cancellation signal vector controller 52, the delay controller 51 and the fifth-order distortion vector controller 322 may be integrated into one controller.

An input transmission signal is distributed from a divider 11 to the fifth-order distortion generator 132 as well, where the input transmission signal is raised to the fifth power to generate a fifth-order distortion component, which is then provided to the fifth-order distortion vector regulator 142. The fifth-order distortion vector regulator 142 adjusts the phase and amplitude of the fifth-order distortion component under the control of the fifth-order distortion vector controller 322 and provides the resulting fifth-order distortion component to the combiner 33, where the fifth-order distortion component is combined with an output from the third-order distortion vector regulator 141 to generate a compensation signal. The compensation signal, which is the combined output of the third-order distortion component and the fifth-order distortion component from the combiner 33, is then combined with an output from the linear transmission path 12 by the combiner 15 to generate an output of the predistorter.

Figure 10A:
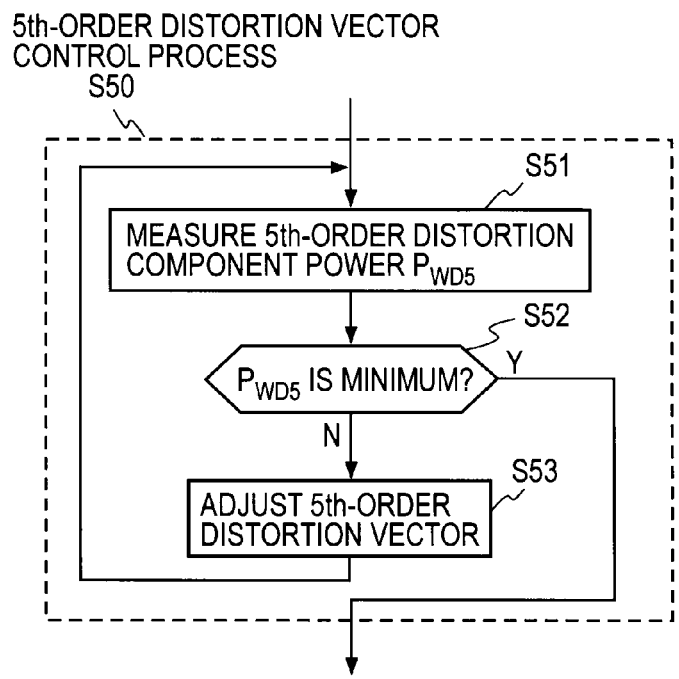
FIG. 10A is a flowchart illustrating a fifth-order distortion vector control process in the variation in FIG. 9.

As illustrated in FIG. 10A, in a fifth-order distortion vector control process S50 performed by the fifth-order distortion vector controller 322, the fifth-order distortion vector controller 322 measures the power $P_{WD5}$ of a fifth-order distortion component, which lies just outside the third-order distortion component in the adjacent bands to the main signal component of an output of the ADC 31 (S51), determines whether the measured fifth-order distortion component power $P_{WD5}$ has been reduced to a minimum value (or a value less than or equal to a predetermined target value) (S52) and, if not, adjusts vector coefficients of the fifth-order distortion vector regulator 142 (S53), then returns to step S51 and repeats steps S51, S52 and S53 until the fifth-order distortion component power $P_{WD5}$ is reduced to the minimum value (or a value less than or equal to the target value).

Figure 10B:
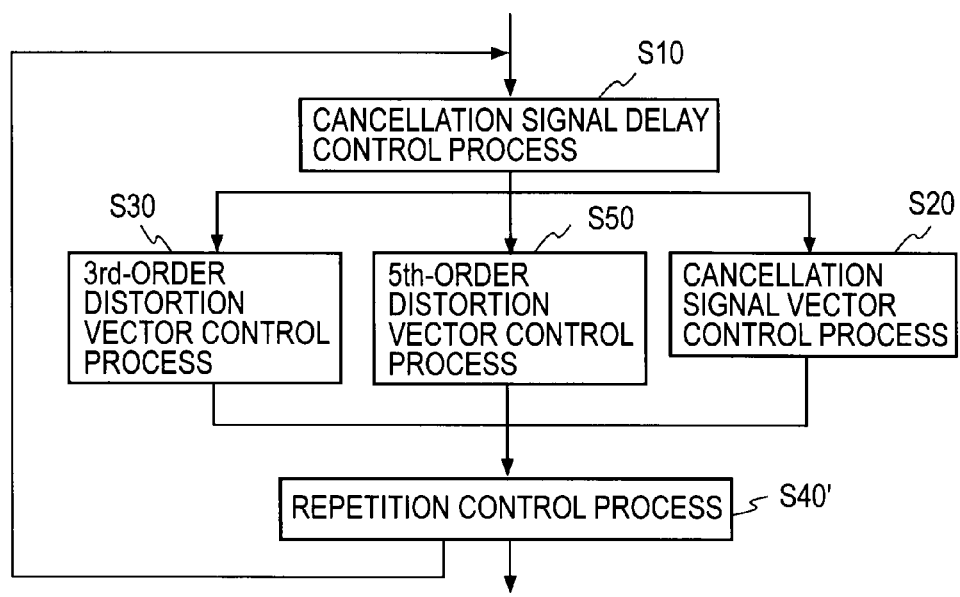
FIG. 10B is a flowchart illustrating a general control process flow.

FIG. 10B illustrates a control process flow in the variation in FIG. 9.

Cancellation signal delay control process S10: The process is the same as the cancellation signal delay control process S10 in FIG. 4. Specifically, the same control steps as steps S11 through S15 (S16) in FIG. 4 are performed. A synchronization pilot signal in an input transmission signal is used to measure transmission signal input time $t_1$, feedback signal output time $t_2$ and power $P_2$, and cancellation signal output time $t_3$ and power $P_3$. Delay time $\tau$ is determined on the basis of the measurements and is set in the delay circuit 41. The delay controller 51 notifies the third-order distortion vector controller 321, the fifth-order distortion vector controller 322 and the cancellation signal vector controller 522 that the delay time $\tau$ of the delay circuit 41 has been determined.

Cancellation signal vector control process S20: The same control process as the cancellation signal vector control process S20 in FIG. 4 is performed to adjust vector coefficients of the cancellation signal vector regulator 42.

Third-order distortion vector control process S30: The same control process as the third-order distortion vector control process S30 in FIG. 4 is performed to adjust vector coefficients of the third-order distortion vector regulator 141.

Fifth-order distortion vector control process S50: The fifth-order distortion vector control process S50 in FIG. 10A is performed to adjust vector coefficients of the fifth-order distortion vector regulator 142. Here, the fifth-order distortion vector controller 322 may also measure $P_{WD3}$ at S51, may determine at S52 whether the sum of $P_{WD3}$ and $P_{WD5}$ is reduced to a minimum value (or a value less than or equal to a predetermined target value), and may repeat steps S51, S52 and S53 until the sum of the $P_{WD3}$ and $P_{WD5}$ is reduced to the minimum value (or a value less than or equal to the target value).

Repetition control process S40': The same process as the repetition control process S40 in FIG. 4 is performed to repeat the entire control processes S10, S20, S30, S50 and S40 until distortion component power $P_{WD}$ becomes less than or equal to a predetermined value $P_{Dth}$. Here, the distortion component power $P_{WD}$ may be the sum of third-order distortion component power $P_{WD3}$ and fifth-order distortion component power $P_{WD5}$ and determination may be made as to whether the sum is less than or equal to a predetermined value $P_{Dth}$. Alternatively, determination may be made as to whether each of $P_{WD3}$ and $P_{WD5}$ is less than or equal to a predetermined value $P_{Dth}$. Alternatively, different threshold values may be predetermined for third-order distortion and fifth-order distortion, and determination may be made as to whether $P_{WD3}$ and $P_{WD5}$ are less than or equal to their respective predetermined values. $P_{WD3}$ and $P_{WD5}$ may be detected from an output from the ADC 31 by the delay controller 51. Alternatively, $P_{WD3}$ and $P_{WD5}$ measured in the third-order distortion vector control process S30 and the fifth-order distortion vector control process S50, respectively, may be reported to the delay controller 51 and used by the delay controller 51. Alternatively, an out-of-band power of a main signal component may be measured at the delay controller 51 and may be regarded as distortion power $P_{WD}$ and compared with a predetermined value $P_{Dth}$.

The control processes S20, S30 and S50 may be performed independently and in parallel, or the control process S20 may be performed first, followed by the control process S30, and then followed by the control process S50.

Figure 11A:
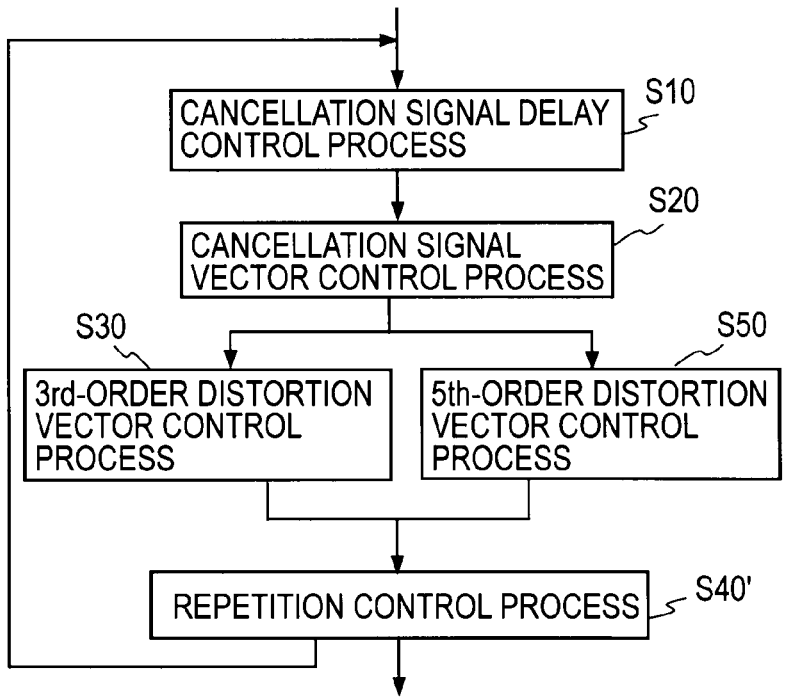
FIG. 11A is a diagram illustrating another exemplary control process flow in the variation in FIG. 9.
Figure 11B:
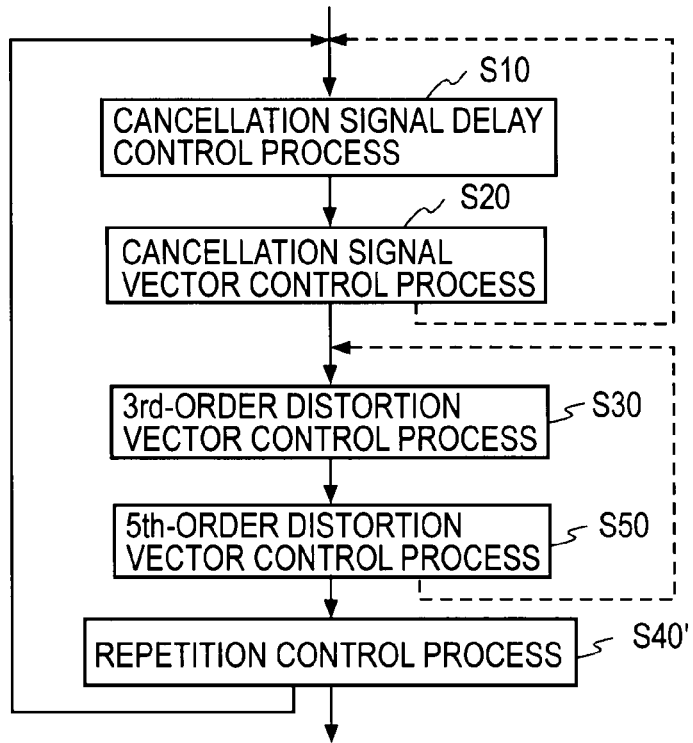
FIG. 11B is a yet another exemplary control process flow.

FIGS. 11A and 11B illustrate exemplary control process flows different from the control process flow in FIG. 10B in the variation in FIG. 9.

[Control Process Flow A]

Cancellation signal delay control process S10: The same control process as the delay control process S10 in FIG. 4 is performed to control delay time $\tau$ to be set in the delay circuit 41.

Cancellation signal vector control process S20: The same control process as the cancellation signal vector control process S20 in FIG. 4 is performed to adjust vector coefficients of the cancellation signal vector regulator 42.

Third-order distortion vector control process S30: The same control process as the third-order distortion vector control process S30 in FIG. 4 is performed to adjust vector coefficients of the third-order distortion vector regulator 141.

Fifth-order distortion vector control process S50: The fifth-order distortion vector control process S50 in FIG. 10A is performed to adjust vector coefficients of the fifth-order distortion vector regulator 142.

Repetition control process S40': The same control process as the repetition control process S40' in FIG. 10B is performed to repeat the entire control processes S10, S20, S30, S50 and S40' until the distortion component power $P_{WD}$ is reduced to a value less than or equal to a predetermined value $P_{Dth}$. The control processes S30 and S50 may be performed independently of and in parallel with each other. The control processes S10 and S20 may be replaced with each other.

[Control Process Flow B]

Cancellation signal delay control process S10: The same process as the control process S10 in FIG. 4 is performed to control delay time $\tau$ to be set in the delay circuit 41.

Cancellation signal vector control process S20: The same process as the cancellation signal vector control process S20 in FIG. 4 is performed to adjust vector coefficients of the cancellation signal vector regulator 42.

Third-order distortion vector control process S30: The same process as the third-order distortion vector control process S30 in FIG. 4 is performed to adjust vector coefficients of the third-order distortion vector regulator 141.

Fifth-order distortion vector control process S50: The fifth-order distortion vector control process S50 in FIG. 10A is performed to adjust vector coefficients of the fifth-order distortion vector regulator 142.

Repetition control process S40': The same control process as the repetition control process S40' in FIG. 10B is performed to repeat the entire control processes S10, S20, S30, S50 and S40' until the distortion component power $P_{WD}$ is reduced to a value less than or equal to a predetermined value $P_{Dth}$.

As indicted by the dashed line in FIG. 11B, the control processes S10 and S20 may be repeated until a predetermined condition is satisfied. The predetermined condition may be that a predetermined number of repetitions has been reached or that the main signal component power has been reduced to a value less than or equal to a predetermined value, for example. The control processes S10 and S20 may be replaced with each other.

As indicated by the dashed line, the control processes S30 and S50 may be repeated a predetermined condition is satisfied. The predetermined condition may be that a predetermined number of repetitions has been reached or that the distortion component power has been reduced to a value less than or equal to a predetermined value. The control process S30 may be replaced with the control process S50.

A pilot signal generator 18, input switches 17, and an output switch 19 similar to those depicted in FIG. 6 may be added to the configuration of the variation illustrated in FIG. 9 and a separate pilot signal may be used to perform the control processes by the controllers.

An Hth-order (where H is an odd number greater than or equal to 7) distortion generating path and an Hth-order distortion vector controller which adjust vector coefficients of an Hth-order distortion vector regulator in the Hth-order distortion generating path may be added to the variation in FIG. 9.

[Fourth Variation]

Figure 12:
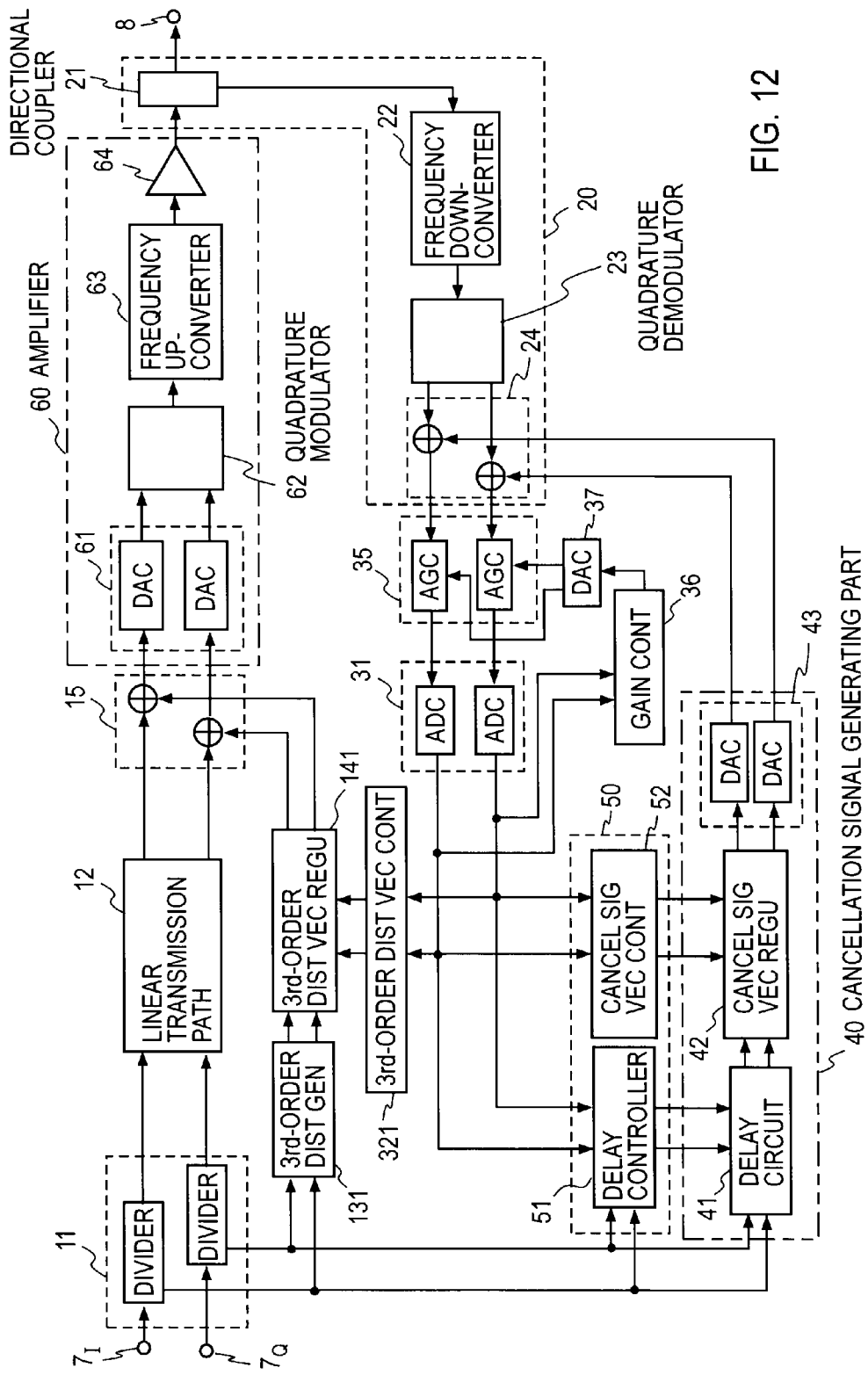
FIG. 12 is a block diagram illustrating a variation of the exemplary embodiment in FIG. 3 which includes an automatic gain control circuit 35, a gain controller 36 and a DAC 37 added.

FIG. 12 illustrates a variation of the first exemplary embodiment illustrated in FIG. 3 in which an automatic gain control circuit (AGC) 35 for adjusting the voltage of a feedback signal output from the combiner 24, a gain controller 36 for controlling the gain of the automatic gain control circuit 35, and a digital-to-analog converter (DAC) 37 which converts a control signal to be provided from the gain controller 36 to the automatic gain control circuit 35 to an analog control signal are added to the configuration of the first exemplary embodiment. Here, the third-order distortion vector controller 321, the cancellation signal vector controller 52, and the delay controller 51, and the gain controller 36 may be integrated into one controller.

The gain controller 36 monitors an output from the ADC 31 and controls the gain of the AGC 35 so that the output voltage of the automatic gain control circuit 35 becomes equal to the full scale of the input voltage of the ADC 31. When the combiner 24 suppresses a main signal component with a cancellation signal from the cancellation signal generating part 40, the output voltage of the combiner 24 decreases accordingly. Therefore, in order to make full use of the input voltage range of the ADC 31, the output voltage of the combiner 24 is amplified by the AGC 35 to make the absolute value $|V_F|$ of the output voltage of the AGC 35, hence the output voltage of the ADC 31 (the amplitude of the feedback signal), approximately equal to the maximum input range of the ADC 31. The periods of the control by the AGC 35 may be the same as the periods of the control by the cancellation signal generating part 40 for suppressing the main signal component.

Figure 13A:
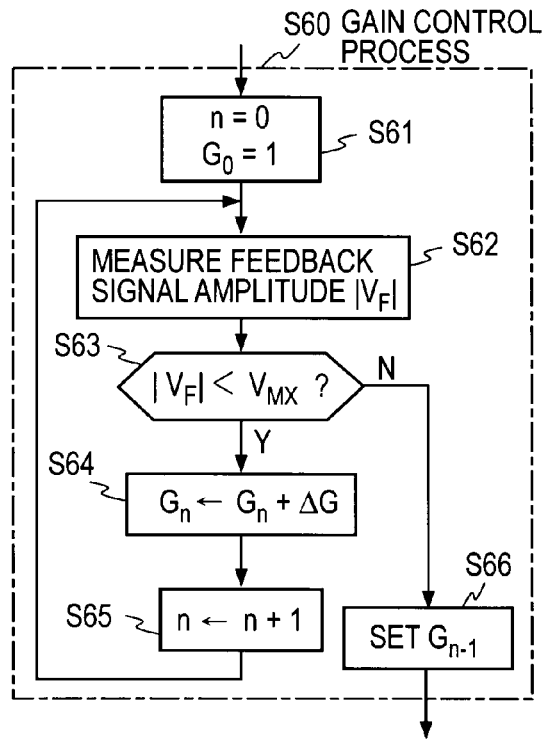
FIG. 13A is a flowchart illustrating a gain control process.

FIG. 13A illustrates an exemplary gain control process S60 performed by the gain controller 36. In the automatic gain control circuit 35, the initial value $G_0$ of the gain $G_n$ is preset to 1 and the integer n is initialized to 0 (S61). The gain controller 36 determines whether or not the amplitude $|V_F|$ of the digital feedback signal output from the ADC 31 is smaller than a predetermined value $V_{MX}$ corresponding to the maximum input range of the ADC 31 (S62). If the amplitude $|V_F|$ is smaller than the value $V_{MX}$, the gain controller 36 increases the current gain $G_n$ by a predetermined amount $\Delta G$ and sets the increased value in the AGC 35 (S64), increments n by 1 (S65), and then returns to step S62. Steps S62 through S65 are repeated until the amplitude $|V_F|$ becomes greater than or equal to $V_{MX}$ at step S63. When $|V_F|$ becomes greater than or equal to $V_{MX}$ at step S63, the gain controller 36 sets the previous gain $G_{n-1}$ in the AGC 35 (S66).

Figure 13B:
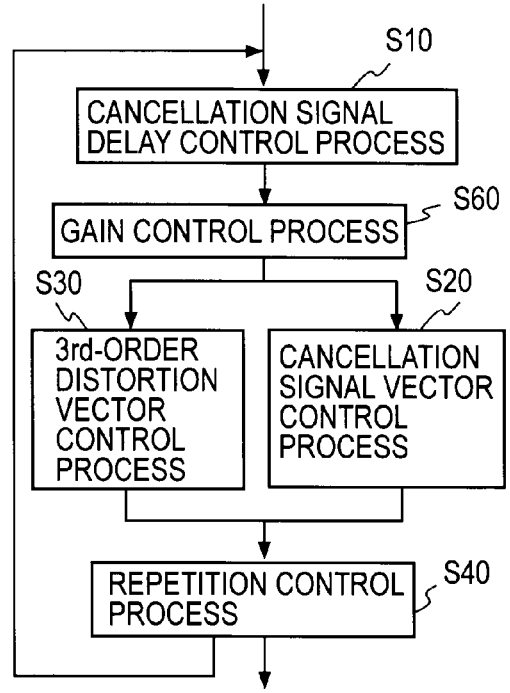
FIG. 13B is a flowchart illustrating a control process flow in the variation in FIG. 12.
Figure 13C:
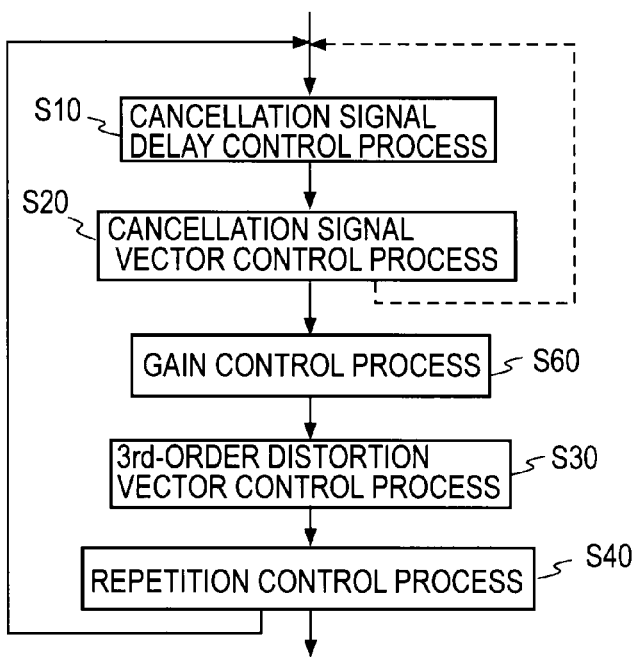
FIG. 13C is a diagram illustrating another exemplary control process flow.

FIGS. 13B and 13C illustrate two exemplary general control process flows of the variation in FIG. 12, which correspond to the control process flows illustrated in FIGS. 5A and 5C, respectively.

In FIG. 13B, the same control process S10 as the cancellation signal delay control process S10 in FIG. 4 is performed to set delay time τ in the delay circuit 41. Then the gain control process S60 illustrated in FIG. 13A is performed to set the gain $G_{n-1}$ in the AGC 35 through the DAC 37. The subsequent cancellation signal vector control process S20, third-order distortion vector control process S30, and repetition control process S40 are the same as the control processes S20, S30 and S40, respectively, in FIG. 4.

The control process flow in FIG. 13C is the same as the control process flow illustrated in FIG. 5C, except that the gain control process S60 is inserted between the control processes S20 and S30.

The configuration illustrated in FIG. 12 that controls the gain of the feedback signal is applicable to any of the other exemplary embodiments and their variations.

[Fifth Variation]

Figure 14:
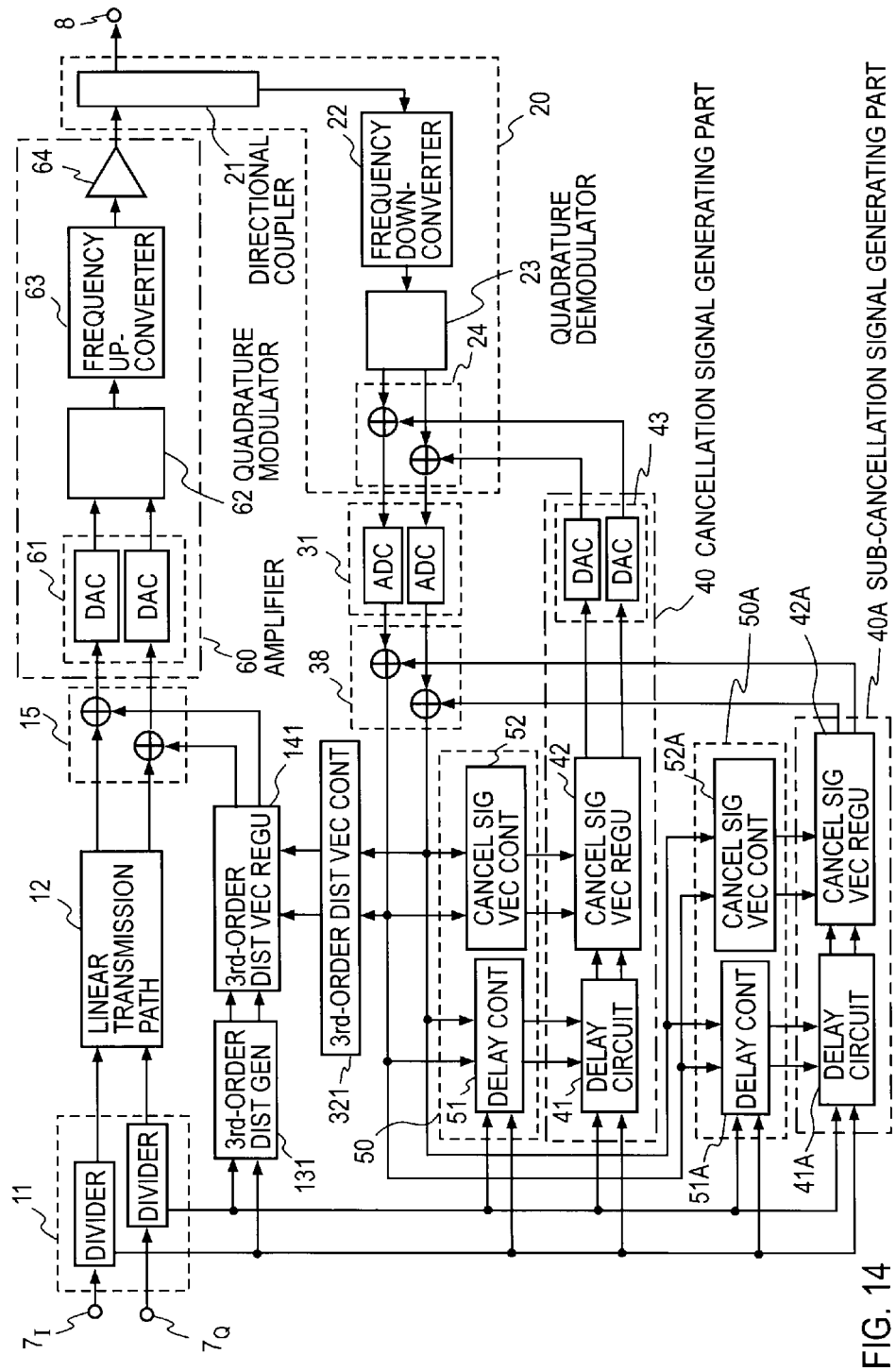
FIG. 14 is a block diagram illustrating a variation of the exemplary embodiment in FIG. 3 which includes a sub-cancellation signal generating part 40A, a delay controller 51A and a sub-cancellation signal vector controller 52A added.

FIG. 14 illustrates a variation of the first exemplary embodiment illustrated in FIG. 3. The variation includes, in addition to the components of the first exemplary embodiment, a sub-cancellation signal generating part 40A which includes a delay circuit 41A and a sub-cancellation signal vector regulator 42A and generates a sub-cancellation signal from an input transmission signal distributed from the distributer 11 and a combiner 38 which combines an output from the ADC 31 with the sub-cancellation signal from the sub-cancellation signal generating part 40A to further suppress a residual main signal component in a feedback signal. The variation further includes a sub-cancellation signal control part 50A including a sub-cancellation signal vector controller 52A which controls vector coefficients of the sub-cancellation signal vector regulator 42A to reduce a main signal component to a minimum value (or a value less than or equal to a predetermined target value) and a delay controller 51A which controls delay time $\tau_2$ of the delay circuit 41A so that time delay of a feedback signal output becomes equal to time delay of sub-cancellation signal output at the combiner 38. The third-order distortion vector controller 321, the cancellation signal vector controller 52, and the delay controllers 51 and 81, and the sub-cancellation signal vector controller 82 may be integrated into one controller.

As in the exemplary embodiment in FIG. 3, it is assumed here that the input transmission signal input into the predistorter conforms to a radio frame format of such as W-CDMA and contains a synchronization pilot signal inserted at periodic intervals. The input transmission signal from the divider 11 is also provided to the delay circuit 41A of the sub-cancellation signal generating part 40A. The control process by the delay controller 51 for setting delay time τ of the delay circuit 41, the control process by the cancellation signal vector controller 52 for setting vector coefficients of the cancellation signal vector regulator 42, and the control process by the third-order distortion vector controller 321 for setting vector coefficients of the third-order distortion vector regulator 141 are the same as those described with respect to FIGS. 3 and 4 and therefore the description of these control processes will be omitted.

Figure 15A:
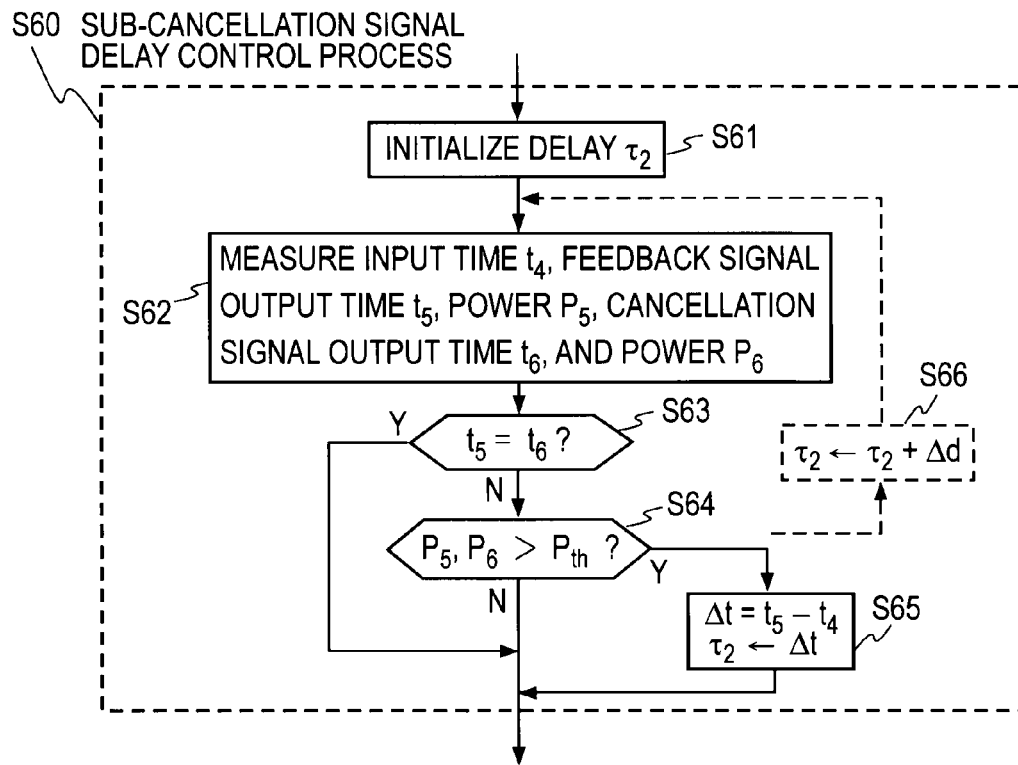
FIG. 15A is a flowchart illustrating a sub-cancellation signal delay control process.

FIG. 15A illustrates a sub-cancellation signal delay control process S60 performed by the delay controller 51A for setting delay time $\tau_2$ in the delay circuit 41A. The principle of the control is the same as that of the control process S10 illustrated in FIG. 4. A synchronization pilot signal contained in the transmission signal is also used for adjusting the delay time $\tau_2$ of the delay circuit 41A. It is assumed here that the amplitude setting coefficient of the sub-cancellation signal vector regulator 42A has been initialized to a non-zero value.

[Sub-Cancellation Signal Delay Control Process S60]

The delay controller 51A sets the delay time $\tau_2$ of the delay circuit 41A to any initial value, for example 0 (S61). The delay controller 51A measures input time $t_4$ of a synchronization pilot signal contained in an input transmission signal from the divider 11, the output time (feedback signal output time) $t_5$ and power $P_5$ of a synchronization pilot signal contained in a main signal component of a feedback signal traveling through the amplifier 60, the feedback signal path $P_F$, and an ADC 31 to the combiner 38, and output time (sub-cancellation signal output time) $t_6$ and power $P_6$ of a synchronization pilot signal contained in an input transmission signal (sub-cancellation signal) traveling through the sub-cancellation signal generating part 40A to the combiner 38 (S62). The delay controller 51A compares measured times $t_5$ with $t_6$ (S63). If they are not equal, the delay controller 51A returns to step S64 and determines whether both power values $P_5$ and $P_6$ are greater than a predetermined threshold value $P_{th}$. If so, the delay controller 51A proceeds to step S65. At step S65, the difference $\Delta t$ between the measured times $t_5$ and $t_4$ is calculated and is set in the delay circuit 41A as delay time $\tau_2$ of the delay circuit 41A. If $t_5$ is equal to $t_6$ at step S63, the control process S60 will end without changing the setting of the delay circuit 41A. If $P_5$ and $P_6$ are less than or equal to the threshold value $P_{th}$ at step S64, the control process S60 will end without changing the currently set delay time $\tau_2$ regardless of whether or not $t_5$ and $t_6$ are equal, because the sub-cancellation signal has suppressed the main signal component to a desired degree.

Instead of performing step S65, the delay time $\tau_2$ set in the delay circuit 41A may be increased by a predetermined small amount of delay time $\Delta d$ at step S66, then the process may return to step S62, and steps S62, S63, S64 and S66 may be repeated until $t_5$ and $t_6$ are reduced to a value less than or equal to $P_{th}$. In that case, the time $t_4$ does not need to be measured at step S62. Steps S61 through S65 (or S66) constitute the sub-cancellation signal delay control process S60.

[Sub-Cancellation Signal Vector Control Process S70]

Figure 15B:
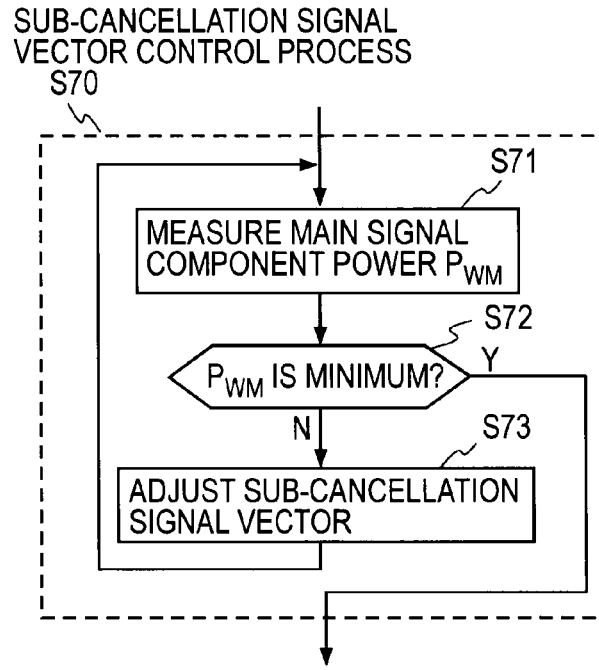
FIG. 15B is a flowchart illustrating a sub-cancellation signal vector control process.

FIG. 15B illustrates a control process performed by the sub-cancellation signal vector controller 52A. The sub-cancellation signal vector controller 52A observes the power $P_{WM}$ of a residual main signal component (synchronization pilot signal component) in an output from the combiner 38 (S71) and determines whether the main signal component power $P_{WM}$ is reduced to a minimum value (or a value less than or equal to a predetermined target value) (S72). If not, the sub-cancellation signal vector controller 52A adjusts vector coefficients of the sub-cancellation signal vector regulator 42A (S73), then returns to step S71, and repeats steps S71, S72 and S73 until the main signal component power $P_{WM}$ is reduced to the minimum value (or a value less than or equal to the target value), thereby determining sub-cancellation signal vector coefficients of the sub-cancellation signal vector regulator 42A that results in the minimum power $P_{WM}$ of the main signal component (or a value less than or equal to the target value).

Figure 16A:
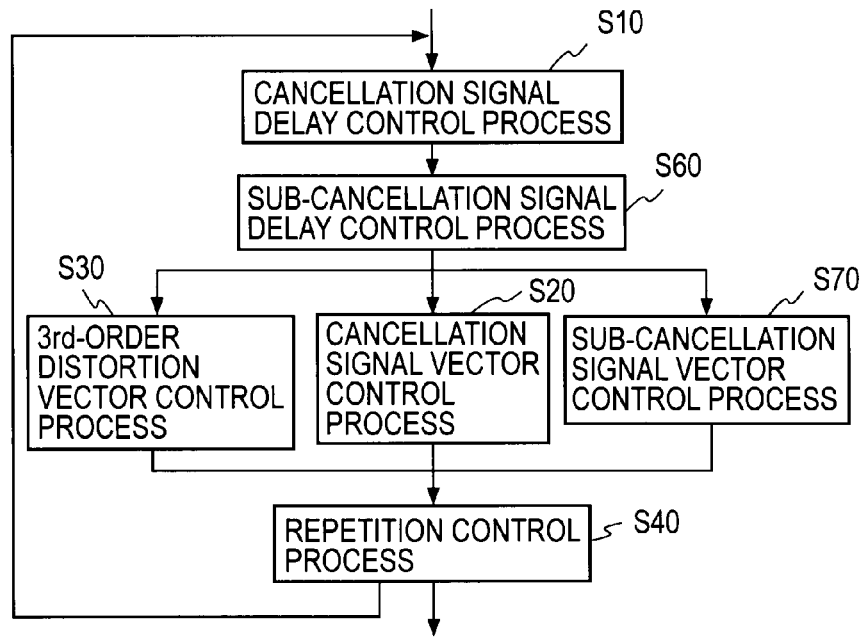
FIG. 16A is a diagram illustrating a control process flow in a variation of the exemplary embodiment in FIG. 15.

FIG. 16A illustrates an example of the general control process flow in the variation in FIG. 14.

Cancellation signal delay control process S10: The delay controller 51 performs the same control process as the control process S10 in FIG. 4 to determine and set delay time $\tau$ for the delay circuit 41.

Sub-cancellation signal delay control process S60: The delay controller 51A sets delay time $\tau_3$ for the delay circuit 41A by performing the control process described with respect to FIG. 15A. The delay controller 51A notifies the cancellation signal vector controller 42, the sub-cancellation signal vector controller 42A, and the third-order distortion vector controller 321 of the completion of the setting.

The following three control processes S20, S70 and S30 are performed independently of and in parallel with each other.

Cancellation signal vector control process S20: The cancellation signal vector controller 52 performs the same control process as the control process 20 in FIG. 4 to determine and set vector coefficients of the cancellation signal vector regulator 42.

Sub-cancellation signal vector control process S70: The sub-cancellation signal controller 52A performs the control process described with respect to FIG. 15B to set vector coefficients of the sub-cancellation signal vector regulator 42A.

Third-order distortion vector control process S30: The third-order distortion vector controller 321 performs the same control process as the control process S30 in FIG. 4 to set vector coefficients of the third-order distortion vector regulator 141.

Repetition control process S40: The delay controller 51 performs the same control process as the control process S40 in FIG. 4 to determine whether the entire control process is to be repeated or not.

While the control processes S20, S70 and S30 are performed independently of and in parallel with each other in the example in FIG. 16A, first the control processes S20 and S70 may be performed independently of and in parallel with each other and then the control process S30 may be performed.

Figure 16B:
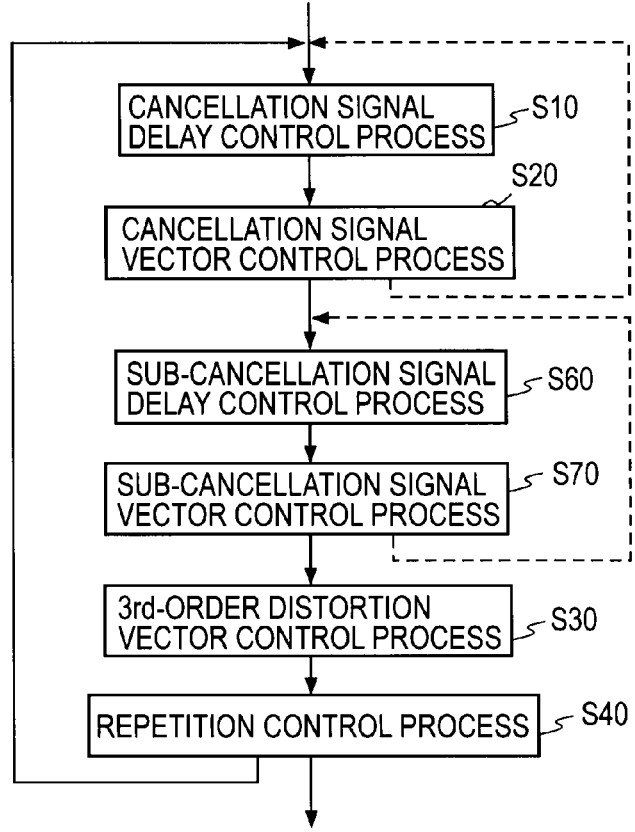
FIG. 16B is a diagram illustrating another exemplary control process flow.

FIG. 16B illustrates another exemplary control process flow in the variation in FIG. 14.

Cancellation signal delay control process S10: The delay controller 51 performs the same control process as the control process S10 in FIG. 4 to set delay time $\tau$ of the delay circuit 41.

Cancellation signal vector control process S20: The cancellation signal vector controller 52 performs the same control process as the control process S20 in FIG. 4 to set vector coefficients of the cancellation signal vector regulator 42.

Sub-cancellation signal delay control process S60: The delay controller 51A performs the control process described with respect to FIG. 15A to set delay time $\tau_2$ of the delay circuit 41A.

Sub-cancellation signal vector control process S70: The sub-cancellation signal vector controller 52A performs the control process described with respect to FIG. 15B to set vector coefficients of the sub-cancellation signal vector regulator 42A.

Third-order distortion vector control process S30: The third-order distortion vector controller 321 performs the same control process as the control process S30 in FIG. 4 to set vector coefficients of the third-order distortion vector regulator 141.

Repetition control process S40: The delay controller 51 performs the same control process as the control process S40 in FIG. 4 to determine whether or not the entire control process is to be performed.

As indicated by a dashed line in the control process flow in FIG. 16B, the control processes S10 and S20 may be repeated until a predetermined condition is satisfied. Also, the control processes S60 and S70 may be repeated until a predetermined condition is satisfied, as indicated by a dashed line. The predetermined condition may be that a predetermined number of repetitions has been reached or that main signal component power has been reduced to a value less than or equal to a predetermined value.

A pilot signal generator 18, switches 17 which select either the output of the pilot signal generator 18 or input terminals $7_I$ and $7_Q$, and an output switch 19 which turns on and off the output of the power amplifier 64 may be added to the configuration in FIG. 14 and a separate pilot signal may be used by the controllers to perform the control as in the variation in FIG. 6.

[Sixth Variation]

Figure 17:
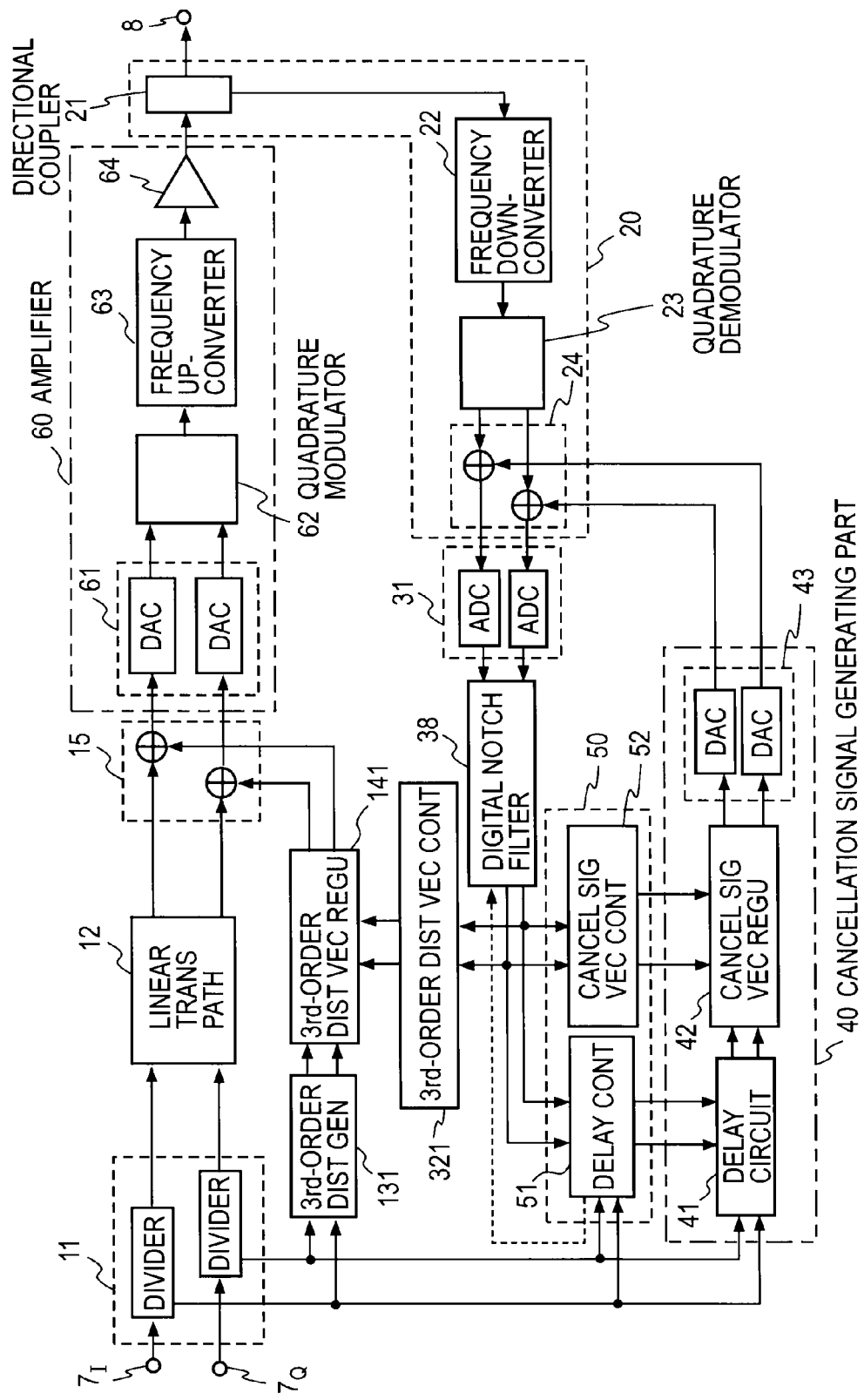
FIG. 17 is a block diagram illustrating a variation of the exemplary embodiment in FIG. 3 which includes a digital notch filter 38 added.

FIG. 17 illustrates a variation of the first exemplary embodiment illustrated in FIG. 3 in which a digital notch filter 38 which further suppresses a main signal component is added at the output side of the ADC 31. When the digital notch filter 38 is turned on, the digital notch filter 38 converts an input feedback signal to a frequency domain signal and suppresses and converts a signal component in a main signal band to a time domain signal. When the digital notch filter 38 is turned off, the digital notch filter 38 passes a signal without changing the signal.

Figure 18A:
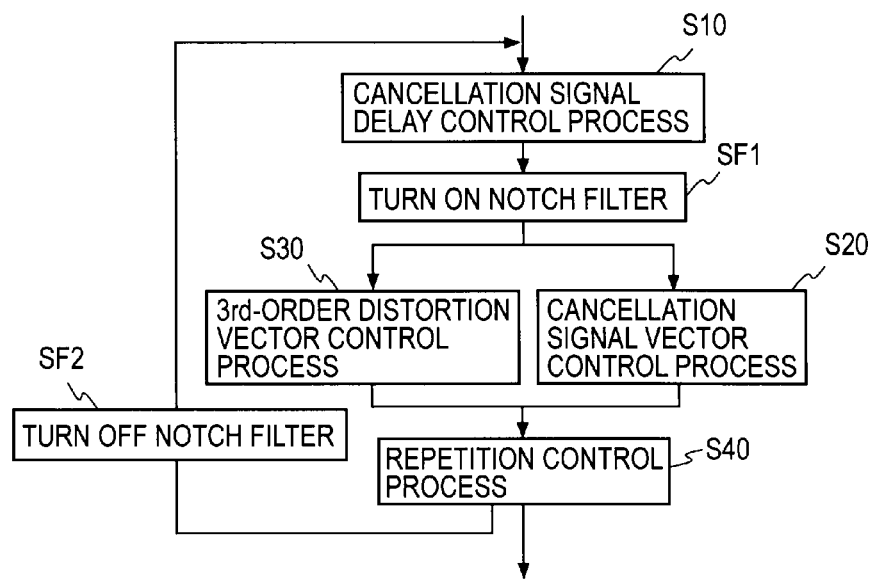
FIG. 18A is a diagram illustrating a control process flow in the variation in FIG. 17.

FIG. 18A illustrates an exemplary control process flow in the variation of the exemplary embodiment in FIG. 17.

Cancellation signal delay control process S10: The delay controller 51 performs the same process as the control process S10 in FIG. 4 to control delay time τ to be set in the delay circuit 41.

Notch filter control process SF1: The delay controller 51 turns on the digital notch filter 38 to suppress a residual main signal component. The delay controller 51 notifies the cancellation signal vector controller 52 and the third-order distortion vector controller 321 of the completion of the setting of the filter.

Cancellation signal vector control process S20: The cancellation signal vector controller 52 performs the same control process as the cancellation signal vector control process S20 in FIG. 4 to adjust vector coefficients of the cancellation signal vector regulator 42.

Third-order distortion vector control process S30: The third-order distortion vector controller 321 performs the same control process as the third-order distortion vector control process S30 in FIG. 4 to adjust vector coefficients of the third-order distortion vector regulator 141.

Repetition control process S40: The delay controller 51 performs the same control process as the repetition control process S40 in FIG. 4. If third-order distortion component power $P_{WD3}$ is greater than a predetermined value $P_{Dth3}$, the delay controller 51 proceeds to the control process SF2 and repeats entire control processes S10, SF1, S20, S30 and S40.

Notch filter control process SF2: When the entire control processes are to be repeated, the delay controller 51 turns off the digital notch filter 38 and returns to the control process S10.

Figure 18B:
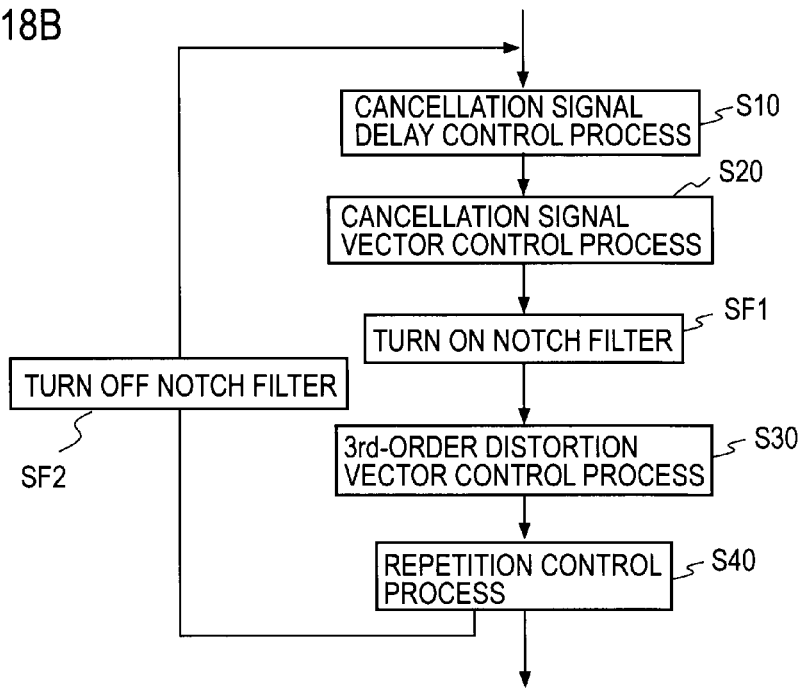
FIG. 18B is a diagram illustrating another exemplary control process flow.

FIG. 18B illustrates another example of the general control process flow in the variation of the exemplary embodiment in FIG. 17.

Cancellation signal delay control process S10: The process is the same as the control process S10 in FIG. 4. The delay controller 51 controls delay time τ to be set in the delay circuit 41.

Cancellation signal vector control process S20: The cancellation signal vector controller 52 performs the same control process as the cancellation signal vector control process S20 in FIG. 4 to adjust vector coefficients of the cancellation signal vector regulator 42.

Notch filter control process SF1: The delay controller 51 turns on the digital notch filter 38 to suppress a residual main signal component. The delay controller 51 notifies the third-order distortion vector controller 321 of the completion of setting of the filter.

Third-order distortion vector control process S30: The third-order distortion vector controller 321 performs the same control process as the third-order distortion vector control process S30 in FIG. 4 to adjust vector coefficients of the third-order distortion vector regulator 141.

Repetition control process S40: The delay controller 51 performs the same control process as the repetition control process S40 in FIG. 4. If third-order distortion component power $P_{WD3}$ is greater than a predetermined value $P_{Dth3}$, the delay controller 51 proceeds through the control process SF2 and repeats the entire control processes S10, S20, SF1, S30 and S40.

Notch filter control process SF2: When the entire control processes are to be repeated, the delay controller 51 turns off the digital notch filter and then returns to the control process S10.

While the feedback signal from the quadrature modulator 23 is combined with the cancellation signal from the digital-to-analog converter 43 at the combiner 24 to cancel the main signal component of the signal to be input in the analog-to-digital converter (ADC) 31 in the first exemplary embodiment described above, the cancellation signal may be combined with the feedback signal at another position in the feedback signal path. An exemplary embodiment will be described below.

[Second Exemplary Embodiment]

Figure 19:
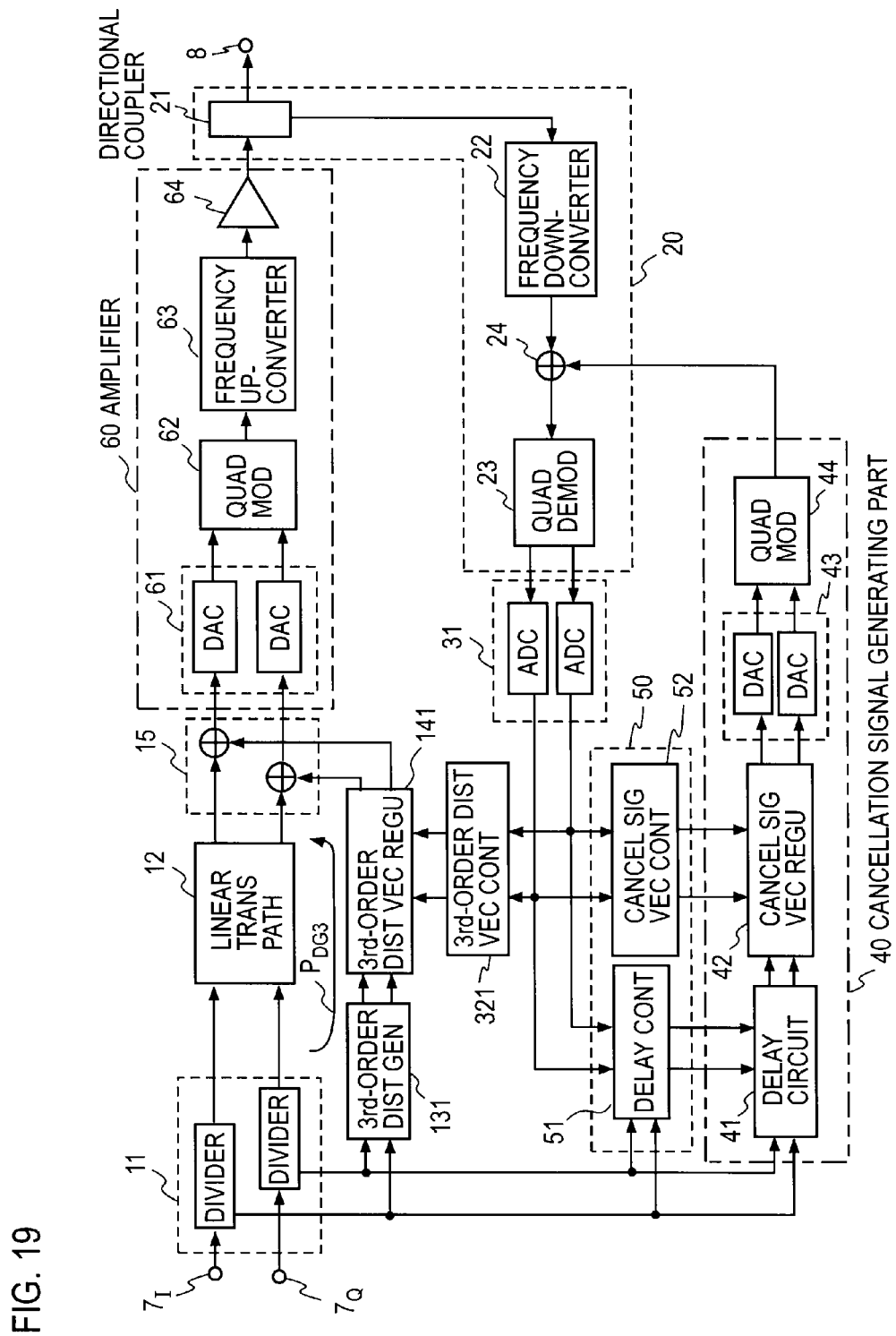
FIG. 19 is a block diagram illustrating a second exemplary embodiment of a digital predistorter according to the present invention.

FIG. 19 illustrates a second exemplary embodiment of the present invention. The configuration of the digital predistorter is the same as the configuration of the exemplary embodiment illustrated in FIG. 3, except that the combiner 24 is relocated to the input side of the quadrature demodulator 23 and a quadrature modulator 44 which quadrature-modulates analog I/Q outputs from the DAC 43 is provided in the cancellation signal generating part 40. An output from the quadrature modulator 44 is provided to the combiner 24 as a cancellation signal, where it is combined with an output from a frequency down-converter 22, and the combined output is provided to the quadrature demodulator 23.

Control processes by the delay controller 51, the cancellation signal vector controller 52, and the third-order distortion vector controller 321 are the same as those in the exemplary embodiment in FIG. 3 and therefore the description of the control processes will be omitted.

The second exemplary embodiment illustrated in FIG. 19 may include the fifth-order distortion generating path $P_{DG5}$ and the fifth-order distortion vector controller 322 depicted in FIG. 9. Operation of such configuration is the same as the operation of the configuration in FIG. 9.

The second exemplary embodiment illustrated in FIG. 19 may include the automatic gain control circuit (AGC) 35, the gain controller 36, and the DAC 37 depicted in FIG. 12. Operation of such configuration is the same as the operation of the configuration in FIG. 12.

The second exemplary embodiment illustrated in FIG. 19 may include the sub-cancellation signal generating part 40A and the combiner 38 depicted in FIG. 14. Operation of such configuration is the same as the operation of the configuration in FIG. 14.

The second exemplary embodiment illustrated in FIG. 19 may include the digital notch filter 38 depicted in FIG. 17. Operation of such configuration is the same as the configuration in FIG. 17.

As described above, in the second exemplary embodiment, the signal output from the frequency down-converter 22 is combined with the signal output from the quadrature converter 44 at a combiner 24 to suppress the main signal component of the feedback signal to be input in the quadrature demodulator 23.

[Third Exemplary Embodiment]

Figure 20:
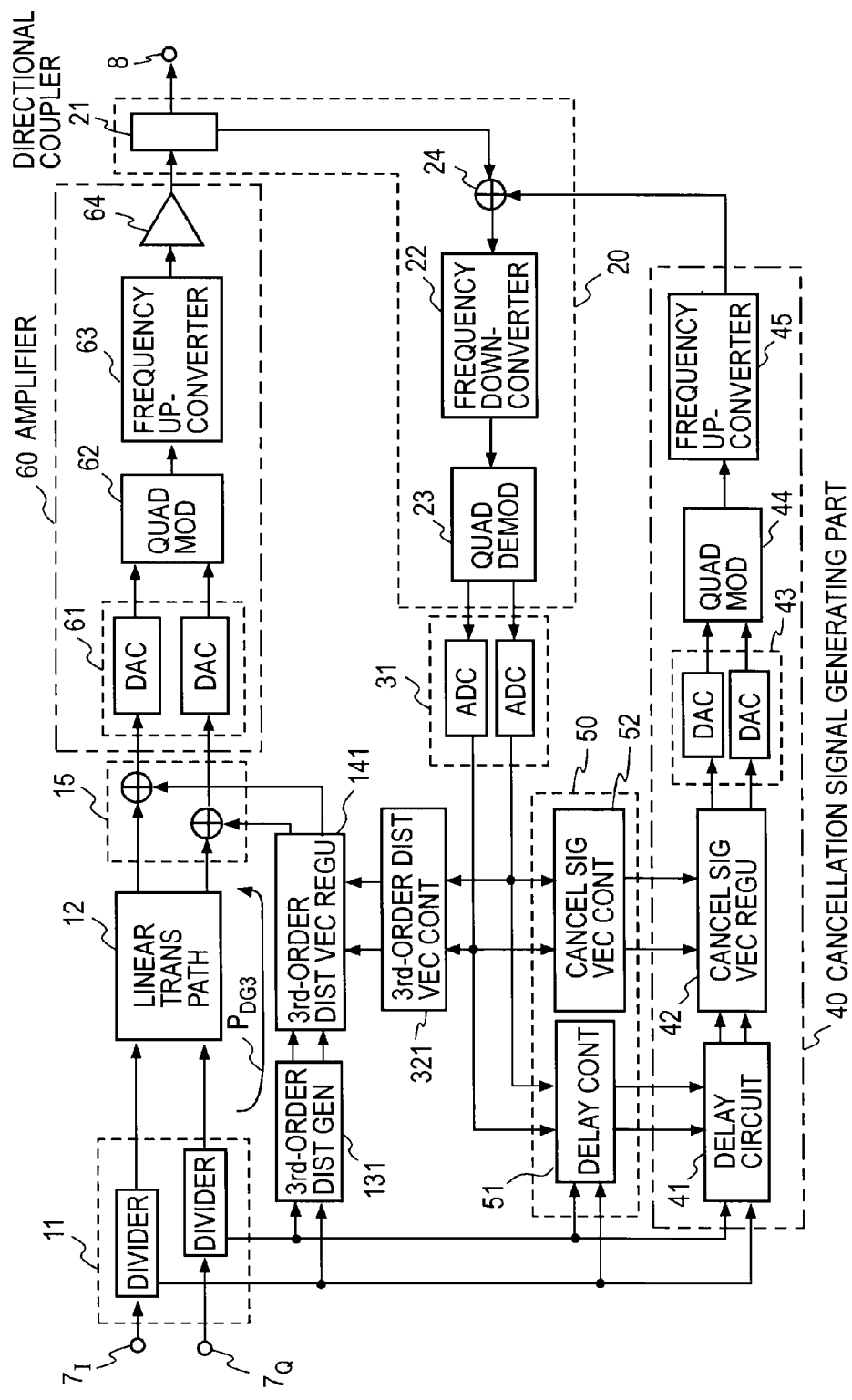
FIG. 20 is a block diagram illustrating a third exemplary embodiment of a digital predistorter according to the present invention.

FIG. 20 illustrates a third exemplary embodiment of the present invention. The configuration of the digital predistorter is the same as the configuration of the exemplary embodiment illustrated in FIG. 19, except that the combiner 24 is relocated to the input side of the frequency down-converter 22 and a frequency up-converter 45 which up-converts the frequency of an output from the quadrature modulator 44 is provided in the cancellation signal generating part 40. An output from the frequency up-converter 45 is provided to the combiner 24 as a cancellation signal for cancelling a high-frequency wave, where it is combined with an output from the directional coupler 21, and the combined output is provided to the frequency down-converter 22.

Control processes by the delay controller 51, the cancellation signal vector controller 52, and the third-order distortion vector controller 321 are the same as those in the exemplary embodiment in FIG. 3 and therefore the description of the control processes will be omitted.

The third exemplary embodiment illustrated in FIG. 20 may include the fifth-order distortion generating path $P_{DG5}$ and the fifth-order distortion vector controller 322 depicted in FIG. 9. Operation of such configuration is the same as the operation of the configuration in FIG. 9.

The third exemplary embodiment illustrated in FIG. 20 may include the automatic gain control circuit (AGC) 35, the gain controller 36 and the DAC 37 depicted in FIG. 12. Operation of such configuration is the same as the operation of the configuration illustrated in FIG. 12.

The third exemplary embodiment illustrated in FIG. 20 may include the sub-cancellation signal generating part 40A and the combiner 38 depicted in FIG. 14. Operation of such configuration is the same as the operation of the configuration in FIG. 14.

The third exemplary embodiment illustrated in FIG. 20 may include the digital notch filter 38 depicted in FIG. 17. Operation of such configuration is the same as the operation of the configuration in FIG. 17.

[Fourth Exemplary Embodiment]

Figure 21:
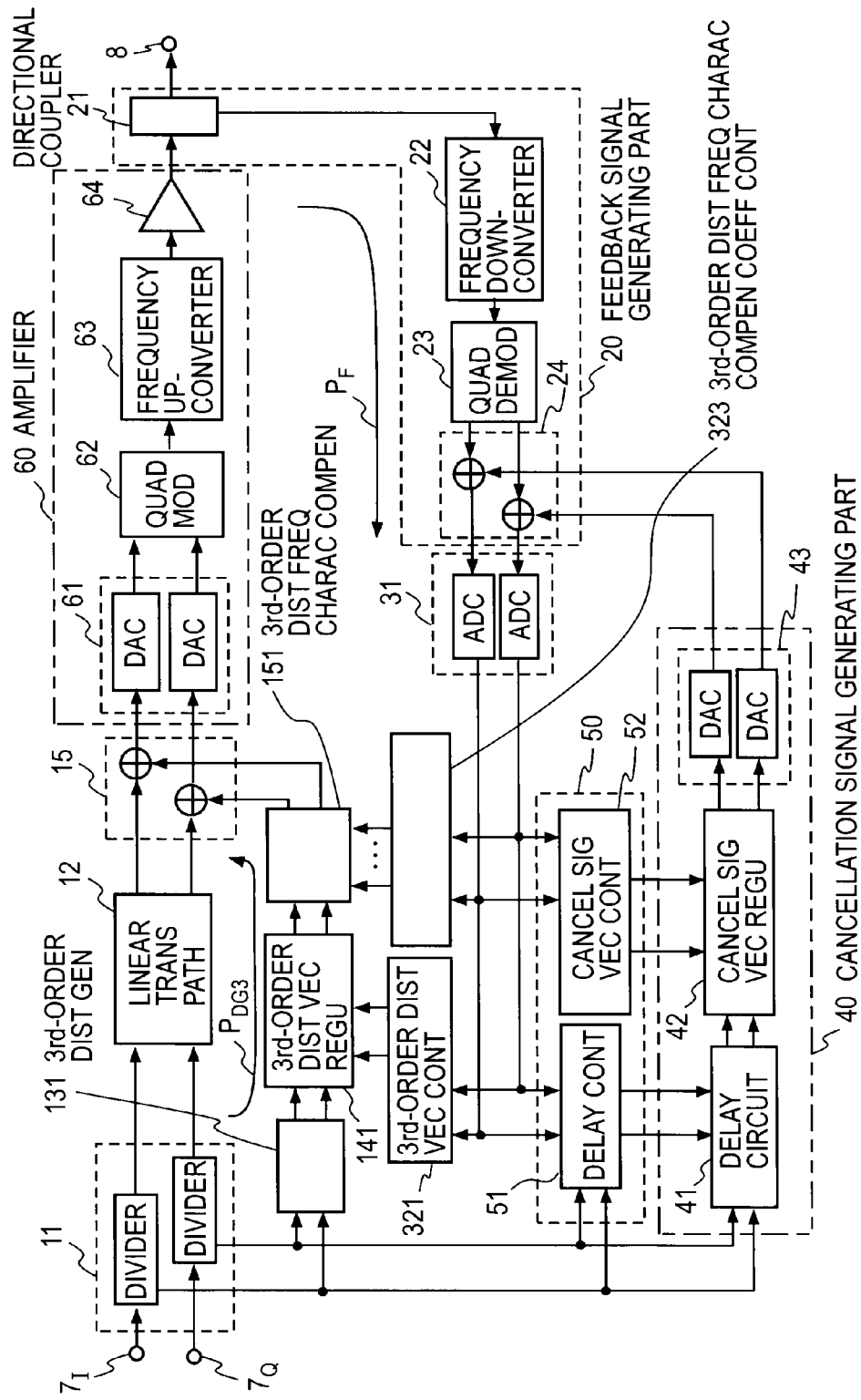
FIG. 21 is a block diagram illustrating a fourth exemplary embodiment of a digital predistorter according to the present invention.

FIG. 21 illustrates a fourth exemplary embodiment of the present invention. The fourth exemplary embodiment in FIG. 21 is a predistorter configured to be able to compensate for a frequency-dependent third-order distortion component. The configuration of the fourth exemplary embodiment is the same as the first exemplary embodiment illustrated in FIG. 3 except that a third-order distortion frequency characteristic compensator 151 is inserted at the stage subsequent to the third-order distortion vector regulator 141 in the third-order distortion generating path $P_{DG3}$, and a third-order distortion frequency characteristic compensation coefficient controller 323 which adjusts multiple third-order distortion frequency characteristic compensation coefficients (hereinafter sometimes simply called compensation coefficients) to be set in the third-order distortion frequency characteristic compensator 151 is added.

The third-order distortion frequency characteristic compensator 151 in the exemplary embodiment in FIG. 21 may be provided between the third-order distortion generator 131 and the third-order distortion vector regulator 141. While the combiner 24 is provided at the output side of the quadrature demodulator 23 in the exemplary embodiment, the combiner 24 may be provided at the input side of the quadrature demodulator 23 as in the configuration in FIG. 19 and a quadrature modulator 44 may be provided at the output side of the DAC 43 to provide an output from the quadrature modulator 44 to the combiner 24. Alternatively, the combiner 24 may be provided at the input side of the frequency down-converter 22, a quadrature modulator 44 may be provided at the output side of the DAC 43, and a frequency up-converter 45 may be provided at the output of the quadrature modulator 44 to provide an output from the frequency up-converter 45 to the combiner 24 as in FIG. 20.

Figure 22:
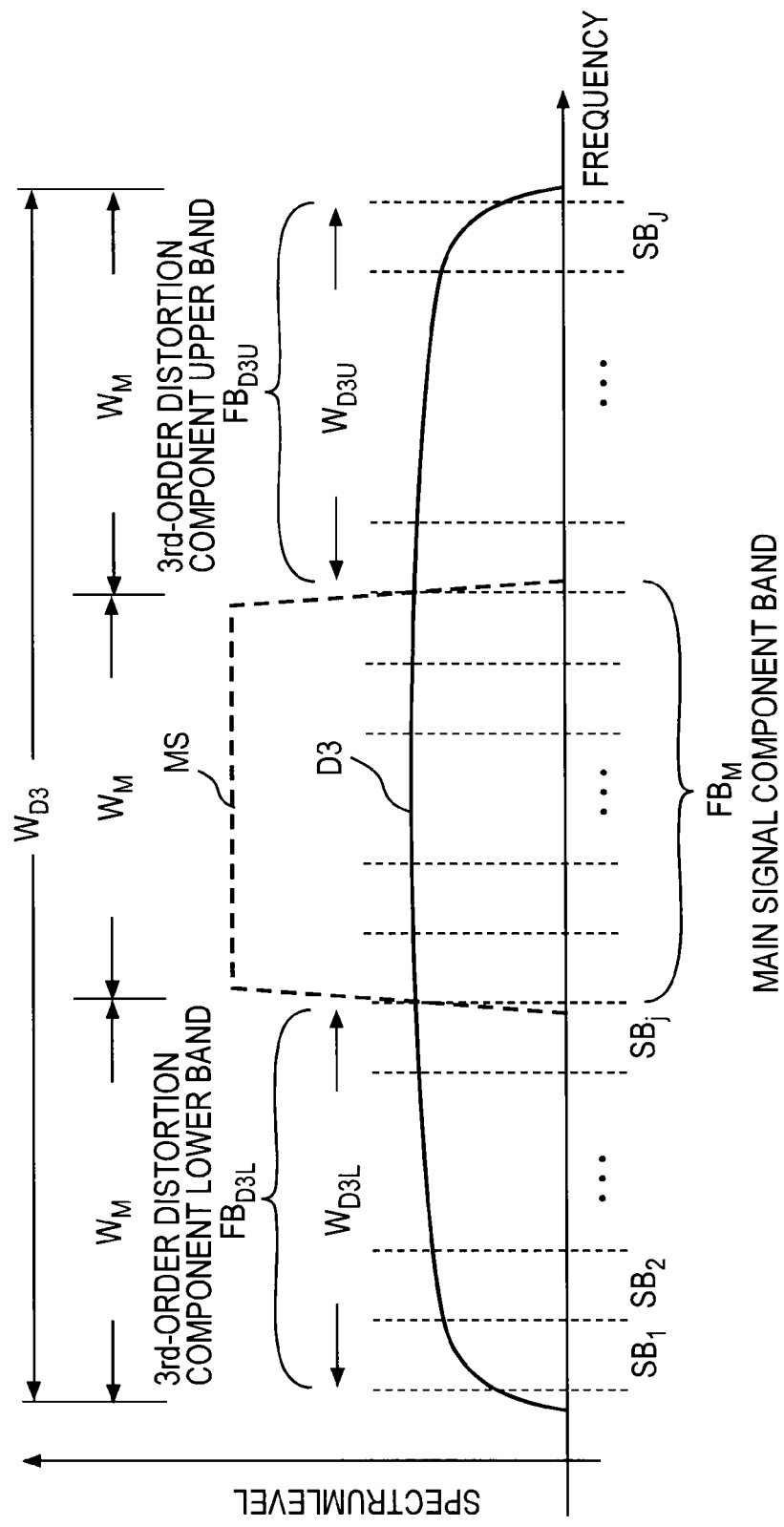
FIG. 22 is a diagram illustrating an example of third-order distortion component band division by a third-order distortion frequency characteristic compensator in the exemplary embodiment in FIG. 21.

FIG. 22 is a conceptual diagram of the relationship between the frequency band of a third-order distortion component D3 generated by the third-order distortion generator 131 and the frequency band of a main signal component MS, which is an input transmission signal. The bandwidth $W_{D3}$ of the entire third-order distortion component D3 is three times the band width $W_M$ of the main signal component MS indicated by the dashed line. The third-order distortion frequency characteristic compensator 151 adjusts the frequency characteristics of the third-order distortion component generated by the third-order distortion generator 131. The resulting third-order distortion component is combined by the combiner 15 with the input transmission signal from the linear transmission path. Thus, the third-order distortion component generated by the power amplifier 64 can be compensated for with a higher accuracy.

Figure 23A:
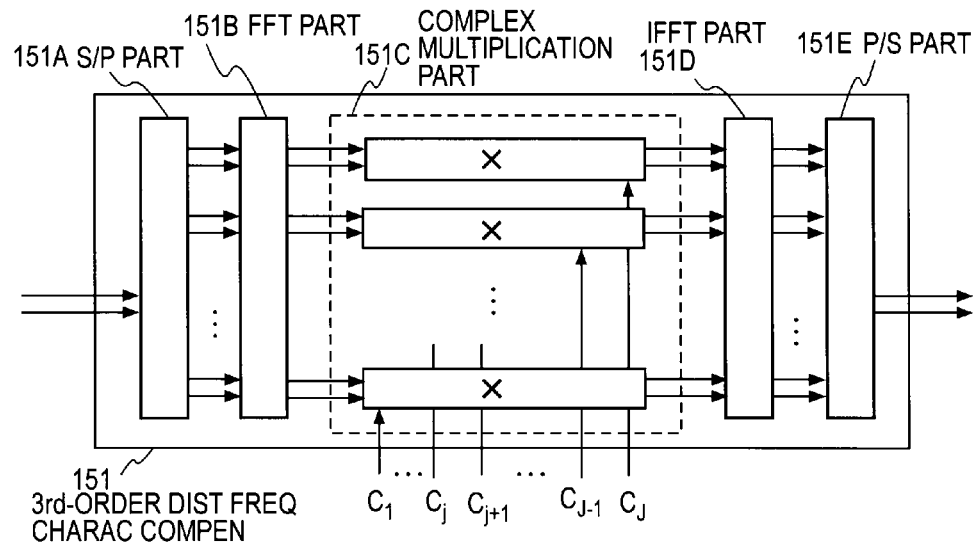
FIG. 23A is a block diagram illustrating an exemplary configuration of the third-order distortion frequency characteristic compensator in the exemplary embodiment in FIG. 21.

FIG. 23A illustrates a configuration of the third-order distortion frequency characteristic compensator 151. The third-order distortion frequency characteristic compensator 151 includes a serial-to-parallel conversion part (herein after referred to as the S/P part) 151A, a Fast Fourier Transformation (FFT) part 151B, a complex multiplication part 151C, an Inverse Fast Fourier Transformation (IFFT) part 151D, and a parallel-to-serial conversion part (hereinafter referred to as the P/S part) 151E.

The S/P part 151A converts a number of sample $SP_{DAC}$ output from the third-order distortion vector regulator 141 from serial to parallel at a time. The number of samples $SP_{DAC}$ converted at a time has been set according to the sampling rate of the DAC 61. The FFT part 151B transforms the output from the S/P part 151A from time domain to frequency domain by fast Fourier transformation of the $SP_{DAC}$ points. The complex multiplication part 151C divides the bandwidth of the third-order distortion component D3 provided by the FFT part 151B into J sub-bands $SB_1$ to $SB_J$ (where J is an integer greater than or equal to 2) as illustrated in FIG. 22 and multiplies sub-bands $SB_1$ to $SB_J$ by third-order distortion frequency characteristic compensation coefficients $C_1$ to $C_J$, respectively, provided from the third-order distortion frequency characteristic compensation coefficient controller 323. For example, if each sub-band SB; includes $Q_j$ outputs from the FFT part 151B (where $Q_j$ is an integer greater than or equal to 1), each of the $Q_j$ outputs from the FFT part 151B in each sub-band $SB_j$ is multiplied by the same compensation coefficient $C_J$. The IFFT part 151D transforms outputs from the complex multiplication part 151C from frequency domain to time domain by inverse fast fourier transformation of $SP_{DAC}$ points. The P/S part 151E converts outputs from the IFFT part 151D from parallel to serial and provides the results to the combiner 15 in FIG. 21 as the outputs of the third-order distortion generating path $P_{DG3}$. If there are outputs from the FFT part 151B with frequencies lower than the sub-band $SB_1$ and frequencies higher than the sub-band $SB_J$ in FIG. 22, those outputs from the FFT part 151B are directly provided to the IFFT part 151D.

Figure 23B:
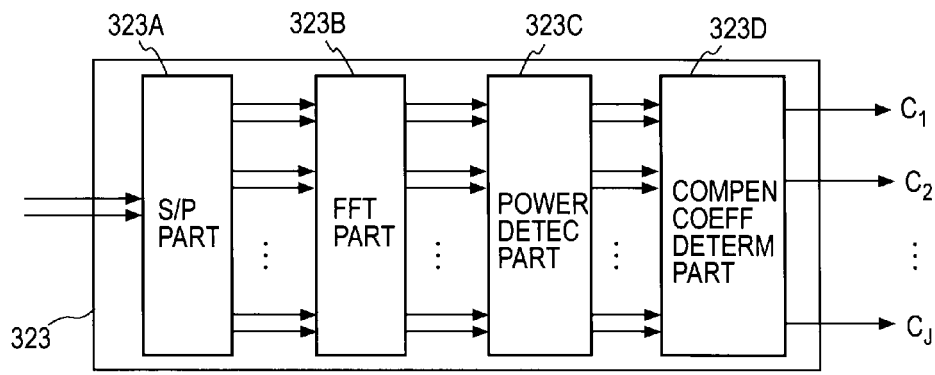
FIG. 23B is a block diagram illustrating an exemplary configuration of a third-order distortion frequency characteristic compensation coefficient controller.

The third-order distortion frequency characteristic compensation coefficient controller 323 includes a serial-to-parallel conversion part (S/P part) 323A, an FFT part 323B, a power detection part 323C, and a compensation coefficient determination part 323D as illustrated in FIG. 23B. The S/P part 323A converts a number of samples of digital feedback signal output from the ADC 31 from serial to parallel at a time. The number of samples $SP_{ADC}$ converted at a time has been set according to the sampling rate of the ADC 31. The FFT part 323B transforms outputs from the S/P part 323A from time domain to frequency domain by FFT of $SP_{ADC}$ points. The power detection part 323C detects power values $P_{WD3,1}$ to $P_{WD3,J}$ of the sub-bands corresponding to the sub-bands at the complex multiplication part 151C from outputs from the FFT part 323B. The compensation coefficient determination part 323D determines compensation coefficients $C_1$ to $C_J$ such that the power $P_{WD3,1}$ to $P_{WD3,J}$ of the sub-bands are reduced to a minimum value (or a value less than or equal to a preset target value). Outputs from the FFT part 151B that correspond to the sub-bands $SB_1$ to $SB_J$ are multiplied by the determined compensation coefficients $C_1$ to $C_J$ at the complex multiplication part 15C of the third-order distortion frequency characteristic compensator 151.

Figure 24:
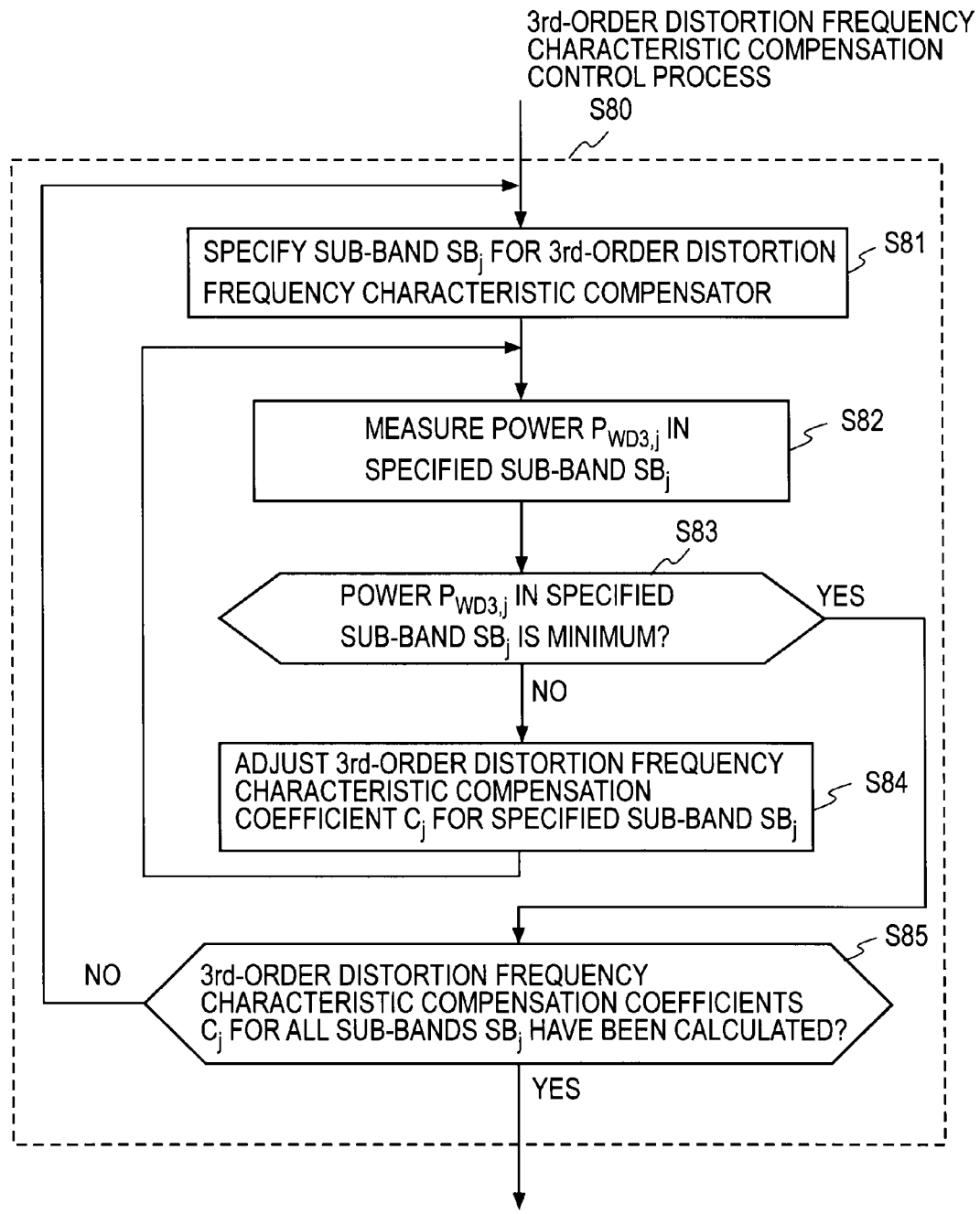
FIG. 24 is a flowchart illustrating a third-order distortion frequency characteristic compensation control process in the exemplary embodiment in FIG. 21.

FIG. 24 illustrates a third-order distortion frequency characteristic compensation control process S80 by the third-order distortion frequency characteristic compensation coefficient controller 323. It is assumed here that a third-order distortion frequency characteristic compensation coefficient $C_j$ for one sub-band $SB_j$ at a time and the order j=1, . . . , J in which the third-order distortion frequency characteristic compensation coefficients are adjusted has been determined beforehand.

A sub-band $SB_j$ for which the third-order distortion frequency characteristic compensation coefficient $C_j$ is to be adjusted is specified (S81). The following description is provided on the assumption that a sub-band $SB_j$ has been specified. The power $P_{WD3,j}$ in the sub-band $SB_j$ is measured (S82) and determination is made as to whether the measured power $P_{WD3,j}$ has been reduced to a minimum value (or a value less than or equal to a preset target value) (S83). If not, the third-order distortion frequency characteristic compensation coefficient $C_j$ for the sub-band $SB_j$ is adjusted (S84), then the process returns to step S82, and steps S82, S83, and S84 are repeated until the power $P_{WD3,j}$ is reduced to the minimum value (or a value less than or equal to the target value). When it is determined at step S83 that the power $P_{WD3,j}$ has been reduced to the minimum value (or a value less than or equal to the target value), determination is made as to whether the third-order distortion frequency characteristic compensation coefficients $C_j$ for all sub-bands $SB_j$ (where j=1, . . . , J) have been obtained (S85). If not, the process returns to step S81 and steps S81 through S85 are repeated until it is determined at step S85 that all compensation coefficients $C_1$ to $C_J$ have been obtained.

While the third-order distortion frequency characteristic compensation coefficients $C_j$ for reducing the power $P_{WD3,j}$ to the minimum value (or a value less than or equal to the target value) are calculated for the sub-bands $SB_j$ one by one in order in FIG. 24, the compensation coefficients $C_j$ for any number of sub-bands (for example all or two of the sub-bands) may be adjusted in parallel at a time. In that case, the third-order distortion frequency characteristic compensation coefficient controller 323 parallely measures the power values $P_{WD3,j}$ of the multiple sub-bands to be adjusted.

Figure 25A:
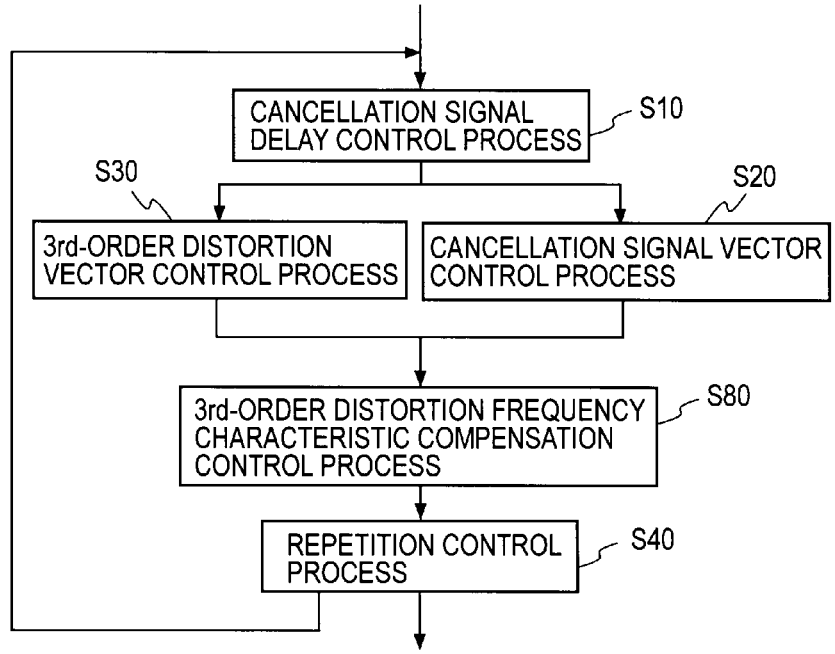
FIG. 25A is a diagram illustrating a general control process flow in the exemplary embodiment in FIG. 21.

FIG. 25A illustrates a control process flow in the fourth exemplary embodiment.

Cancellation signal delay control process S10: The process is the same as the cancellation signal delay control process S10 in FIG. 4. Specifically, the same control process as steps S11 to S15 (or S16) in FIG. 4 is performed. A synchronization pilot signal in the input transmission signal is used to measure transmission signal input time $t_1$, feedback signal output time $t_2$ and power $P_2$, cancellation signal output time $t_3$ and power $P_3$. Then, delay time τ is determined on the basis of the measurements and is set in the delay circuit 41. The delay controller 51 notifies the third-order distortion vector controller 321, the third-order distortion frequency characteristic compensation coefficient controller 323, and the cancellation signal vector controller 52 that the delay time τ of the delay circuit 41 has been determined.

Cancellation signal vector control process S20: The same process as the cancellation signal vector control process S20 in FIG. 4 is performed to adjust vector coefficients of the cancellation signal vector regulator 42.

Third-order distortion vector control process S30: The same control process as the third-order distortion vector control process S30 in FIG. 4 is performed to adjust vector coefficients of the third-order distortion vector regulator 141. Here, one of the power $P_{WD3U}$ of the band of the third-order distortion component D3 that lies above the main signal component band $FB_M$ (third-order distortion component upper band $FB_{D3U}$) and the power $P_{WD3L}$ of the band below the main signal component $FB_M$ (third-order distortion component lower band $FB_{D3L}$) depicted in FIG. 22 may be used instead of the third-order distortion component power $P_{WD3}$. The power $P_{WD3U}$ is calculated by the third-order distortion frequency characteristic compensation coefficient controller 323 from the sum of the power values in the sub-bands corresponding to the third-order distortion component upper band $FB_{D3U}$. Similarly, the power $P_{WD3L}$ is calculated from the sum of the power values in the sub-bands corresponding to the third-order distortion component lower band $FB_{D3L}$. Alternatively, the power $P_{WD3,j}$ in sub-bands measured by the third-order distortion frequency characteristic compensation coefficient controller 323 may be reported to the delay controller 51 and the delay controller 51 may obtain the power values $P_{WD3U}$ and $P_{WD3L}$ from the reported distortion component power. One of $P_{WD3U}$ and $P_{WD3L}$ may be observed in the control process S30 in any of the other embodiments that use the third-order distortion frequency characteristic compensator 151.

Third-order distortion frequency characteristic compensation control process S80: The same control process as the third-order distortion frequency characteristic compensation control process S80 in FIG. 24 is performed to adjust third-order distortion frequency characteristic compensation coefficients to be provided to the third-order distortion frequency characteristic compensator 151.

Repetition control process S40: The same control process as the repetition control process S40 in FIG. 4 is performed to repeat the entire control processes S10, S20, S30, S80 and S40 until the third-order distortion component power $P_{WD3}$ is reduced to a value less than or equal to a predetermined value $P_{Dth}$. Power $P_{WD3}$ may be detected by the delay controller 51 from an output from the ADC 31. Alternatively, power $P_{WD3,j}$ in each sub-band measured in the third-order distortion frequency characteristic compensation control process S80 may be reported to the delay controller 51 and the delay controller 51 may obtain the sum of the reported power values of distortion components in all sub-bands ($P_{WD3,1}$+ $P_{WD3,2}$+ . . . +$P_{WD3,J}$) as $P_{WD3}$. Here, the entire control processes S10, S20, S30, S80 and S40 may be repeated until the power $P_{WD3U}$ and $P_{WD3L}$ and the power $P_{WDM}$ in the main signal component band $FB_M$, rather than the third-order distortion component power $P_{WD3}$, are reduced to values less than or equal to their respective preset threshold values. The power $P_{WDM}$ is observed in the same way $P_{WD3U}$ or $P_{WD3L}$ is observed. The predetermined values for power $P_{WD3U}$, $P_{WD3L}$ and $P_{WDM}$ may or may not be the same. Likewise, in the control process S40 in any of the other embodiments that use the third-order distortion frequency characteristic compensator 151, the entire process may be repeated until power $P_{WD3U}$, $P_{WD3L}$ and $P_{WDM}$, rather than third-order distortion component power $P_{WD3}$, are reduced to values less than or equal to predetermined value or values.

The control processes S10 and S20 in the control process flow in FIG. 25A may be replaced with each other. In that case, the control processes S10 and S30 are performed independently of and in parallel with each other.

Figure 25B:
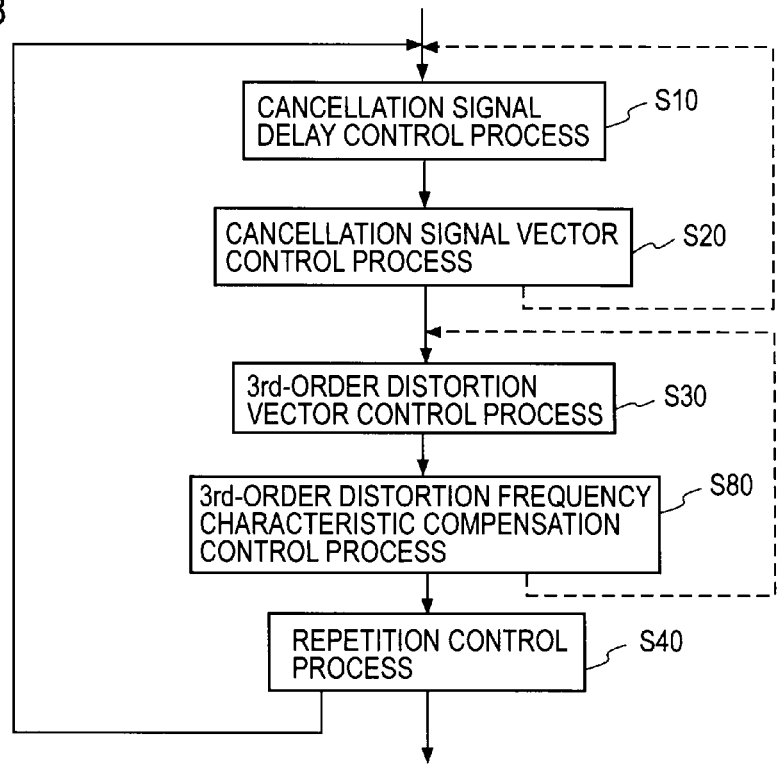
FIG. 25B is a diagram illustrating another exemplary general control process flow in the exemplary embodiment in FIG. 21.

The control processes S10, S20, S30, S80 and S40 may be performed in this order as illustrated in FIG. 25B. In the control process flow in FIG. 25B, the control processes S10 and S20 may be repeated until a predetermined condition is satisfied, as indicated by a dashed line. The predetermined condition may be that a predetermined number of repetitions is reached or that the main signal component power has been reduced to a value less than or equal to a predetermined value. The control processes S10 and S20 may be replaced with each other.

In both of the control process flows in FIGS. 25A and 25B, the main signal component in the feedback signal is suppressed by the cancellation signal vector control process S20 to enable third-order distortion components in all bands (including the main signal component band) to be detected with a high accuracy. Accordingly, the third-order distortion frequency characteristic compensation control with a higher accuracy can be achieved in the third-order distortion frequency characteristic compensation control process S80.

The control processes S30 and S80 may be repeated until a predetermined condition is satisfied, as indicated by a dashed line in FIG. 25B. The predetermined condition may be that a predetermined number of repetitions has been reached or that the third-order distortion component power $P_{WD3}$ has been reduced to a value less than or equal to a predetermined value, or that power values $P_{WD3U}$, $P_{WD3L}$ and $P_{WDM}$ have been reduced to values less than or equal to a predetermined value or values. In this case, the repetition control process S40 may be omitted.

While the frequency characteristic compensation applied to every sub-band over the entire band of the third-order distortion component D3 has been described with reference to FIG. 22, the compensation may be applied only to the third-order distortion component upper band $FB_{D3U}$ and the third-order distortion component lower band $FB_{D3L}$ depicted in FIG. 22 in order to reduce the amount of computation. In that case, the compensation coefficient determination part 323D of the third-order distortion frequency characteristic compensation coefficient controller 323 depicted in FIG. 23B determines compensation coefficients $C_j$ such that power $P_{WD3,j}$ is reduced to a minimum value (or a value less than or equal to a preset target value) for the sub-bands in the third-order distortion component upper band $FB_{D3U}$ and lower band $FB_{D3L}$ whereas, for all the sub-bands of the main signal component band $FB_M$, the compensation coefficient determination part 323D sets the compensation coefficients to a fixed value, for example, 1. Accordingly, the complex multiplication part 151C of the third-order distortion frequency characteristic compensator 151 depicted in FIG. 23A multiplies an output from the FFT 151B that corresponds to each sub-band $SB_j$ of the third-order distortion component upper band $FB_{D3U}$ and the third-order distortion component lower band $FB_{D3L}$ by a compensation coefficient $C_j$ and multiples an output from the FFT part 151B that corresponds to the main signal component band $FB_M$ by the compensation coefficient of 1 (that is, the output is unchanged). Only the third-order distortion component upper band $FB_{D3U}$ and third-order distortion component lower band $FB_{D3L}$ of the third-order distortion component D3 to which frequency characteristic compensation is to be applied are divided into sub-bands. The number of the sub-bands of both upper and lower bands is greater than or equal to 1.

Figure 23C:
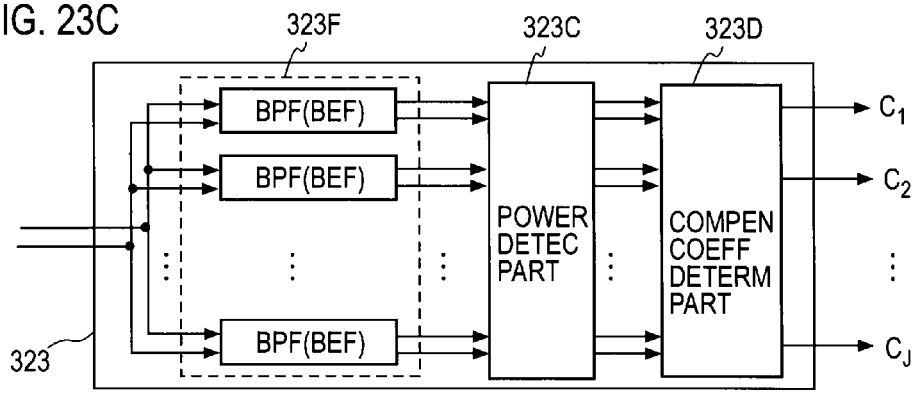
FIG. 23C is a block diagram illustrating another exemplary configuration of the third-order distortion frequency characteristic compensation coefficient controller.

The S/P part 323A and the FFT part 323B of the third-order distortion frequency characteristic compensation coefficient controller 323 depicted in FIG. 23B may be made up of J band-pass filters (BPFs), each passing a particular sub-band $SB_j$ or J band-elimination filters (BEFs), each preventing sub-bands other than a particular sub-band $SB_j$ from passing, as depicted in FIG. 23C.

[First Variation of Fourth Exemplary Embodiment]

A pilot signal generator 18, input switches 17, and an output switch 19 similar to those illustrated in FIG. 6 may be added to the configuration of the fourth exemplary embodiment illustrated in FIG. 21 to perform the control processes by the controllers by using a separate pilot signal. However, the separate pilot signal used to adjust the third-order distortion frequency characteristic compensation coefficients is a signal such as a WCDMA signal that is actually transmitted, rather than a pulse wave.

The pilot signal generator 18, input switches 17, and output switch 19 may be added to the configuration of any of the following variations as well.

[Second Variation of Fourth Exemplary Embodiment]

Figure 26:
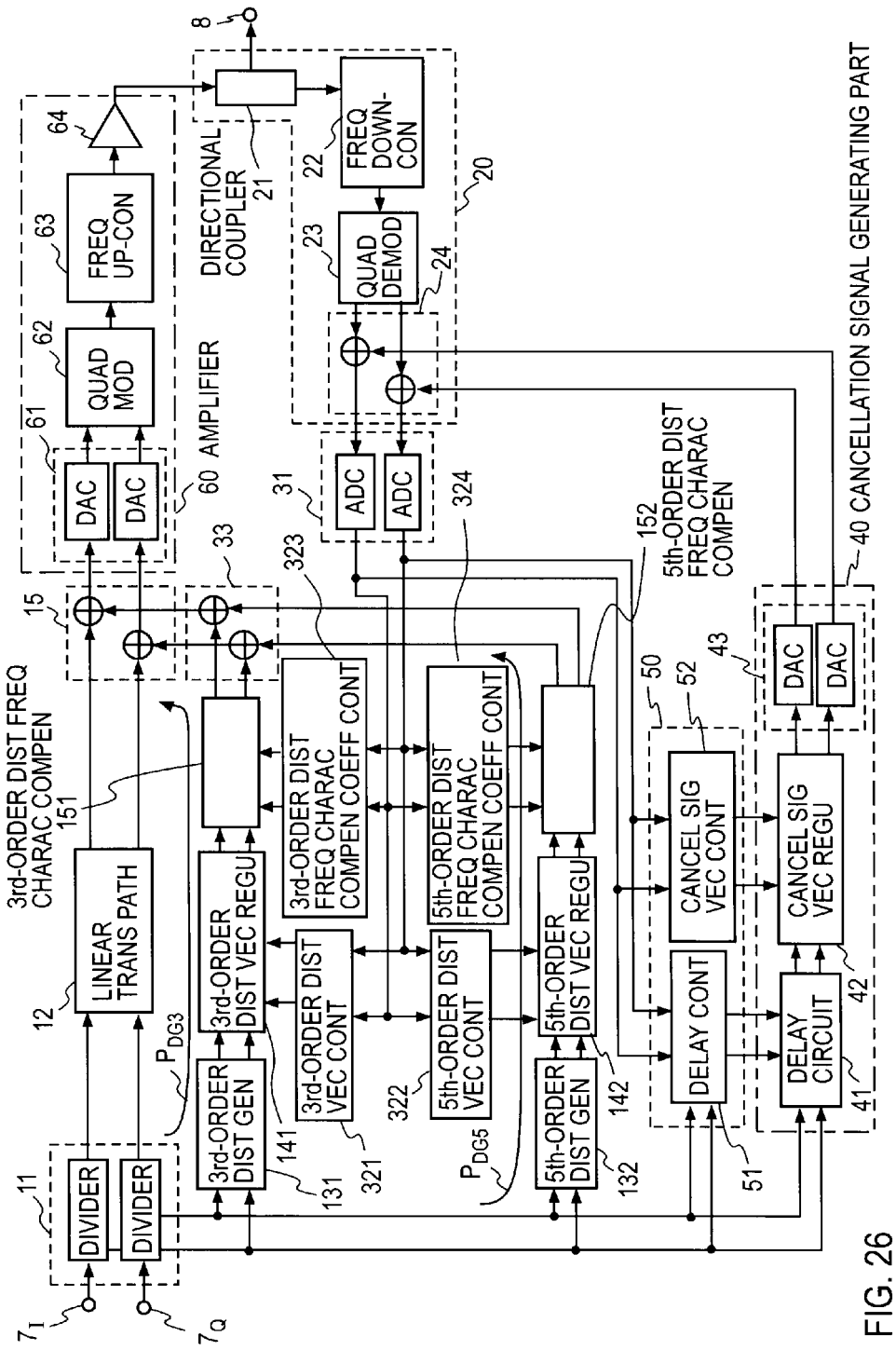
FIG. 26 is a block diagram illustrating a variation of the exemplary embodiment in FIG. 21 which includes components added for fifth-order distortion component compensation.

The configuration in FIG. 26 is the same as the fourth exemplary embodiment in FIG. 21 except that a fifth-order distortion generating path $P_{DG5}$ including a fifth-order distortion generator 132 and a fifth-order distortion vector regulator 142 and a fifth-order distortion vector controller 322 are added for compensating for fifth-order distortion components, like the configuration in FIG. 9, and in addition, a fifth-order distortion frequency characteristic compensator 152 is added at the stage subsequent to the fifth-order distortion vector regulator 142 in the fifth-order distortion generating path $P_{DG5}$ and a fifth-order distortion frequency characteristic compensation coefficient controller 324 which adjusts multiple fifth-order distortion frequency characteristic compensation coefficients to be provided to the fifth-order distortion frequency characteristic compensator 152 is added. The following description will focus on the added components and operations.

Figure 27:
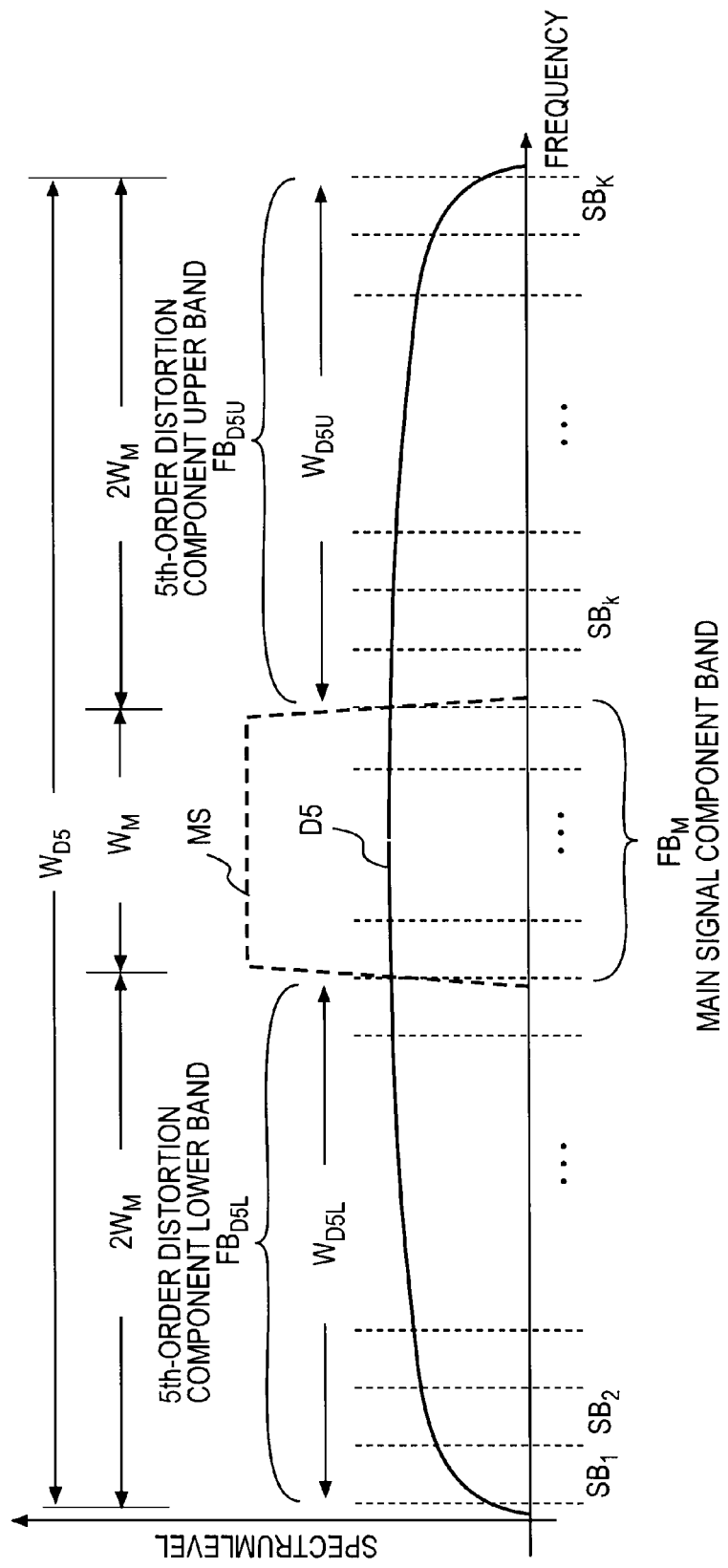
FIG. 27 is a diagram illustrating band division of a fifth-order distortion component in the variation in FIG. 26.

FIG. 27 is a conceptual diagram of the relationship between the frequency band of a fifth-order distortion component D5 generated by the fifth-order distortion generator 132 and the frequency band of a main signal component MS which is an input transmission signal. The bandwidth $W_{D5}$ of the entire fifth-order distortion component D5 is five times the bandwidth $W_M$ of the main signal component MS indicated by a dashed line. The fifth-order distortion frequency characteristic compensator 152 has the same configuration as the third-order distortion frequency characteristic compensator 151 depicted in FIG. 23A and divides the entire bandwidth of the fifth-order distortion component D5 into K sub-bands $SB_k$ (where K is an integer greater than or equal to 2 and k= 1, . . . , K) as illustrated in FIG. 27. The fifth-order distortion frequency characteristic compensation coefficient controller 324 has the same configuration as the third-order distortion frequency characteristic compensation coefficient controller 323 in FIG. 28B or 28C.

Figure 28:
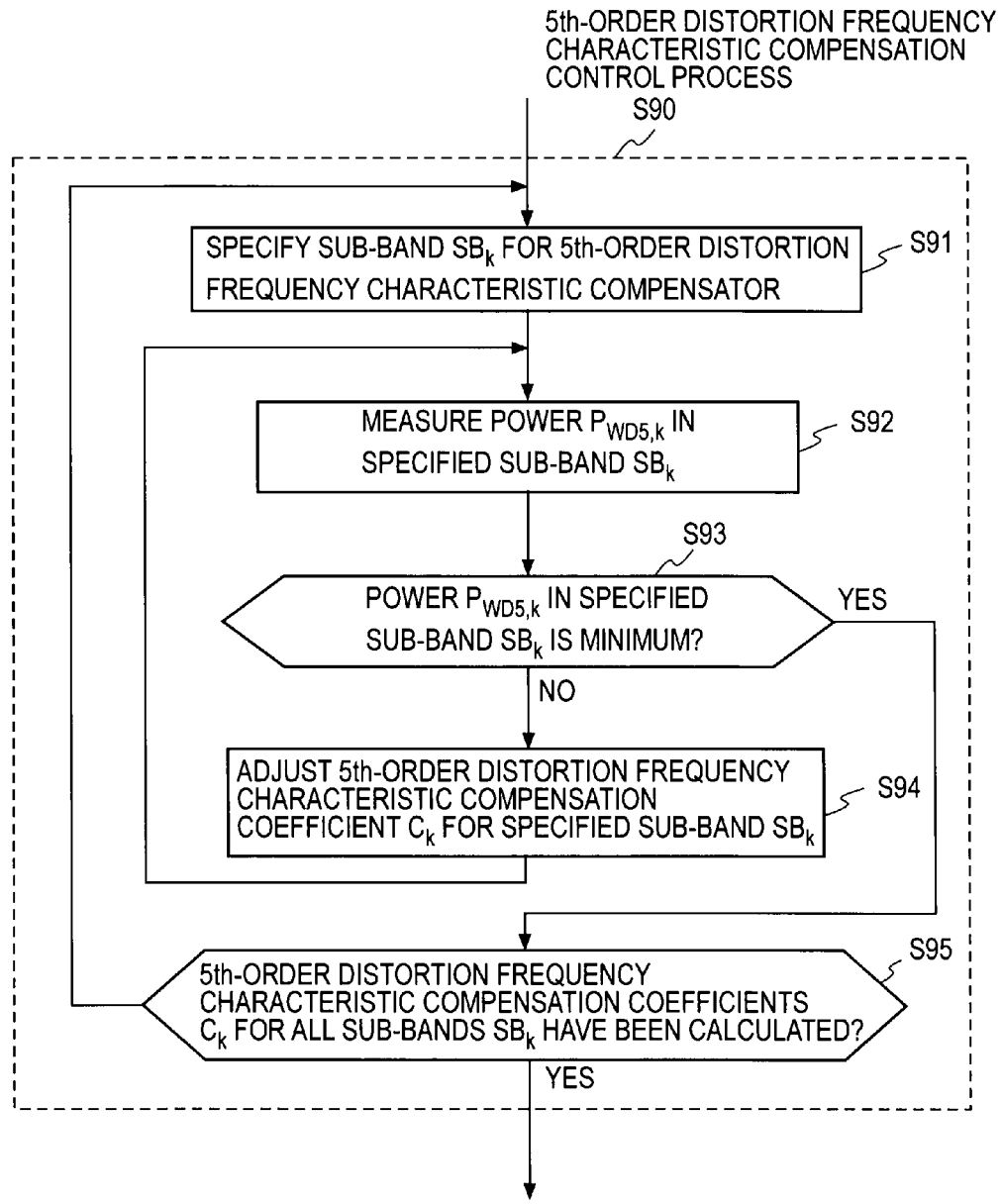
FIG. 28 is a flowchart illustrating a fifth-order distortion frequency characteristic compensation control process in the variation in FIG. 26.

As illustrated in FIG. 28, a fifth-order distortion frequency characteristic compensation control process S90 performed by the fifth-order distortion frequency characteristic compensation controller 324 is the same as the third-order distortion frequency characteristic compensation control process S80 illustrated in FIG. 24 and therefore the description of the process S90 will be omitted.

Figure 29A:
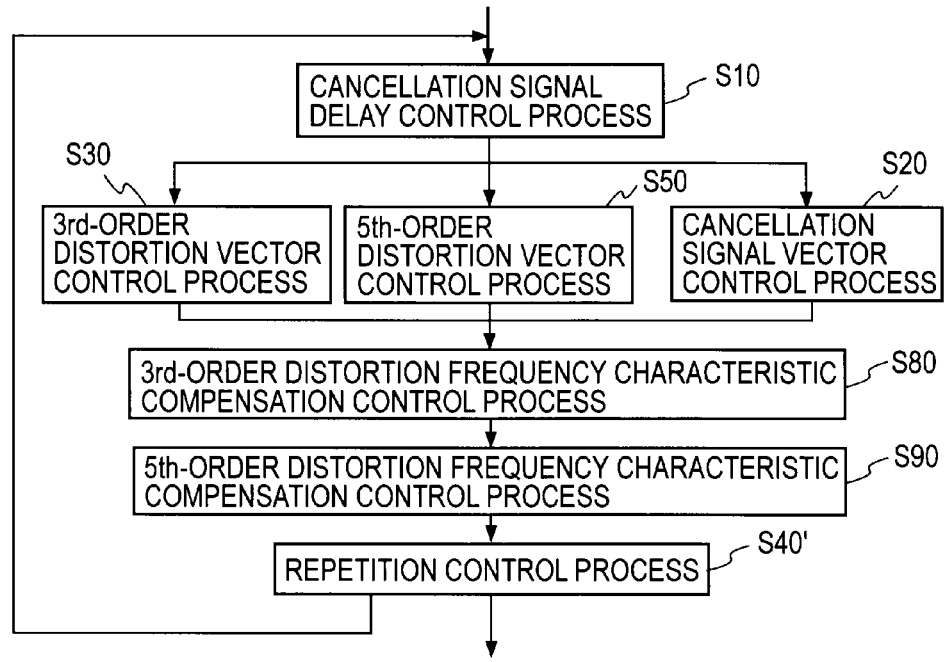
FIG. 29A is a diagram illustration a general control process flow according to the variation in FIG. 26.
Figure 29B:
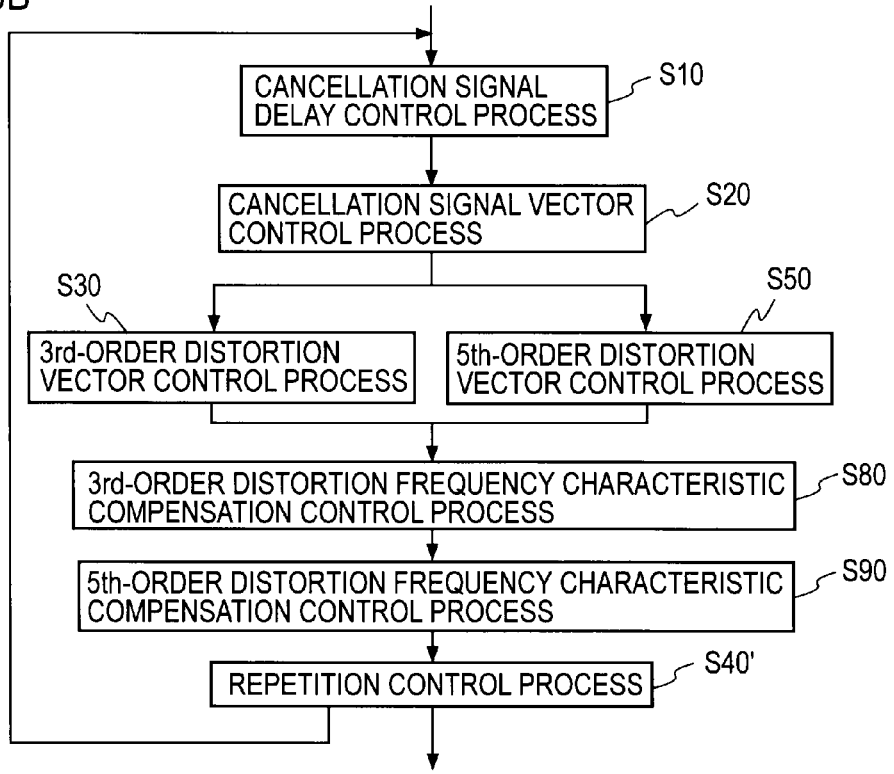
FIG. 29B is a diagram illustrating another exemplary general control process flow.

As illustrated in FIG. 29A, in the general control process flow in the configuration including the fifth-order distortion frequency characteristic compensator 152 and the fifth-order distortion frequency characteristic compensation coefficient controller 324, the same control processes S30, S50 and S20 that are depicted in FIG. 10B are performed in parallel and then the third-order distortion frequency characteristic compensation control process S80 and the fifth-order distortion frequency characteristic compensation control process S90 are performed in sequence. Alternatively, after the control processes S30 and S50 in the control process flow illustrated in FIG. 11A have been completed, the control process S80 and the fifth-order distortion frequency characteristic compensation control process S90 are performed in sequence as illustrated in FIG. 29B.

In the control process S50, one of the power $P_{WD5U}$ of the band of the fifth-order distortion component D5 that lies above the main signal component band $FB_M$ (fifth-order distortion component upper band $FB_{D5U}$) and the power $P_{WD5L}$ of the band below the main signal component $FB_M$ (fifth-order distortion component lower band $FB_{D5L}$) depicted in FIG. 27 may be used instead of the fifth-order distortion component power $P_{WD5}$. The power $P_{WD5U}$ is calculated by the fifth-order distortion frequency characteristic compensation coefficient controller 324 from the sum of the power values in the sub-bands corresponding to the fifth-order distortion component upper band $FB_{D5U}$. Similarly, the power $P_{WD5L}$ is calculated from the sum of the power values in the sub-bands corresponding to the fifth-order distortion component lower band $FB_{D5L}$. Alternatively, the power $P_{WD5,j}$ in sub-bands measured by the fifth-order distortion frequency characteristic compensation coefficient controller 324 may be reported to the delay controller 51 and the delay controller 51 may obtain the power values $P_{WD5U}$ and $P_{WD5L}$ from the reported distortion component power. One of $P_{WD5U}$ and $P_{WD5L}$ may be observed in the control process S50 in any of the other embodiments that use the fifth-order distortion frequency characteristic compensator 152.

In the control process S40', the entire control processes S10, S20, S30, S50, S80, S90 and S40' may be repeated until power values $P_{WD5U}$, $P_{WD5L}$ and $P_{WDM}$, instead of distortion component power $P_{WD}$, are reduced to values less than or equal to their respective preset predetermined values. The preset values for power $P_{WD5U}$, $P_{WD5U}$ and $P_{WDM}$ may or may not be the same. This applies to any of other embodiments that use the fifth-order distortion frequency characteristic compensator 152. Power $P_{WD3U}$ and $P_{WD3L}$ may also be observed and the entire control processes S10, S20, S30, S50, S80, S90 and S40' may be repeated until power $P_{WD3U}$, $P_{WD3L}$, $P_{WD5U}$, $P_{WD5L}$, and $P_{WDM}$ are reduced to a value less than or equal to their respective preset predetermined values.

Any of the following control process flows, which correspond to the control process flow illustrated in FIG. 11B, may be applied to the second variation.

[Control Process Flow B'-1]

Figure 30:
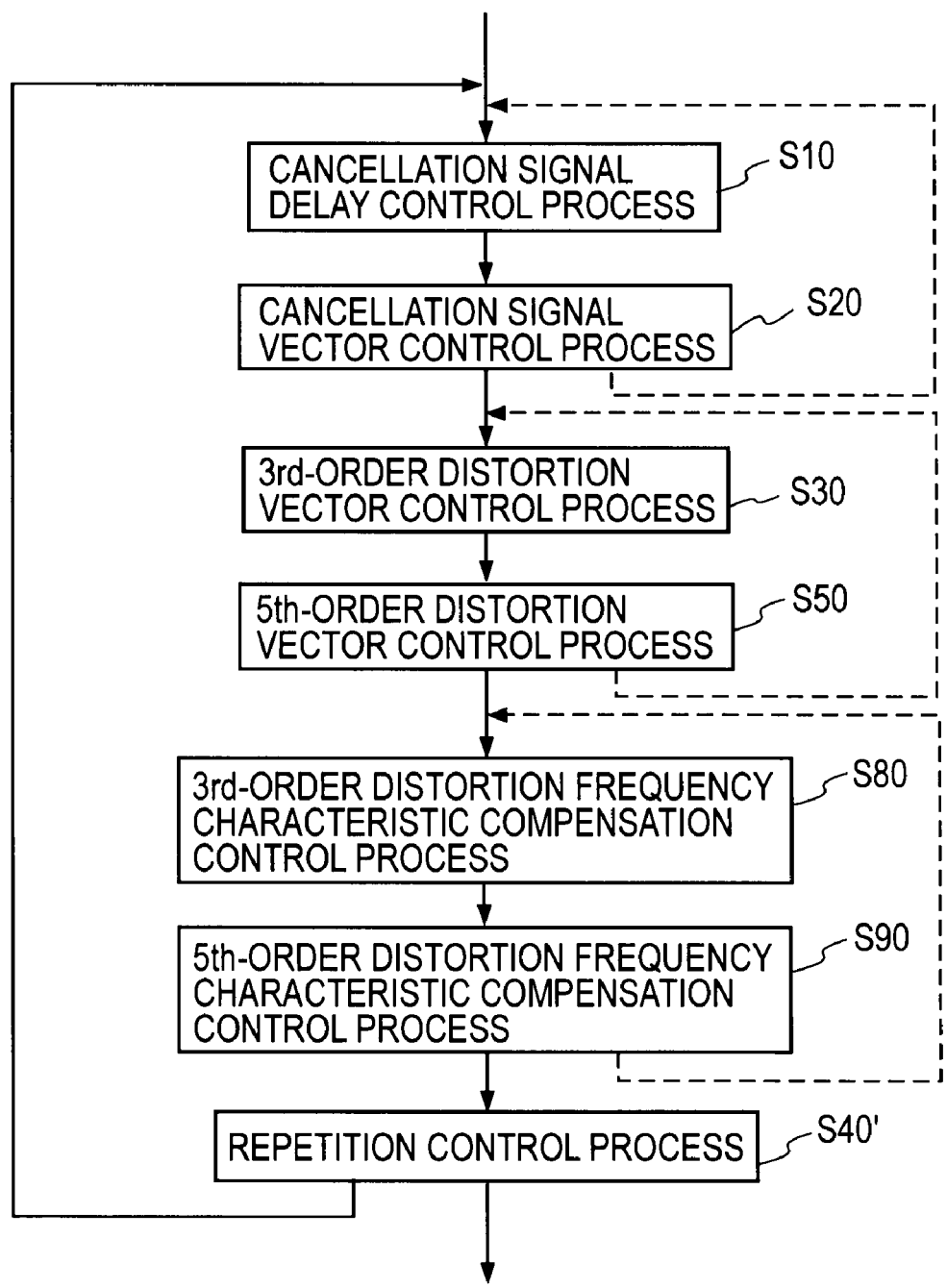
FIG. 30 is a diagram illustrating another exemplary general control process flow according to the variation in FIG. 26.

As illustrated in FIG. 30, after the completion of the control process S50 in FIG. 11B, the third-order distortion frequency characteristic compensation control process S80 and the fifth-order distortion frequency characteristic compensation control process S90 are performed in sequence. As indicated by a dashed line, the control processes S80 and S90 may be repeated until a predetermined condition is satisfied. The predetermined condition may be that a predetermined number of repetitions has been reached, or that distortion component power $P_{WD}$ has been reduced to a value less than or equal to a predetermined value, or that power values $P_{WD5U}$ and $P_{WD5L}$ and $P_{WDM}$ have been reduced to values less than or equal to their respective predetermined values, or that power values $P_{WD3U}$, $P_{WD3L}$, $P_{WD5U}$, $P_{WD5L}$ and $P_{WDM}$ have been reduced to values less than or equal to their respective predetermined values. In this case, step S40' may be omitted.

[Control Process Flow B'-2]

Figure 31:
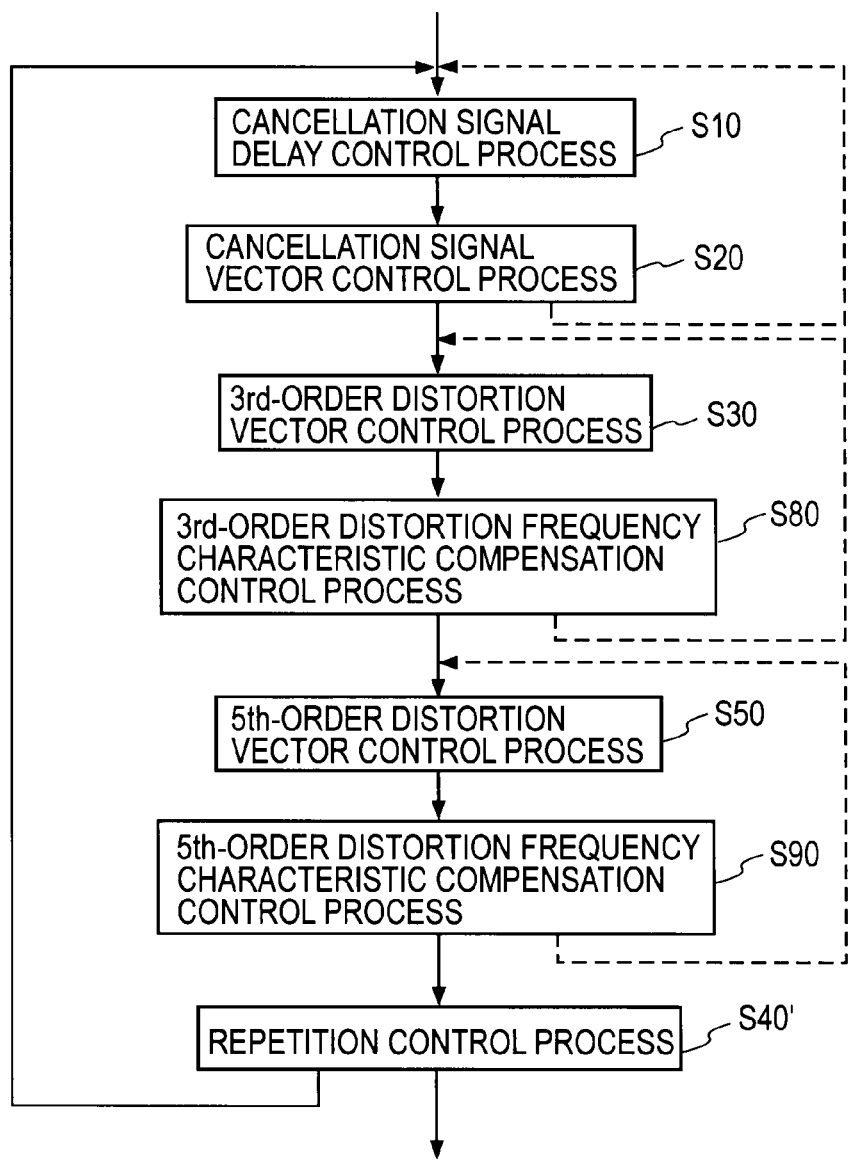
FIG. 31 is a diagram illustrating yet another exemplary general control process flow according to the variation in FIG. 26.

As illustrated in FIG. 31, after the completion of the control process S30 in FIG. 11B, the third-order distortion frequency characteristic compensation control process S80 is performed. Then the control process S50 and the fifth-order distortion frequency characteristic compensation control process S90 are performed in sequence. As indicated by a dashed line, the control processes S30 and S80 may be repeated until a predetermined condition is satisfied. The predetermined condition may be that a predetermined number of repetitions has been reached or that third-order distortion component power $P_{WD3}$ has been reduced to a value less than or equal to a predetermined value. Furthermore, as indicated by a dashed line, the control processes S50 and S90 may be repeated until a predetermined condition is satisfied. The predetermined condition may be that a predetermined number of repetitions has been reached, or that distortion component power $P_{WD}$ has been reduced to a value less than or equal to a predetermined vale, or power values $P_{WD5U}$, $P_{WD5L}$ and $P_{WDM}$ have been reduced to values less than or equal to their respective predetermined values. In this case, step S40' may be omitted.

While the configuration in FIG. 26 has been described with respect to examples in which compensation is applied to every sub-band over the entire band of a fifth-order distortion component D5 with reference to FIG. 27, the frequency characteristic compensation may be applied only to $FB_{D5U}$ and $FB_{D5L}$ depicted in FIG. 27 in order to reduce the amount of computation. The bandwidth of each of the fifth-order distortion component upper band $FB_{D5U}$ and lower band $FB_{D5L}$ is twice the bandwidth $W_M$ of the main signal component. In the fifth-order distortion frequency characteristic compensation coefficient controller 324 in FIG. 26 determines compensation coefficients $C_k$ such that power $P_{WD5,j}$ is reduced to a minimum value (or a value less than or equal to a preset target value) for the sub-bands in the fifth-order distortion component upper band $FB_{D5U}$ and lower band $FB_{D5L}$ whereas, for all the sub-bands of the main signal component band $FB_M$, the fifth-order distortion frequency characteristic compensation coefficient controller 324 sets the compensation coefficients to a fixed value, 1. Accordingly, in the fifth-order distortion frequency characteristic compensator 152 in FIG. 26, an output from the FFT part that corresponds to each sub-band $SB_k$ of the fifth-order distortion component upper band $FB_{D5U}$ and the fifth-order distortion component lower band $FB_{D5L}$ is multiplied by the compensation coefficient $C_k$ whereas an output from the FFT part that corresponds to the main signal component band $FB_M$ is multiplied by the compensation coefficient of 1 (that is, the output is unchanged). Only the fifth-order distortion component upper band $FB_{D5U}$ and fifth-order distortion component lower band $FB_{D5L}$ of the fifth-order distortion component D5 to which frequency characteristic compensation is to be applied are divided into sub-bands. The number of the sub-bands of both upper and lower bands is greater than or equal to 1.

[Third Variation of Fourth Exemplary Embodiment]

An Hth-order (where H is an odd number greater than or equal to 7) distortion generating path including an Hth-order distortion vector regulator and an Hth-order distortion frequency characteristic compensator, an Hth-order distortion vector controller which adjusts vector coefficients of the Hth-order distortion vector regulator in the Hth-order distortion generating path, and an Hth-order distortion frequency characteristic compensation coefficient controller which adjusts Hth-order distortion frequency characteristic compensation coefficients of the Hth-order distortion frequency characteristic compensator may be added to the fourth exemplary embodiment in FIG. 21 as required.

[Fourth Variation of Fourth Exemplary Embodiment]

Figure 32:
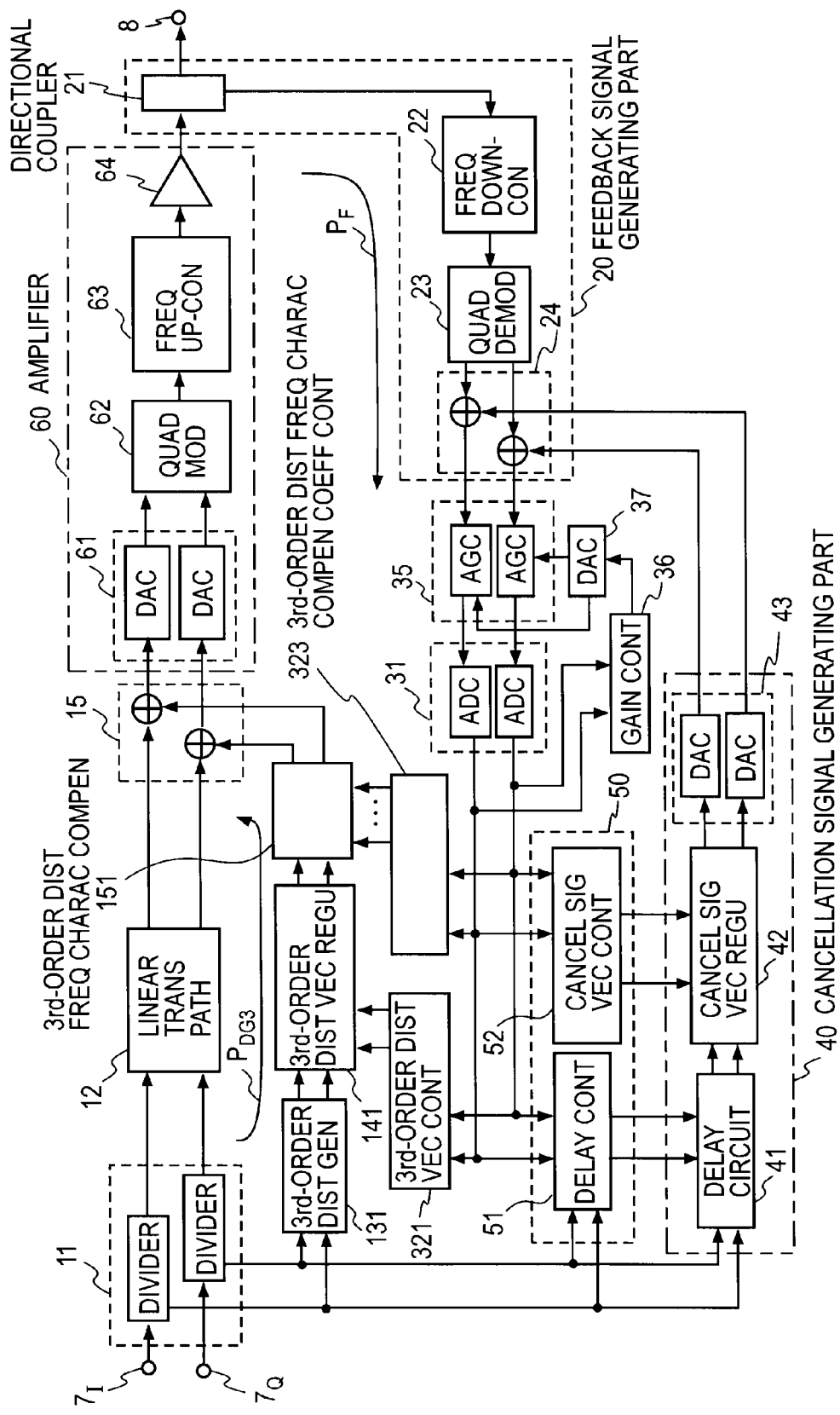
FIG. 32 is a block diagram illustrating a variation of the exemplary embodiment in FIG. 21 which includes components added for gain adjustment of a feedback path.
Figure 33A:
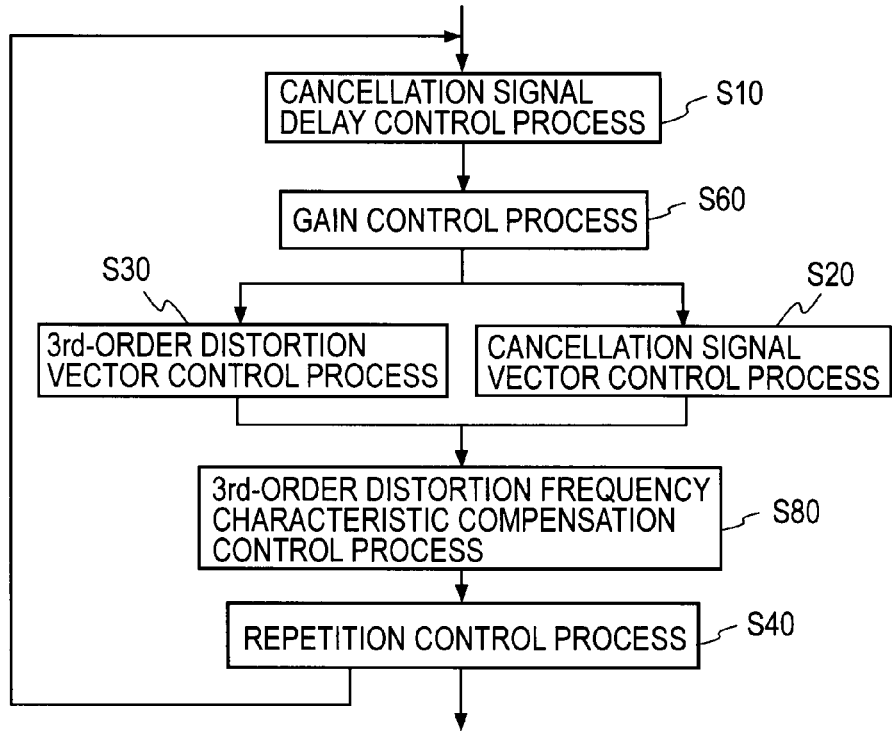
FIG. 33A is a diagram illustrating a general control process flow in the variation in FIG. 32.
Figure 33B:
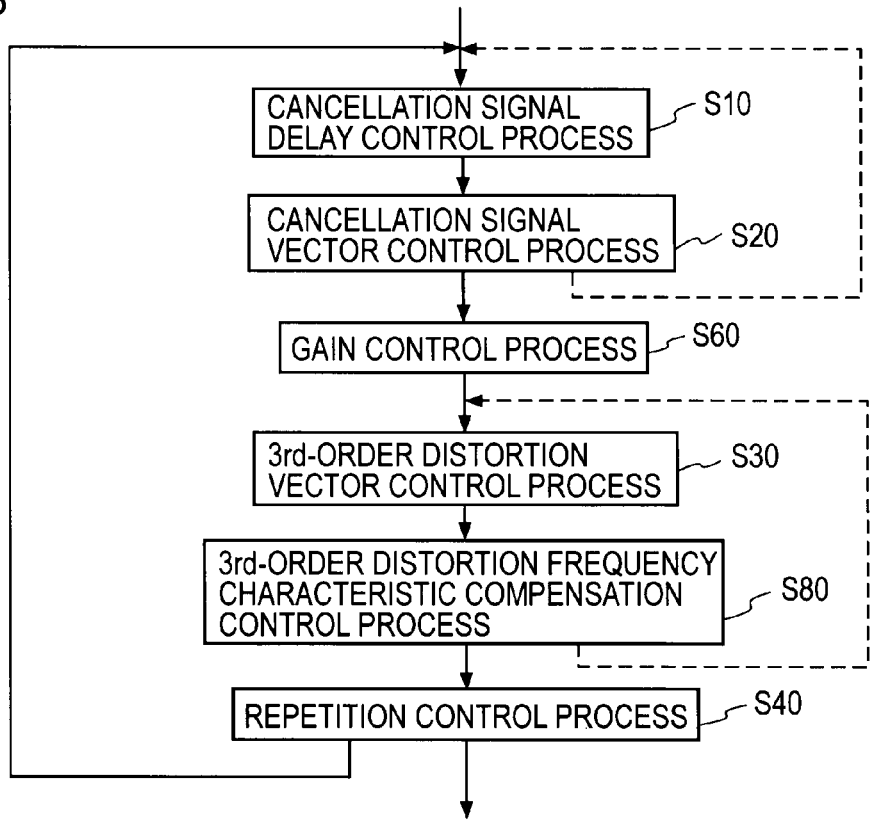
FIG. 33B is a diagram illustrating another exemplary general control process flow.

As in the configuration in FIG. 12, an automatic gain control circuit 35, a gain controller 36, and a DAC 37 may be added to the fourth exemplary embodiment in FIG. 21 as illustrated in FIG. 32. The control processes S20 and S30 in the control process flow illustrated in FIG. 13B are performed and then the third-order distortion frequency characteristic compensation control process S80 is performed as illustrated in FIG. 33A. Alternatively, the control process S30 in the control process flow illustrated in FIG. 13C is performed and then the control process S80 is performed as illustrated in FIG. 33B. As indicated by a dashed line, the control processes S30 and S80 may be repeated until a predetermined condition is satisfied. The predetermined condition may be that a predetermined number of repetitions has been reached, or that third-order distortion component power $P_{WD3}$ has been reduced to a value less than or equal to a predetermined value, or that power values $P_{WD3U}$, $P_{WD3L}$ and $P_{WDM}$ have been reduced to values less than or equal to their respective predetermined values. In this case, step S40 may be omitted.

[Fifth Variation of Fourth Exemplary Embodiment]

Figure 34:
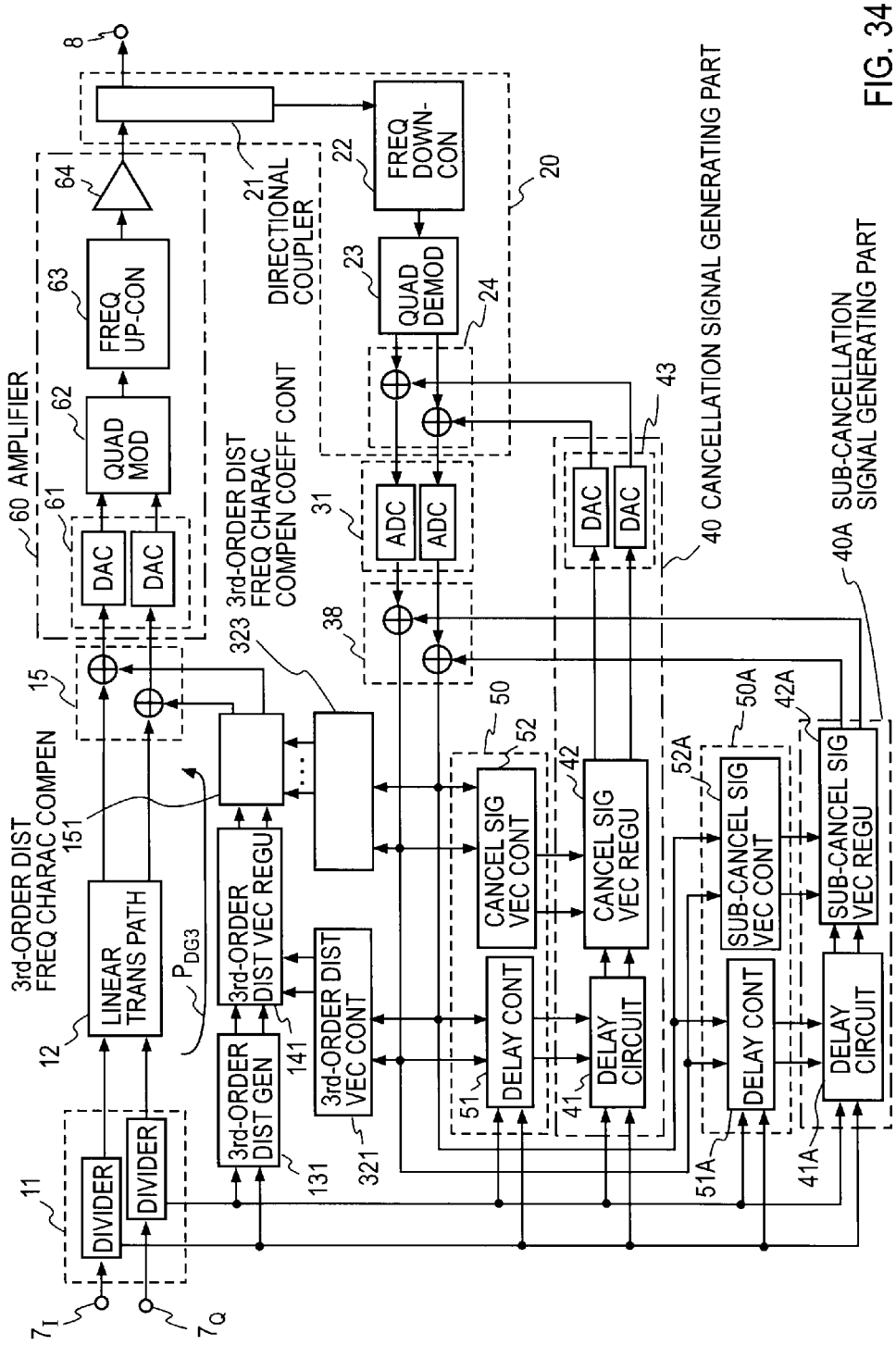
FIG. 34 is a block diagram illustrating a variation of the exemplary embodiment in FIG. 21 which includes components added for cancelling a main signal component by a sub-cancellation signal.
Figure 35A:
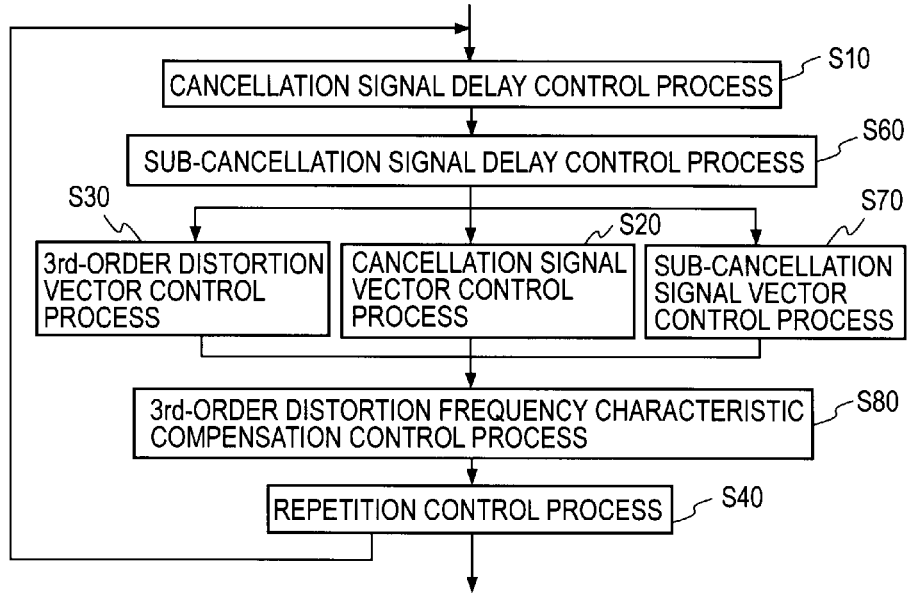
FIG. 35A is a diagram illustrating a general control process flow according to the variation in FIG. 34.
Figure 35B:
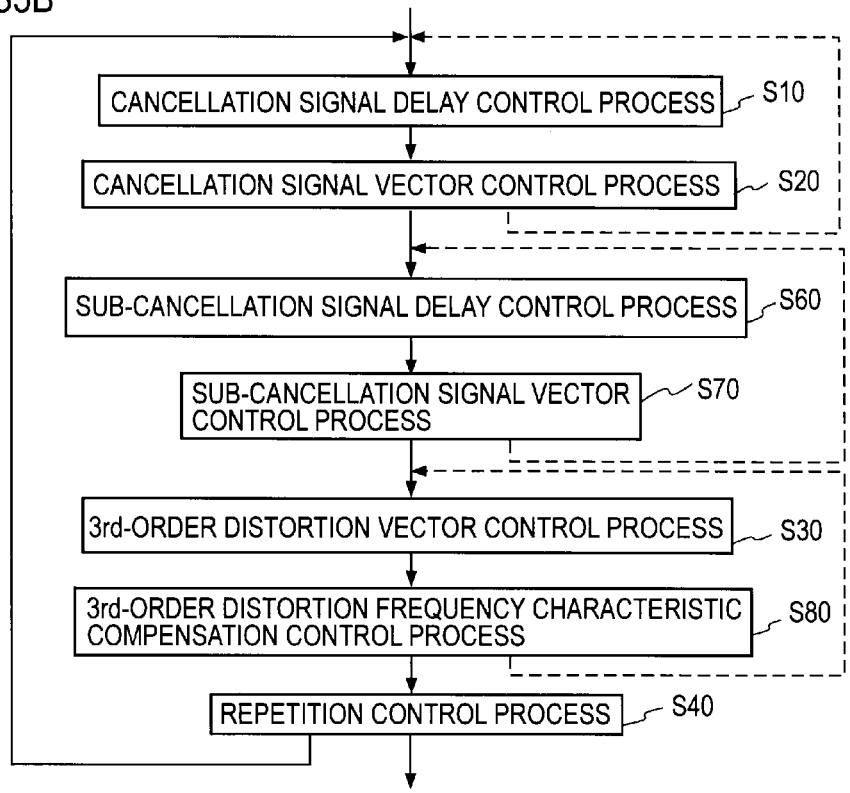
FIG. 35B is a diagram illustrating another exemplary general control process flow.

As in the configuration in FIG. 14, a sub-cancellation signal generating part 40A, a sub-cancellation signal control part 50A, and a combiner 38 may be included in the fourth exemplary embodiment in FIG. 21 as illustrated in FIG. 34. The control processes S20, S70 and S30 in the control process flow illustrated in FIG. 16A are performed and then the third-order distortion frequency characteristic compensation control process S80 is performed as illustrated in FIG. 35A. Here, the control processes S20 and S70 may be performed independently of and in parallel with each other and then the control process S30 may be performed. Alternatively, the control process S30 in the control process flow illustrated in FIG. 16B is performed and then the control process S80 is performed as illustrate in FIG. 35B. As indicated by a dashed line, the control processes S60 and S70 may be repeated until a predetermined condition is satisfied. The predetermined condition may be that a predetermined number of repetitions has been reached or that main signal component power has been reduced to a value less than or equal to a predetermined value. As indicated by a dashed line, the control processes S30 and S80 may be repeated until a predetermined condition is satisfied. The predetermined condition may be that a predetermined number repetitions has been reached, or that third-order distortion component power $P_{WD3}$ has been reduced to a value less than or equal to a predetermined value, or that power values $P_{WD3U}$, $P_{WD3L}$ and $P_{WDM}$ have been reduced to values less than or equal to their respective predetermined values. In this case, step S40 may be omitted.

[Sixth Variation of Fourth Exemplary Embodiment]

Figure 36:
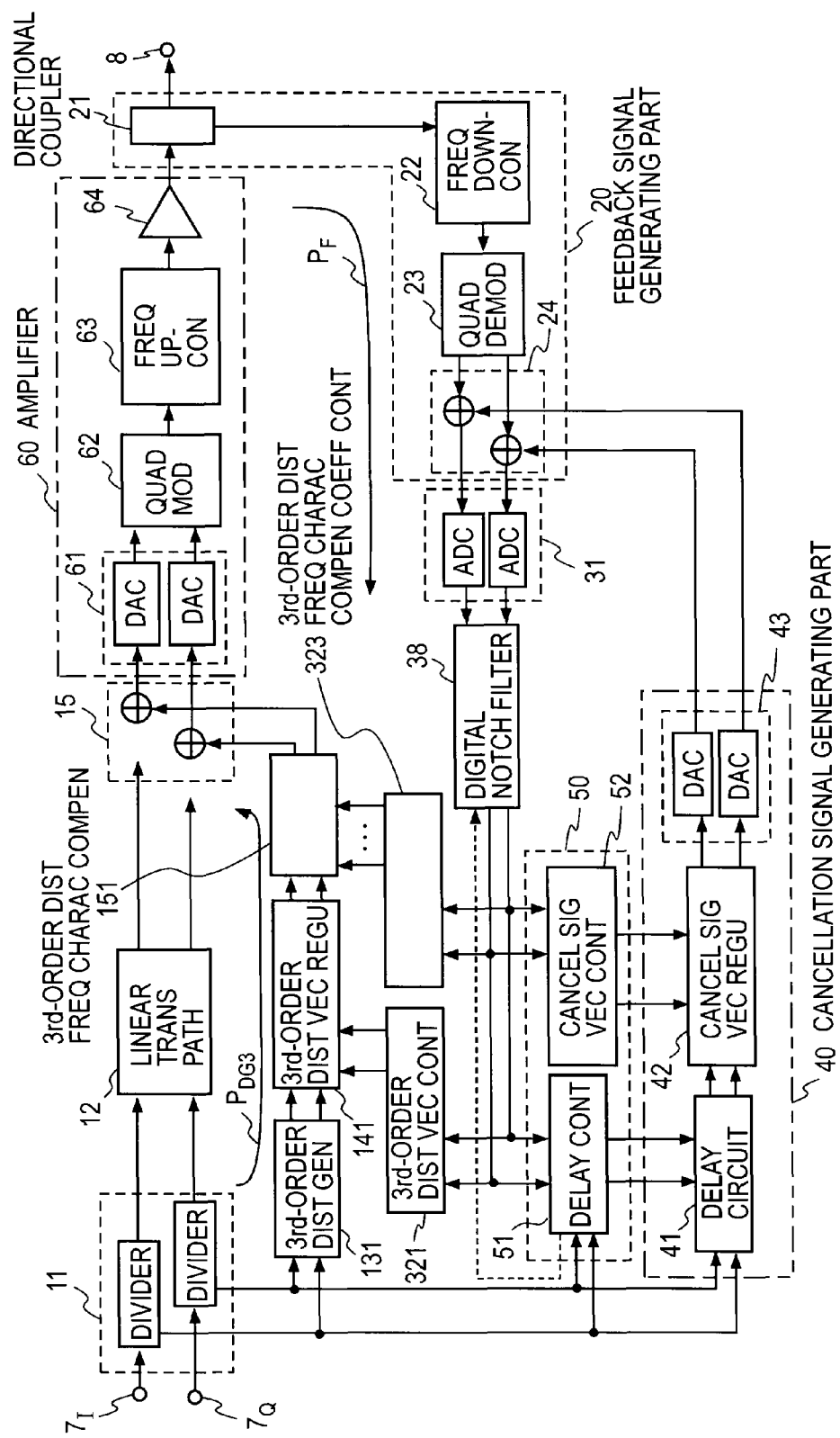
FIG. 36 is a diagram illustrating a variation of the exemplary embodiment in FIG. 21 which includes a notch filter added for suppressing a main signal component.
Figure 37A:
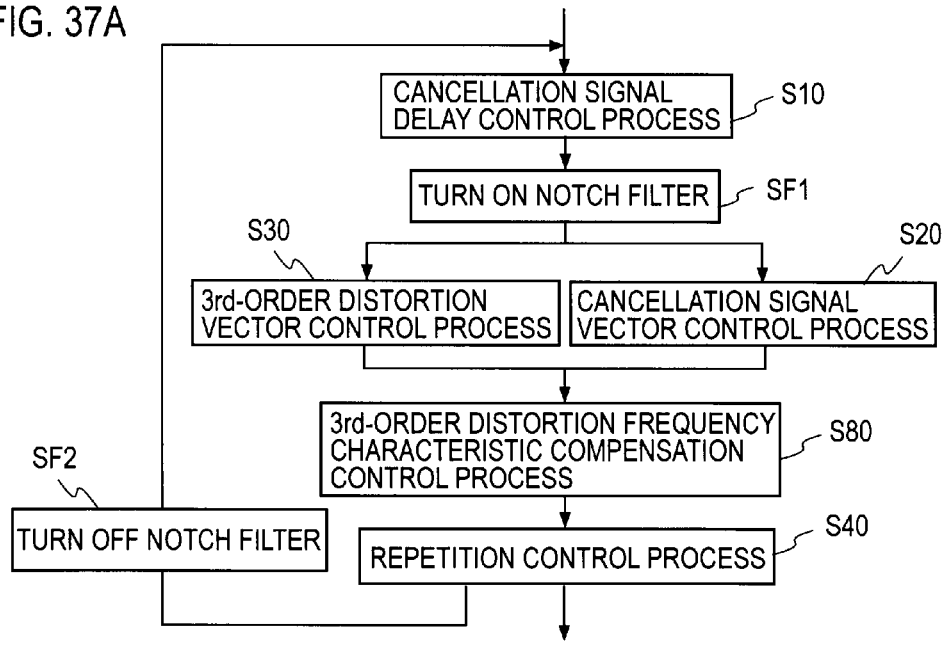
FIG. 37A is a diagram illustrating a general control process flow according to the variation in FIG. 36.
Figure 37B:
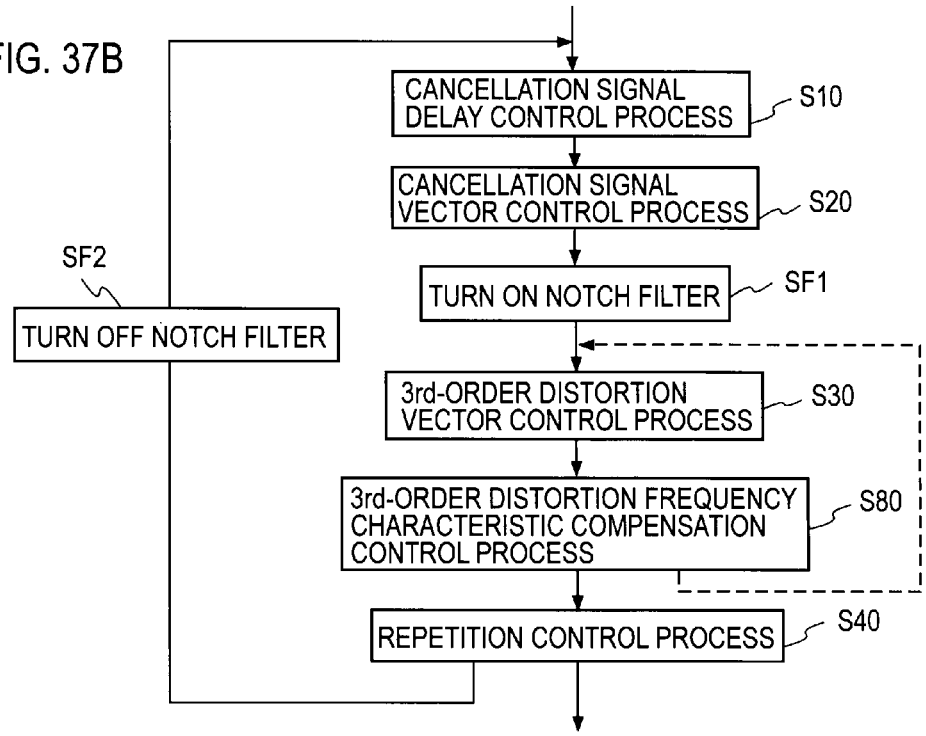
FIG. 37B is a diagram illustrating another exemplary general control process flow.

As in the configuration in FIG. 17, a digital notch filter 38 may be included in the fourth exemplary embodiment in FIG. 21 as illustrated in FIG. 36. Here, frequency characteristic compensation is applied only to the third-order distortion component upper band $FB_{D3U}$ and the third-order distortion component lower band $FB_{D3L}$. The control processes S20 and S30 in the control process flow illustrated in FIG. 18A are performed and then the third-order distortion frequency characteristic compensation control process S80 is performed as illustrated in FIG. 37A. Alternatively, the control process S30 in the control process flow illustrated in FIG. 18B is performed and then the control process S80 is performed as illustrated in FIG. 37B. As indicated by the dashed line, the control processes S30 and S80 may be repeated until a predetermined condition is satisfied. The predetermined condition may be that a predetermined number of repetitions has been reached, or that third-order distortion component power $P_{WD3}$ has been reduced to a value less than or equal to a predetermined value, or that power values $P_{WD3U}$ and $P_{WD3L}$ have bee reduced to values less than or equal to their respective predetermined values. In this case, step S40 may be omitted.

What is claimed is:

1. A control method for controlling the power series digital predistorter which comprises:
    a linear transmission path for transmitting an input transmission signal;
    an odd-order distortion generating path which includes, in series, an odd-order distortion generating part that generates an odd-order distortion component of the input transmission signal and an odd-order distortion vector adjusting part that adjusts a vector of the odd-order distortion component and outputs a vector-adjusted odd-order distortion component as a compensation signal;
    a first combiner that combines an output from the linear transmission path with an output from the odd-order distortion generating path to generate an output of the power series digital predistorter;
    a feedback signal path that generates a feedback signal from a portion of an output of the power amplifier;
    an analog-to-digital converter that converts the feedback signal from the feedback signal path to a digital feedback signal;
    an odd-order distortion vector control part that controls vector adjustment by the odd-order distortion vector adjusting part to suppress an odd-order distortion component of the digital feedback signal;
    a cancellation signal generating part that processes the input transmission signal to generate an analog cancellation signal;
    a second combiner inserted in the feedback signal path that combines the analog cancellation signal with a signal from the feedback signal path; and
    a cancellation signal control part that controls the cancellation signal generating part on the basis of the digital feedback signal to enable the cancellation signal to suppress a main signal component of the feedback signal at the second combiner, wherein
    the cancellation signal generating part comprises a delay circuit that adds a delay to the cancellation signal by delaying the input transmission signal by a set amount of delay time and a cancellation signal vector regulator that adjusts vector coefficients of the delayed input transmission signal, the vector coefficients being the amplitude and phase of the delayed input transmission signal, and
    the cancellation signal control part comprises a delay controller that monitors the digital feedback signal and controls delay time to be set in the delay circuit so that time delay of an input transmission signal traveling through the first combiner and reaching the second combiner in the feedback signal path and an input transmission signal traveling through the cancellation signal generating part and reaching the second combiner become equal to each other, and a cancellation signal vector controller that controls the vector coefficients adjusted by the cancellation signal vector regulator so that a main signal component in the digital feedback signal is reduced, the control method comprising:
    a cancellation signal delay control step of setting delay time of the delay circuit so that a main signal component in the digital feedback signal is reduced to a minimum value or a value less than or equal to a predetermined target value;

a cancellation signal vector control step of setting a vector coefficient of the cancellation signal vector regulator so that the main signal component in the digital feedback signal is reduced to a minimum value or a value less than or equal to the target value; and an odd-order distortion vector control step of setting a vector coefficient of the odd-order distortion vector regulator so that a distortion component in the digital feedback signal is reduced to a minimum value or a value less than or equal to the target value.

2. The control method for controlling the power series digital predistorter according to claim 1, further comprising:

an odd-order distortion frequency characteristic compensation control step of detecting a frequency characteristic of an odd-order distortion component contained in the digital feedback signal and controlling compensation coefficients on the basis of the detected frequency characteristic; and an odd-order distortion frequency characteristic compensation step of compensating for the frequency characteristic of the odd-order distortion component in accordance with the compensation coefficients.

3. The control method for controlling the power series digital predistorter according to claim 1 or 2, wherein, after completion of the cancellation signal delay control step, the cancellation signal vector control step and the odd-order distortion vector control step are performed independently of and in parallel with each other.

4. The control method for controlling the power series digital predistorter according to claim 1 or 2, wherein, after completion of the cancellation signal delay control step, the cancellation signal vector control step is performed and, after completion of the cancellation signal vector control step, the odd-order distortion vector control step is performed.

5. The control method for controlling the power series digital predistorter according to claim 1 or 2, wherein the power series digital predistorter further comprises a second delay circuit for delaying the input transmission signal by a set amount of second delay time, a sub-cancellation signal vector regulator for adjusting a vector of an output from the second delay circuit and outputting the vector-adjusted output as a sub-cancellation signal, and a third combiner inserted at the output side of the analog-to-digital converter, for combining an output from the analog-to-digital converter with the sub-cancellation signal;

the control method further comprising:

a sub-cancellation signal delay control step of setting the second delay time such that a main signal component in an output from the third combiner is reduced to a minimum value or a value less than or equal to a predetermined second target value; and a sub-cancellation signal vector control step of setting a vector coefficient of the sub-cancellation signal vector regulator so that the main signal component in the output from the third combiner is reduced to the minimum value or a value less than or equal to the second target value.

6. The control method for controlling the power series digital predistorter according to claim 5, wherein, after completion of the cancellation signal delay control step, the sub-cancellation signal delay control step is performed and, after completion of the sub-cancellation signal delay control step, the cancellation signal vector control step, the sub-cancellation signal vector control step, and the odd-order distortion vector control step are performed independently of and in parallel with one another.

7. The control method for controlling the power series digital predistorter according to claim 5, wherein the cancellation signal delay control step, the sub-cancellation signal delay control step, the cancellation signal vector control step, the sub-cancellation signal vector control step, and the odd-order distortion vector control step are performed in the sequence set forth.

8. A power series digital predistorter which combines an input transmission signal with a compensation signal and provides the combined signal to a power amplifier to compensate a distortion component generated in the power amplifier, comprising:

a linear transmission path for transmitting an input transmission signal;

an odd-order distortion generating path which includes, in series, an odd-order distortion generating part that generates an odd-order distortion component of the input transmission signal and an odd-order distortion vector adjusting part that adjusts a vector of the odd-order distortion component and outputs a vector-adjusted odd-order distortion component as a compensation signal;

a first combiner that combines an output from the linear transmission path with an output from the odd-order distortion generating path to generate an output of the power series digital predistorter;

a feedback signal path that generates a feedback signal from a portion of an output of the power amplifier;

an analog-to-digital converter that converts the feedback signal from the feedback signal path to a digital feedback signal;

an odd-order distortion vector control part that controls vector adjustment by the odd-order distortion vector adjusting part to suppress an odd-order distortion component of the digital feedback signal;

a cancellation signal generating part that processes the input transmission signal to generate an analog cancellation signal;

a second combiner inserted in the feedback signal path that combines the analog cancellation signal with a signal from the feedback signal path; and a cancellation signal control part that controls the cancellation signal generating part on the basis of the digital feedback signal to enable the cancellation signal to suppress a main signal component of the feedback signal at the second combiner, wherein the cancellation signal generating part comprises a delay circuit that adds a delay to the cancellation signal by delaying the input transmission signal by a set amount of delay time and a cancellation signal vector regulator that adjusts vector coefficients of the delayed input transmission signal, the vector coefficients being the amplitude and phase of the delayed input transmission signal, the cancellation signal control part comprises a delay controller that monitors the digital feedback signal and controls delay time to be set in the delay circuit so that time delay of an input transmission signal traveling through the first combiner and reaching the second combiner in the feedback signal path and an input transmission signal traveling through the cancellation signal generating part and reaching the second combiner become equal to each other, and a cancellation signal vector controller that controls the vector coefficients adjusted by the cancellation signal vector regulator so that a main signal component in the digital feedback signal is reduced, and the input transmission signal contains a synchronization pilot signal inserted at periodic intervals, and the delay controller detects the synchronization pilot signal contained in the cancellation signal in an output from the analog-to-digital converter and the synchronization pilot signal contained in the digital feedback signal in an output from the analog-to-digital converter and sets delay time in the delay circuit so that time delay of the input transmission signal traveling through the first combiner and reaching the second combiner in the feedback signal path and time delay of the input transmission signal traveling through the cancellation signal generating part and reaching the second combiner become equal to each other.

9. A power series digital predistorter which combines an input transmission signal with a compensation signal and provides the combined signal to a power amplifier to compensate a distortion component generated in the power amplifier, comprising:
- a linear transmission path for transmitting an input transmission signal;
- an odd-order distortion generating path which includes, in series, an odd-order distortion generating part that generates an odd-order distortion component of the input transmission signal and an odd-order distortion vector adjusting part that adjusts a vector of the odd-order distortion component and outputs a vector-adjusted odd-order distortion component as a compensation signal;
- a first combiner that combines an output from the linear transmission path with an output from the odd-order distortion generating path to generate an output of the power series digital predistorter;
- a feedback signal path that generates a feedback signal from a portion of an output of the power amplifier;
- an analog-to-digital converter that converts the feedback signal from the feedback signal path to a digital feedback signal;
- an odd-order distortion vector control part that controls vector adjustment by the odd-order distortion vector adjusting part to suppress an odd-order distortion component of the digital feedback signal;
- a cancellation signal generating part that processes the input transmission signal to generate an analog cancellation signal;
- a second combiner inserted in the feedback signal path that combines the analog cancellation signal with a signal from the feedback signal path;
- a cancellation signal control part that controls the cancellation signal generating part on the basis of the digital feedback signal to enable the cancellation signal to suppress a main signal component of the feedback signal at the second combiner;
- a sub-cancellation signal generating part that processes the input transmission signal to generate a sub-cancellation signal;
- a third combiner inserted at the output side of the analog-to-digital converter that combines an output from the analog-to-digital converter with the sub-cancellation signal; and
- a sub-cancellation signal control part that monitors an output from the third combiner and controls the sub-cancellation signal generating part so that the sub-cancellation signal suppresses a residual main signal component in the digital feedback signal at the third combiner, wherein the cancellation signal generating part comprises a delay circuit that adds a delay to the cancellation signal by delaying the input transmission signal by a set amount of delay time and a cancellation signal vector regulator that adjusts vector coefficients of the delayed input transmission signal, the vector coefficients being the amplitude and phase of the delayed input transmission signal, and the cancellation signal control part comprises a delay controller that monitors the digital feedback signal and controls delay time to be set in the delay circuit so that time delay of an input transmission signal traveling through the first combiner and reaching the second combiner in the feedback signal path and an input transmission signal traveling through the cancellation signal generating part and reaching the second combiner become equal to each other, and a cancellation signal vector controller that controls the vector coefficients adjusted by the cancellation signal vector regulator so that a main signal component in the digital feedback signal is reduced.

10. The power series digital predistorter according to any of claims 8 to 9, further comprising:
- an automatic gain control circuit inserted at the input side of the analog-to-digital converter that adjusts the gain of an output from the second combiner and provides the gain-adjusted output to the analog-to-digital converter and a gain controller that monitors an output from the analog-to-digital converter and controls the gain of the automatic gain control circuit so that an output voltage of the automatic gain control circuit approaches a maximum input range of the analog-to-digital converter.

11. The power series digital predistorter according to any of claims 8 to 9, further comprising;
- a digital notch filter inserted at the output side of the analog-to-digital converter that suppresses a main signal component in an output from the analog-to-digital converter.

12. A power series digital predistorter which combines an input transmission signal with a compensation signal and provides the combined signal to a power amplifier to compensate a distortion component generated in the power amplifier, comprising:
- a linear transmission path for transmitting an input transmission signal;
- an odd-order distortion generating path which includes, in series, an odd-order distortion generating part that generates an odd-order distortion component of the input transmission signal and an odd-order distortion vector adjusting part that adjusts a vector of the odd-order distortion component and outputs a vector-adjusted odd-order distortion component as a compensation signal;
- a first combiner that combines an output from the linear transmission path with an output from the odd-order distortion generating path to generate an output of the power series digital predistorter;
- a feedback signal path that generates a feedback signal from a portion of an output of the power amplifier;
- an analog-to-digital converter that converts the feedback signal from the feedback signal path to a digital feedback signal;
- an odd-order distortion vector control part that controls vector adjustment by the odd-order distortion vector adjusting part to suppress an odd-order distortion component of the digital feedback signal;
- a cancellation signal generating part that processes the input transmission signal to generate an analog cancellation signal;
- a second combiner inserted in the feedback signal path that combines the analog cancellation signal with a signal from the feedback signal path; and a cancellation signal control part that controls the cancellation signal generating part on the basis of the digital feedback signal to enable the cancellation signal to suppress a main signal component of the feedback signal at the second combiner, wherein the cancellation signal generating part comprises a delay circuit that adds a delay to the cancellation signal by delaying the input transmission signal by a set amount of delay time and a cancellation signal vector regulator that adjusts vector coefficients of the delayed input transmission signal, the vector coefficients being the amplitude and phase of the delayed input transmission signal, the cancellation signal control part comprises a delay controller that monitors the digital feedback signal and controls delay time to be set in the delay circuit so that time delay of an input transmission signal traveling through the first combiner and reaching the second combiner in the feedback signal path and an input transmission signal traveling through the cancellation signal generating part and reaching the second combiner become equal to each other, and a cancellation signal vector controller that controls the vector coefficients adjusted by the cancellation signal vector regulator so that a main signal component in the digital feedback signal is reduced, and the input transmission signal is an I/Q signal, the cancellation signal generating part further comprises a second digital-to-analog converter that converts an output from the cancellation signal vector regulator to the analog cancellation signal, and the feedback signal path comprises a frequency down-converter that down-converts a portion of an output from the power amplifier, a quadrature demodulator that quadrature-demodulates the down-converted signal to generate a demodulated I/Q signal as the feedback signal, and the second combiner combines the feedback signal from the quadrature demodulator with the cancellation signal.

13. A power series digital predistorter which combines an input transmission signal with a compensation signal and provides the combined signal to a power amplifier to compensate a distortion component generated in the power amplifier, comprising:

a linear transmission path for transmitting an input transmission signal;

an odd-order distortion generating path which includes, in series, an odd-order distortion generating part that generates an odd-order distortion component of the input transmission signal and an odd-order distortion vector adjusting part that adjusts a vector of the odd-order distortion component and outputs a vector-adjusted odd-order distortion component as a compensation signal;

a first combiner that combines an output from the linear transmission path with an output from the odd-order distortion generating path to generate an output of the power series digital predistorter;

a feedback signal path that generates a feedback signal from a portion of an output of the power amplifier;

an analog-to-digital converter that converts the feedback signal from the feedback signal path to a digital feedback signal;

an odd-order distortion vector control part that controls vector adjustment by the odd-order distortion vector adjusting part to suppress an odd-order distortion component of the digital feedback signal;

a cancellation signal generating part that processes the input transmission signal to generate an analog cancellation signal;

a second combiner inserted in the feedback signal path that combines the analog cancellation signal with a signal from the feedback signal path;

a cancellation signal control part that controls the cancellation signal generating part on the basis of the digital feedback signal to enable the cancellation signal to suppress a main signal component of the feedback signal at the second combiner;

a sub-cancellation signal generating part that processes the input transmission signal to generate a sub-cancellation signal;

a third combiner inserted at the output side of the analog-to-digital converter that combines an output from the analog-to-digital converter with the sub-cancellation signal; and a sub-cancellation signal control part that monitors an output from the third combiner and controls the sub-cancellation signal generating part so that the sub-cancellation signal suppresses a residual main signal component in the digital feedback signal at the third combiner.

14. The power series digital predistorter according to claim 13 or 9, wherein the sub-cancellation signal generating part comprises a second delay circuit that delays the input transmission signal by a set amount of second delay time and a sub-cancellation signal vector regulator that adjusts a vector of an output from the second delay circuit and outputs the vector-adjusted output as the sub-cancellation signal; and the sub-cancellation signal control part comprises a sub-cancellation signal delay circuit that sets the second delay time of the second delay circuit so that a main signal component in an output from the third combiner is reduced to a minimum value or a value less than or equal to a predetermined second target value, and a sub-cancellation signal vector controller that sets vector coefficients of the sub-cancellation signal vector regulator so that the main signal component in the output from the third combiner is reduced to the minimum value or a value less than or equal to the second target value, the vector coefficients being the amplitude and phase of the output.

15. The power series digital predistorter according to any one of claims 8 to 9, further comprising:

an odd-order distortion frequency characteristic compensator inserted in the odd-order distortion generating path that compensates for a frequency characteristic of the odd-order distortion component in accordance with a compensation coefficient provided; and an odd-order distortion frequency characteristic compensation coefficient controller that detects a frequency characteristic of an odd-order distortion component contained in the digital feedback signal and controls a compensation coefficient to be provided to the odd-order distortion frequency characteristic compensator on the basis of the detected frequency characteristic.

* * * * *